US012089483B2

(12) United States Patent
Lee et al.

(10) Patent No.: US 12,089,483 B2
(45) Date of Patent: Sep. 10, 2024

(54) DISPLAY PANEL, DISPLAY APPARATUS, AND METHOD OF MANUFACTURING THE DISPLAY APPARATUS

(71) Applicant: Samsung Display Co., Ltd., Yongin-si (KR)

(72) Inventors: Kangyoung Lee, Yongin-si (KR); Dongchul Shin, Yongin-si (KR); Hyunsup Lee, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 403 days.

(21) Appl. No.: 17/503,699

(22) Filed: Oct. 18, 2021

(65) Prior Publication Data

US 2022/0149303 A1 May 12, 2022

(30) Foreign Application Priority Data

Nov. 9, 2020 (KR) ........................ 10-2020-0148612

(51) Int. Cl.
*H10K 77/10* (2023.01)
*H10K 50/844* (2023.01)
(Continued)

(52) U.S. Cl.
CPC ......... *H10K 77/111* (2023.02); *H10K 50/844* (2023.02); *H10K 71/00* (2023.02);
(Continued)

(58) Field of Classification Search
CPC .... H10K 77/111; H10K 50/844; H10K 71/00; H10K 59/1201; H10K 59/122; H10K 59/124; H10K 2102/311; H10K 59/352; H10K 2102/351; H10K 50/8426; H10K 59/123; H10K 59/1213; H10K 71/80
See application file for complete search history.

(56) References Cited

U.S. PATENT DOCUMENTS

| | | | |
|---|---|---|---|
| 9,893,133 | B2 | 2/2018 | Park et al. |
| 10,608,071 | B2 | 3/2020 | Hong et al. |

(Continued)

FOREIGN PATENT DOCUMENTS

| | | |
|---|---|---|
| CN | 111341210 | 6/2020 |
| CN | 111370454 | 7/2020 |

(Continued)

*Primary Examiner* — J. E. Schoenholtz
(74) *Attorney, Agent, or Firm* — KILE PARK REED & HOUTTEMAN PLLC

(57) ABSTRACT

A display panel including a penetration portion includes: a substrate including a central area and an outer area extending from an outer side of the central area, the central area including a first central area and a second central area spaced apart from the first central area by the penetration portion therebetween; and a display element arranged on the substrate and including a first display element and a second display element, the first display element overlapping at least a portion of the first central area, and the second display element overlapping at least a portion of the second central area. At least one of an edge of the central area and an edge of the outer area defines at least a portion of the penetration portion, and a thickness of the substrate in the outer area is less than a thickness of the substrate in the central area.

19 Claims, 32 Drawing Sheets

(51) Int. Cl.

| | |
|---|---|
| ***H10K 59/12*** | (2023.01) |
| ***H10K 59/122*** | (2023.01) |
| ***H10K 59/124*** | (2023.01) |
| ***H10K 71/00*** | (2023.01) |
| ***H10K 102/00*** | (2023.01) |

(52) U.S. Cl.

CPC ....... *H10K 59/1201* (2023.02); *H10K 59/122* (2023.02); *H10K 59/124* (2023.02); *H10K 2102/311* (2023.02)

(56) References Cited

U.S. PATENT DOCUMENTS

| | | | | |
|---|---|---|---|---|
| 2020/0211437 | A1 | 7/2020 | Ahn et al. | |
| 2021/0135160 | A1* | 5/2021 | Sun | H10K 77/111 |
| 2022/0399522 | A1* | 12/2022 | Kim | H10K 59/124 |
| 2023/0329070 | A1* | 10/2023 | Long | H10K 77/111<br>257/40 |

FOREIGN PATENT DOCUMENTS

| | | |
|---|---|---|
| KR | 10-2016-0014878 | 2/2016 |
| KR | 10-2020-0081945 | 7/2020 |

* cited by examiner

DISPLAY PANEL, DISPLAY APPARATUS, AND METHOD OF MANUFACTURING THE DISPLAY APPARATUS

CROSS-REFERENCE TO RELATED APPLICATION

This application claims priority from and the benefit of Korean Patent Application No. 10-2020-0148612, filed on Nov. 9, 2020, which is incorporated by reference for all purposes as if fully set forth herein in its entirety.

BACKGROUND

Field

Embodiments of the invention relate generally to a display panel, a display apparatus, and a method of manufacturing the display apparatus, and more specifically, a display panel having a penetration portion, to a display apparatus with the display panel, and a method of manufacturing the display apparatus with the display panel.

Discussion of the Background

Mobile electronic apparatuses are widely used. As mobile electronic apparatuses such as miniaturized electronic apparatuses (e.g., mobile phones) and tablet personal computers (PC) have been widely used recently.

To implement various functions, for example, to provide a user with visual information such as an image, the mobile electronic apparatuses include a display apparatus. Recently, as parts/elements for driving a display apparatus are miniaturized, the proportion of the display apparatus in an electronic apparatus have been gradually increased.

Recently, flexible display apparatuses that are bendable, foldable, or rollable have been researched and developed. In addition, research has been actively carried out on stretchable display apparatuses that may be changed in various shapes and display apparatuses that may be bent in their corner and may display an image.

The above information disclosed in this Background section is only for understanding of the background of the inventive concepts, and, therefore, it may contain information that does not constitute prior art.

SUMMARY

Applicant realized that when display apparatuses with display panels are bent, folded, or rolled, the reliability the display apparatuses may be degraded.

Display apparatuses with display panels constructed according to the principles of the invention are capable of improving the flexibility and the reliability of the display apparatuses by providing penetration portions to the display panels of the display apparatuses.

Methods of manufacturing the display apparatuses with the display panels according to the principles of the invention are capable of improving the flexibility and the reliability of the display apparatuses by providing penetration portions to the display panels of the display apparatuses.

Additional features of the inventive concepts will be set forth in the description which follows, and in part will be apparent from the description, or may be learned by practice of the inventive concepts.

According to an aspect of the invention, a display panel including a penetration portion includes a substrate including a central area and an outer area extending from an outer side of the central area, the central area including a first central area and a second central area spaced apart from the first central area by the penetration portion therebetween, and a display element arranged over the substrate and including a first display element and a second display element, the first display element overlapping at least a portion of the first central area, and the second display element overlapping at least a portion of the second central area, wherein at least one of an edge of the central area and an edge of the outer area defines at least a portion of the penetration portion, and a thickness of the substrate in the outer area is less than a thickness of the substrate in the central area.

The substrate may include an upper surface and a lower surface opposite to the upper surface, the upper surface facing the display element, wherein the lower surface of the substrate may have a step difference.

The substrate may include a base layer and a barrier layer on the base layer, wherein a thickness of the base layer in the outer area may be less than a thickness of the base layer in the central area.

The display panel may further include an encapsulation layer covering the display element and including at least one inorganic encapsulation layer and at least one organic encapsulation layer, wherein the organic encapsulation layer may be divided by the penetration portion.

The outer area may include a first outer area and a second outer area, the first outer area extending in a first direction, and the second outer area extending in a second direction intersecting the first direction, at least one of the first outer area and the second outer area may extend from the first central area to the second central area, and an edge of one of the first outer area and the second outer area, an edge of the first central area, and an edge of the second central area may define at least a portion of the penetration portion.

The substrate may include a front display area, a first side display area, a second side display area, and a corner display area between the first side display area and the second side display area, the first side display area extending from the front display area in a first direction, the second side display area extending from the front display area in a second direction intersecting the first direction, each of the central area and the outer area may each overlap at least a portion of the corner display area, and each of the central area and the outer area may each extend in a direction away from the front display area.

The outer area may include a first outer area and a second outer area, the first outer area extending from an outer side of the first central area, and the second outer area extending from an outer side of the second central area, the first outer area may face the second outer area, and an edge of the first outer area and an edge of the second outer area may define at least a portion of the penetration portion.

According to another aspect of the invention, a display apparatus includes a display panel including a penetration portion, and a cover window arranged on the display panel, wherein the display panel includes a substrate including a central area and an outer area extending from an outer side of the central area, the central area including a first central area and a second central area apart from the first central area by the penetration portion therebetween, and a display element arranged over the substrate and including a first display element and a second display element, the first display element overlapping at least a portion of the first central area, and the second display element overlapping at least a portion of the second central area, wherein at least one of an edge of the central area and an edge of the outer area defines at least a portion of the penetration portion, the substrate includes a base layer and a barrier layer on the base layer, and a thickness of the base layer in the outer area is less than a thickness of the base layer in the central area.

The outer area may include a first outer area and a second outer area, the first outer area extending in a first direction, and the second outer area extending in a second direction intersecting the first direction, one of the first outer area and the second outer area may extend from the first central area to the second central area, and an edge of one of the first outer area and the second outer area, an edge of the first central area, and an edge of the second central area may define at least a portion of the penetration portion.

The display panel may include a corner, the substrate may include a front display area and a corner display area bent at the corner, each of the central area and the outer area may extend in a direction away from the front display area and overlap at least a portion of the corner display area, the outer area may include a first outer area and a second outer area, the first outer area extending from an outer side of the first central area, and the second outer area extending from an outer area of the second central area, the first outer area may face the second outer area, and an edge of the first outer area and an edge of the second outer area may defined at least a portion of the penetration portion.

According to another aspect of the invention, a method of manufacturing a display apparatus includes the steps of: forming a display substrate on an upper surface of a support substrate, the display substrate including a substrate, a first pixel electrode, and a second pixel electrode, the substrate including a first central area, a second central area, a separation area between the first central area and the second central area, and the first pixel electrode and the second pixel electrode being respectively arranged in the first central area and the second central area and being separated from each other, forming a penetration hole through the upper surface of the support substrate and a lower surface of the support substrate to overlap the separation area, forming a penetration portion overlapping the penetration hole and passing through the display substrate, and forming an encapsulation layer covering the first pixel electrode and the second pixel electrode.

The substrate may include a first base layer, a first barrier layer, a second base layer, and a second barrier layer that are sequentially stacked, and the step of forming of the display substrate on the upper surface of the support substrate may include the steps of: forming the first base layer, the second barrier layer, and the second base layer on the upper surface of the support substrate, and forming a second barrier layer hole in the second barrier layer, the second barrier layer hole overlapping the first barrier layer and the second base layer.

The method may further include the step of exposing the first barrier layer by etching a portion of the second base layer exposed through the second barrier layer hole.

The step of forming of the penetration hole to overlap the separation area may include the step of forming a step difference by etching at least a portion of a lower surface of the first base layer.

The step of forming of the penetration portion may include the steps of: forming a first base layer hole in the first base layer, and forming a first barrier layer hole in the first barrier layer.

The step of forming of the penetration hole to overlap the separation area may include the steps of: forming a first base layer hole in the first base layer, forming a first barrier layer hole in the first barrier layer, and forming a step difference by etching at least a portion of a lower surface of the second base layer.

The step of forming of the encapsulation layer may include forming a first inorganic encapsulation layer covering the first pixel electrode and the second pixel electrode, forming an organic encapsulation layer covering the first pixel electrode and the second pixel electrode and divided around the penetration portion, and forming a second inorganic encapsulation layer on the organic encapsulation layer.

The method may further include the step of separating the display substrate from the support substrate.

The substrate may further include a first outer area and a second outer area, the first outer area extending from the first central area in a first direction, and the second outer area extending from the first central area in a second direction interesting the first direction, one of the first outer area and the second outer area may extend to the second central area from the first central area, an edge of one of the first outer area and the second outer area, an edge of the first central area, and an edge of the second central area may define at least a portion of the penetration portion, and the method may further include the step of forming a thickness of the substrate corresponding to one of the first outer area and the second outer area less than a thickness of the substrate corresponding to the first central area.

The substrate may further include a front display area, the first central area and the second central area may extend from a corner of the display substrate in a direction away from the front display area, and the method may further include the step of bending the display substrate at the corner, and arranging a cover window on the display substrate.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
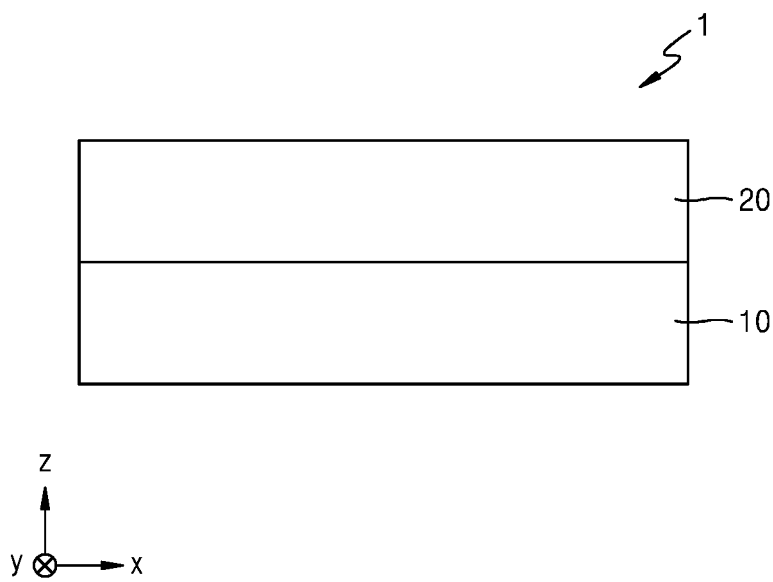
FIG. 1 is a cross-sectional view of an embodiment of a display apparatus constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

A display apparatus may include an apparatus for displaying moving images or still images and may be used as a display screen of various products including televisions, notebook computers, monitors, advertisement boards, Internet of things (TOT) devices as well as portable electronic apparatuses including mobile phones, smartphones, tablet personal computers (PC), mobile communication terminals, electronic organizers, electronic books, portable multimedia players (PMPs), navigations, and ultra mobile personal computers (UMPCs). In addition, the display apparatus according to an embodiment may be used in wearable devices including smartwatches, watchphones, glasses-type displays, and head-mounted displays (HMDs). In addition, the display apparatus according to an embodiment may be used as instrument panels for automobiles, center fascias for automobiles, or center information displays (CIDs) arranged on a dashboard, room mirror displays that replace side mirrors of automobiles, and displays arranged on the backside of front seats as an entertainment unit for back seats of automobiles.

FIG. 1 is a cross-sectional view of a display apparatus 1 according to an embodiment.

Referring to FIG. 1, the display apparatus 1 may include a display panel 10 and a cover window 20. The cover window 20 may be arranged on the display panel 10.

The display panel 10 may display an image. The display panel 10 may include a plurality of pixels and display an image by using the plurality of pixels.

The plurality of pixels may each include a display element. The display panel 10 may be an organic light-emitting display panel with an organic light-emitting diode (OLED) including an organic emission layer. Alternatively, the display panel 10 may be a light-emitting diode display panel with a light-emitting diode (LED). The size of the light-emitting diode LED may be micro-scale or nano-scale. As an example, a light-emitting diode may be a micro light-emitting diode. Alternatively, a light-emitting diode may be a nanorod light-emitting diode. A nanorod light-emitting diode may include gallium nitride (GaN). In an embodiment, a color-converting layer may be arranged on a nanorod light-emitting diode. The color-converting layer may include quantum dots. Alternatively, the display panel 10 may be a quantum-dot light-emitting display panel with a quantum-dot light-emitting diode including a quantum-dot emission layer. Alternatively, the display panel 10 may be an inorganic light-emitting display panel with an inorganic light-emitting element including an inorganic semiconductor. Hereinafter, the case where the display panel 10 is an organic light-emitting display panel with an organic light-emitting diode as a display element is mainly described in detail.

The cover window 20 may protect the display panel 10. In an embodiment, the cover window 20 may protect the display panel 10 while easily warping according to external force without cracks occurring, etc. The cover window 20 may be attached to the display panel 10 through a transparent adhesive member such as an optically clear adhesive (OCA) film.

The cover window 20 may include glass, sapphire, or plastic. The cover window 20 may include, for example, ultra thin glass (UTG), colorless polyimide (CPI). In an embodiment, the cover window 20 may have a structure in which a flexible polymer layer is arranged on one side of a glass substrate or may include only a polymer layer.

Figure 2A:
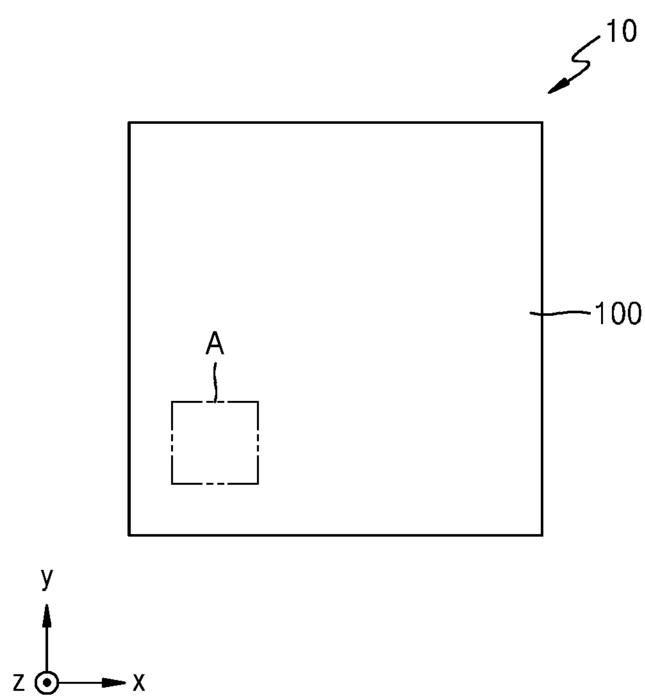
FIG. 2A is a plan view of a display panel of the display apparatus of FIG. 1.
Figure 2B:
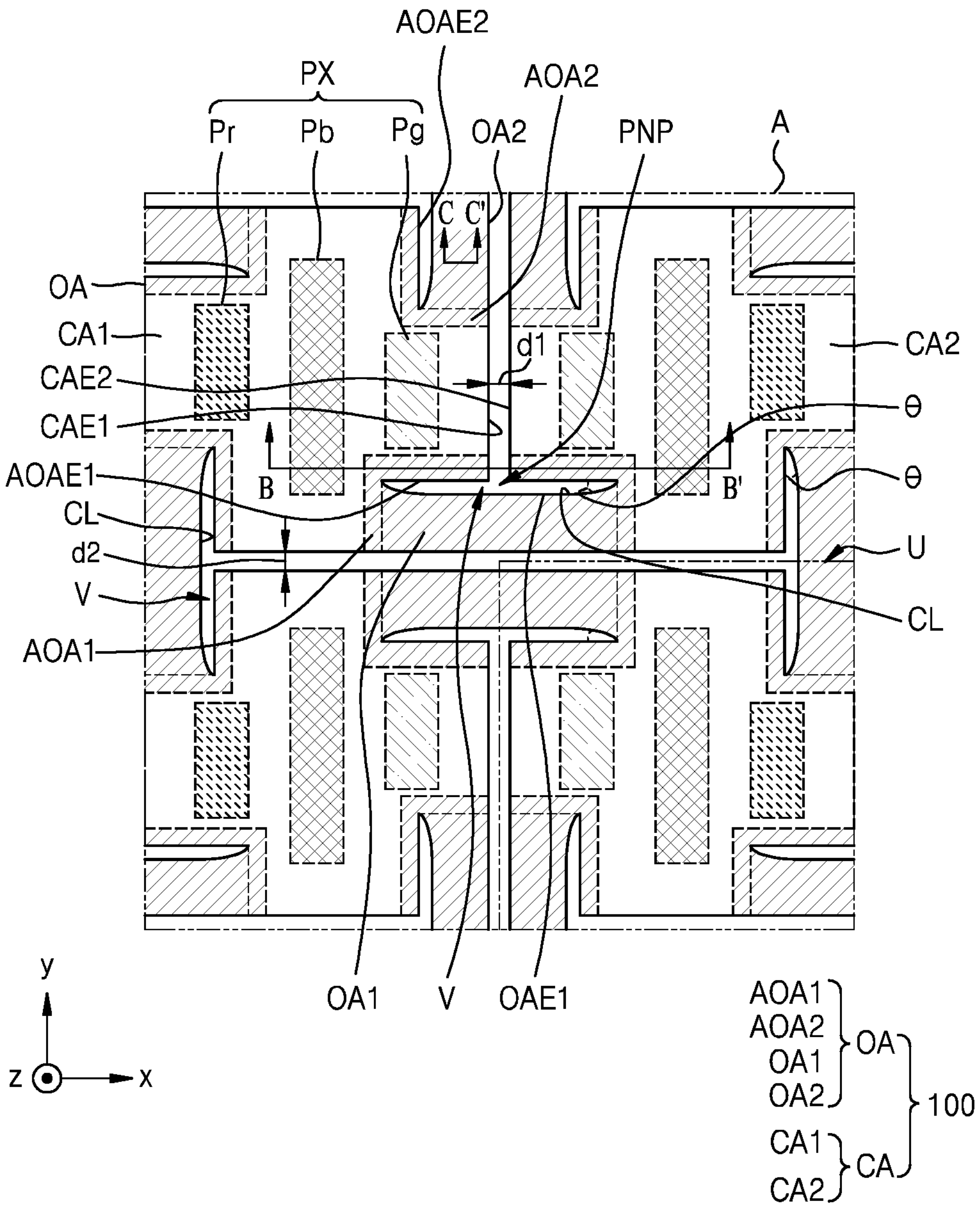
FIG. 2B is an enlarged view of a region A of the display panel of FIG. 2A.
Figure 2C:
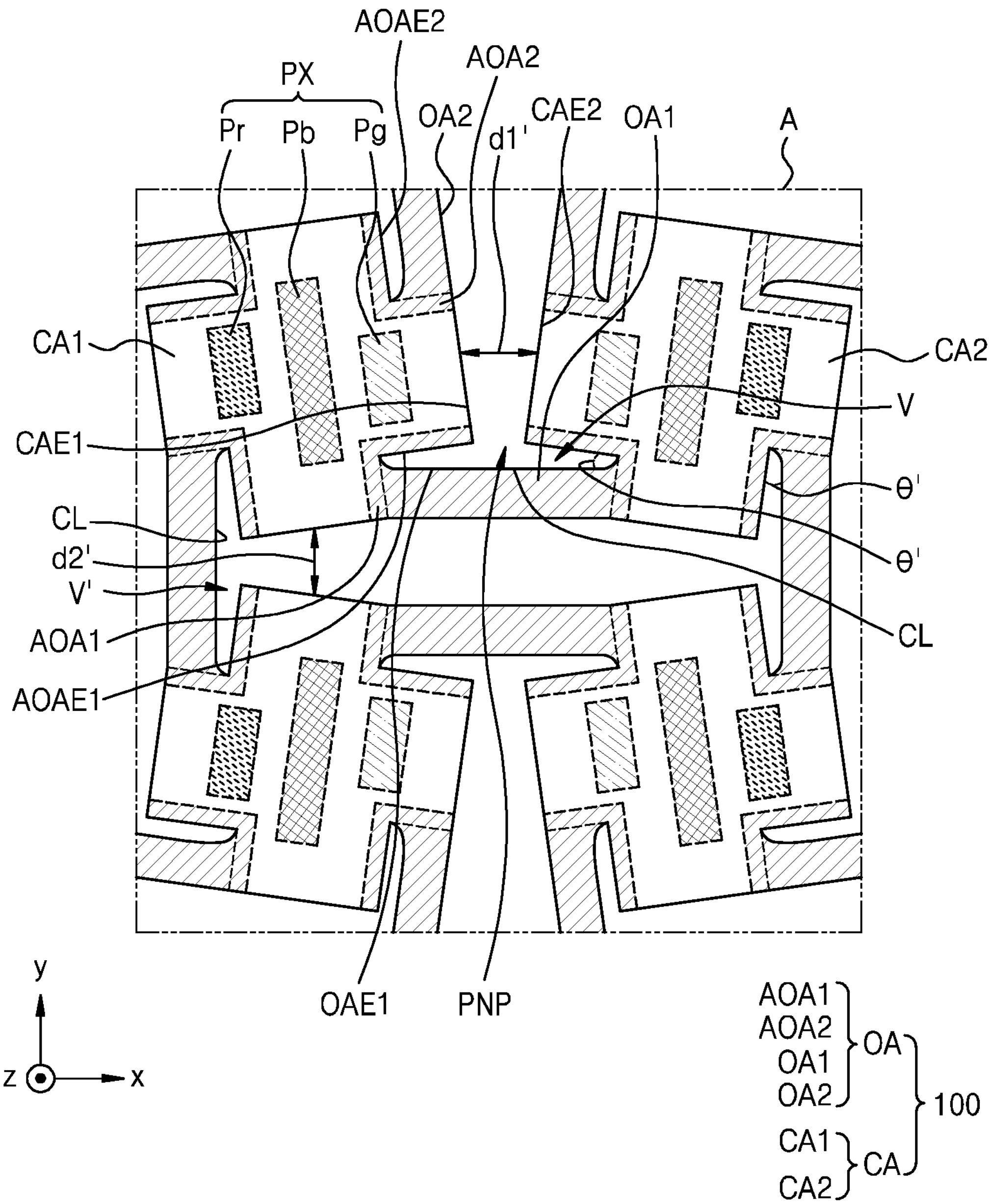
FIG. 2C is an enlarged view of the region A of the display panel of FIG. 2A when the display panel is stretched in a first direction and a second direction.

FIG. 2A is a plan view of the display panel 10 according to an embodiment. FIG. 2B is an enlarged view of the display panel 10 according to an embodiment. FIG. 2C is a plan view of the display panel 10 stretched in a first direction and a second direction according to an embodiment. FIGS. 2B and 2C are enlarged views of a region A of FIG. 2A.

Referring to FIG. 2A, the display panel 10 may include a substrate 100 and a multi-layer arranged on the substrate 100. The substrate 100 may include glass or a polymer resin such as polyethersulfone, polyacrylate, polyetherimide, polyethylene naphthalate, polyethylene terephthalate, polyphenylene sulfide, polyimide, polycarbonate, cellulose triacetate, and cellulose acetate propionate (CAP). The substrate 100 including a polymer resin may be flexible, rollable, and bendable. The substrate 100 may have a multi-layered structure including a base layer and a barrier layer. For example, the base layer may include the polymer resin.

Referring to FIG. 2B, the display panel 10 may include a penetration portion PNP. The penetration portion PNP may pass through the upper surface and the lower surface of the display panel 10. Accordingly, the substrate 100 and the multi-layer of the substrate 100 may not be arranged in the penetration portion PNP. As the display panel includes the penetration portion PNP, the flexibility of the display panel may be improved. In the case where external force (e.g., warping force, bending force, or pulling force) is applied to the display panel, the shape of the penetration portion PNP may be changed. Accordingly, while the display panel is transformed (e.g., stretched, contracted, or bended), the stress on the display panel may be reduced, and thus, abnormal transformation of the display panel may be prevented and the durability of the display panel may be improved.

The display panel may include the substrate 100 and pixels PX arranged on the substrate 100. The substrate 100 may include a central area CA and an outer area OA. The substrate 100 may include a plurality of central areas CA apart from each other. The plurality of central areas CA may be spaced apart from each other with a first distance (or gap) d1 or a second distance (or gap) d2.

A thickness of the substrate 100 in the central area CA may be different from a thickness of the substrate 100 in the outer area OA. In an embodiment, a thickness of the substrate 100 in the outer area OA may be less than a thickness of the substrate 100 in the central area CA. Accordingly, the flexibility of the substrate 100 may be increased in the outer area OA. In addition, as a thickness of the substrate 100 in the outer area OA is less than a thickness of the substrate 100 in the central area CA, the reliability of the display panel may be improved. This is described below.

The plurality of central areas CA may constitute lattice patterns repeatedly arranged in the first direction and the second direction. Here, the first direction intersects the second direction. As an example, the first direction and the second direction may form an acute angle. As another example, the first direction and the second direction may form an obtuse angle or a right angle. Hereinafter, the case where the first direction (e.g., a positive x-axis direction or a negative x-axis direction) and the second direction (e.g., a positive y-axis direction or a negative y-axis direction) form a right angle is mainly described in detail.

The central area CA may include a first central area CA1 and a second central area CA2. As an example, the first central area CA1 may be spaced apart from the second central area CA2 in the first direction (e.g., the positive x-axis direction or the negative x-axis direction). In another example, the first central area CA1 may be spaced apart from the second central area CA2 in the second direction (e.g., the positive y-axis direction or the negative y-axis direction).

The first central area CA1 may be spaced apart from the second central area CA2 by the penetration portion PNP therebetween. An element of the display panel may not be arranged between the first central area CA1 and the second central area CA2.

The outer area OA may extend to the outer side of the central area CA. The outer area OA may extend in the first direction (e.g., the positive x-axis direction or the negative x-axis direction) and/or the second direction (e.g., the positive y-axis direction or the negative y-axis direction) from the outer side of the central area CA. The outer area OA may surround a portion of the central area CA. The outer area OA may be provided as one body with the central area CA. For example, the outer area OA and the central area CA may be integrated with each other.

The outer area OA may include a first outer area OA1, a second outer area OA2, a first adjacent outer area AOA1, and a second adjacent outer area AOA2. The first outer area OA1 may extend in the first direction (e.g., the positive x-axis direction or the negative x-axis direction). The second outer area OA2 may extend in the second direction (e.g., the positive y-axis direction or the negative y-axis direction) intersecting the first direction. The first adjacent outer area AOA1 may be arranged between the first outer area OA1 and the central area CA. The second adjacent outer area AOA2 may be arranged between the second outer area OA2 and the central area CA. The first adjacent outer area AOA1 and the second adjacent outer area AOA2 may each surround at least a portion of the central area CA.

The outer area OA may extend between neighboring central areas CA. In an embodiment, each central area CA may be connected to four outer areas OA. Four outer areas OA connected to one central area CA extend in different directions, and each outer area OA may be connected to another central area CA neighboring the one central area CA.

In an embodiment, one of the first outer area OA1 and the second outer area OA2 may extend from the first central area CA1 to the second central area CA2. Accordingly, the first central area CA1 may be connected to the second central area CA2 through the first outer area OA1. The first outer area OA1, the second outer area OA2, and the second central area CA2 may be provided as one body or may be integrated with each other. In an embodiment, the first central area CA1, the first outer area OA1, the first adjacent outer area AOA1, and the second central area CA2 may be provided as one body or may be integrated with each other.

At least one of the edge of the central area CA and the edge of the outer area OA may define at least a portion of the penetration portion PNP. In an embodiment, an edge CAE1 of the first central area CAL an edge OAE1 of the first outer area OA1, and an edge CAE2 of the second central area CA2 may define at least a portion of the penetration portion PNP. In an embodiment, an edge CAE1 of the first central area CAL an edge OAE1 of the first outer area OA1, an edge AOAE1 of the first adjacent outer area AOA1, and an edge CAE2 of the second central area CA2 may define at least a portion of the penetration portion PNP.

One central area CA and some of outer areas OA extending therefrom may be defined as a basic unit U. The basic unit U may be repeatedly arranged in the first direction (e.g., the positive x-axis direction or the negative x-axis direction) and the second direction (e.g., the positive y-axis direction or the negative y-axis direction). For example, the substrate 100 includes basic units U repeatedly arranged and connected to each other. Two basic units U neighboring each other may be symmetrical to each other. As an example, in FIG. 2B, two basic units U neighboring each other in a horizontal direction may be horizontally symmetric with respect to a symmetry axis arranged therebetween and parallel to the positive y-axis direction. Similarly, in FIG. 2B, two basic units U neighboring each other in a vertical direction may be vertically symmetric with respect to a symmetry axis arranged therebetween and parallel to the positive x-axis direction.

Four basic units U neighboring each other among the plurality of basic units U (e.g., shown in FIG. 2B), constitute a closed curve CL therebetween. The closed curve CL may define a separation area V, which is an empty space. The separation area V may be defined by the closed curve CL including the edges of the plurality of central areas CA and the edges of the plurality of outer areas OA. Each separation area V may pass through the upper surface and the lower surface of the substrate 100. The separation area V may overlap the penetration portion PNP of the display panel.

In an embodiment, an angle θ between the edge OAE1 of the first outer area OA1 and the edge AOAE1 of the first adjacent outer area AOA1 may be an acute angle. In the case where external force for pulling the substrate 100 is applied, as shown in FIG. 2C, an angle θ' (θ'>θ) between the edge OAE1 of the first outer area OA1 and the edge AOAE1 of the first adjacent outer area AOA1 may increase, and the area or shape of a separation area V' may be changed. The position of the central area CA may be also changed.

In the case where the external force is applied, each central area CA may rotate by a change of the angle θ', an area increase and/or a shape transformation of the separation area V'. Due to the rotation of each central area CA, distances (or gaps) between the central areas CA, for example, a first distance (or gap) d1' and a second distance (or gap) d2' may be different for each position.

In the case where external force for pulling the substrate 100 is applied, stress may be concentrated on the edge OAE1 of the first outer area OA1 and the edge AOAE1 of the first adjacent outer area AOA1. To prevent damage to the substrate 100, the closed curve CL defining the separation area V may include a curve.

A pixel PX may overlap at least a portion of the central area CA. In an embodiment, each pixel PX may overlap at least a portion of each central area CA.

In an embodiment, a pixel PX may include a red sub-pixel Pr, a green sub-pixel Pg, and a blue sub-pixel Pb. In another embodiment, a pixel PX may include a red sub-pixel Pr, a green sub-pixel Pg, a blue sub-pixel Pb, and a white sub-pixel. Hereinafter, the case where a pixel PX overlapping each central area CA includes a red sub-pixel Pr, a green sub-pixel Pg, and a blue sub-pixel Pb is mainly described in detail.

In an embodiment, a sub-pixel may emit light having a preset color from an organic light-emitting diode as a display element. In the descriptions, a sub-pixel denotes an emission area as a minimum unit that displays an image. In the case where an organic light-emitting diode is employed or implemented as a display element, the emission area may be defined by an opening of a pixel-defining layer described below. An organic light-emitting diode may emit, for example, red light, green light, or blue light.

A connection wiring may be arranged in the outer area OA and configured to transfer or supply power or a signal, etc. to a pixel PX arranged in the central area CA.

Figure 3:
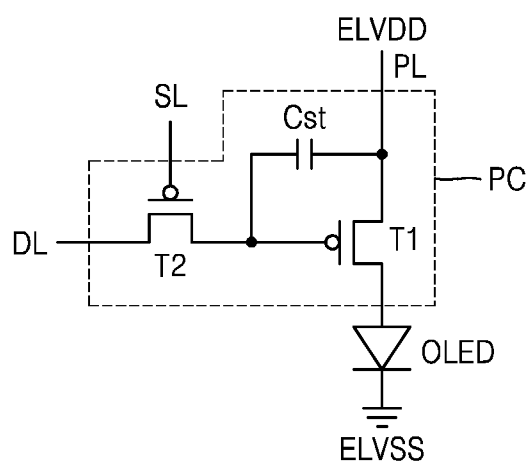
FIG. 3 is an equivalent circuit diagram of a representative pixel circuit of the display panel of FIG. 2A.

FIG. 3 is an equivalent circuit diagram of a pixel circuit PC applicable to a display panel according to an embodiment.

Referring to FIG. 3, the pixel circuit PC may be connected to a display element, for example, an organic light-emitting diode OLED.

The pixel circuit PC may include a driving thin-film transistor T1, a switching thin-film transistor T2, and a storage capacitor Cst. In addition, the organic light-emitting diode OLED may emit red light, green light, or blue light, or emit red light, green light, blue light, or white light.

The switching thin-film transistor T2 may be connected to a scan line SL and a data line DL and configured to transfer or supply a data signal or a data voltage to the driving thin-film transistor T1 based on a scan signal or a switching voltage input from the scan line SL. For example, the data signal or the data voltage may be supplied through the data line DL. The storage capacitor Cst may be connected to the switching thin-film transistor T2 and a driving voltage line PL and configured to store a voltage corresponding to a difference between a voltage transferred from the switching thin-film transistor T2 and a first power voltage ELVDD supplied to the driving voltage line PL.

The driving thin-film transistor T1 may be connected to the driving voltage line PL and the storage capacitor Cst and configured to control a driving current flowing from the driving voltage line PL to the organic light-emitting diode OLED according to the voltage stored in the storage capacitor Cst. The organic light-emitting diode OLED may emit light having preset brightness according to the driving current. An opposite electrode of the organic light-emitting diode OLED may be supplied with a second power voltage ELVSS.

Although it is shown in FIG. 3 that the pixel circuit PC includes two thin-film transistors and one storage capacitor, embodiments are not limited thereto. For example, the pixel circuit PC may include three or more thin-film transistors.

Figure 4A:
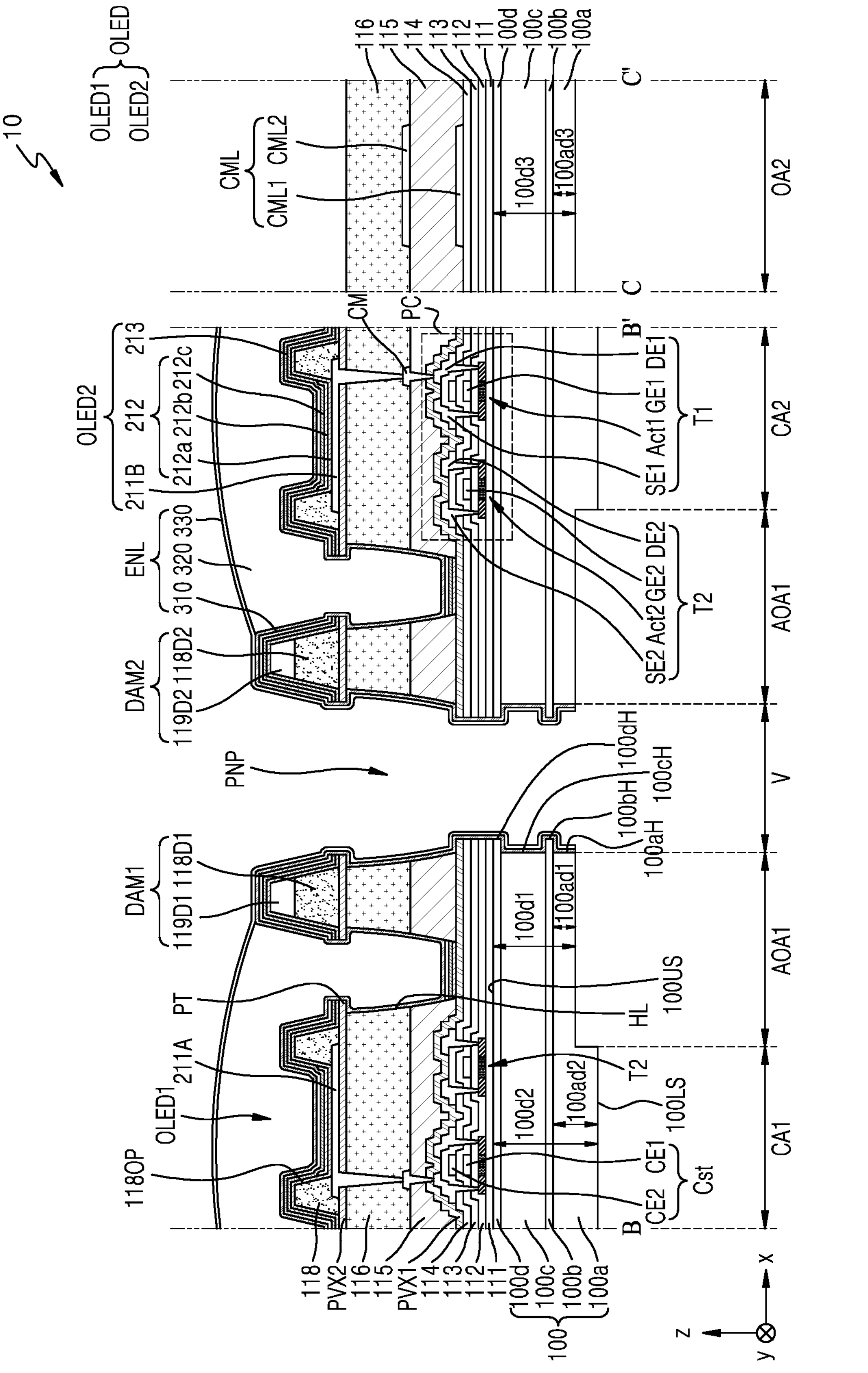
FIG. 4A is a cross-sectional view taken along line B-B' and line C-C' of FIG. 2B illustrating an embodiment of the display panel of FIG. 2A.
Figure 4B:
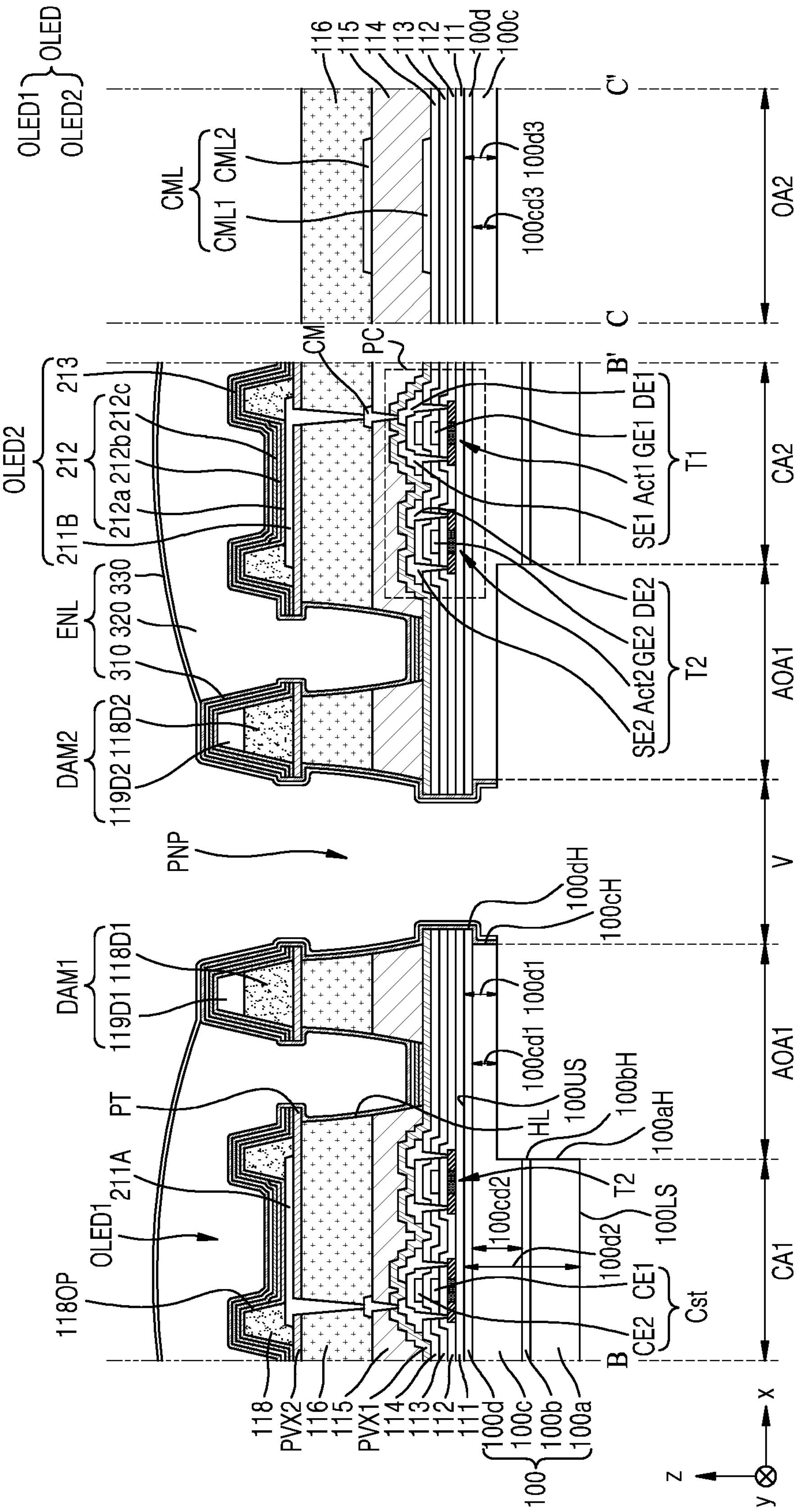
FIG. 4B is a cross-section view taken along line B-B' and line C-C' of FIG. 2B illustrating another embodiment of the display panel of FIG. 2A.

FIGS. 4A and 4B are cross-sectional views of the display panel 10 according to an embodiment. FIGS. 4A and 4B are cross-sectional views of the display panel 10 taken along lines B-B' and C-C' of FIG. 2B.

Referring to FIGS. 4A and 4B, the display panel 10 may include the penetration portion PNP. Elements of the display panel 10 may not be arranged in the penetration portion PNP. The penetration portion PNP may be defined as the edges of the elements of the display panel 10. As an example, the penetration portion PNP may be defined as the edge of the substrate 100.

The display panel 10 may include the substrate 100 and the organic light-emitting diode OLED as a display element. The substrate 100 may include the central area and the outer area. The central area may include the first central area CA1 and the second central area CA2. For example, the second central area CA2 may be spaced apart from the first central area CA1 by the penetration portion PNP therebetween. The outer area may extend to the outer side of the central area. In an embodiment, the outer area may include the first outer area OA1, the second outer area OA2, the first adjacent outer area AOA1, and the second adjacent outer area AOA2.

At least a portion of the edge of the central area and the edge of the outer area may define at least a portion of the penetration portion PNP. As an example, the edges of the first adjacent outer area AOA1 facing each other may define the penetration portion PNP. In an embodiment, a space between the first adjacent outer areas AOA1 may be defined by the separation area V of the substrate 100. The separation area V may overlap the penetration portion PNP.

A thickness of the substrate 100 in the outer area may be less than a thickness of the substrate 100 in the central area. In an embodiment, a thickness **100*d*1 of the substrate 100 in the first adjacent outer area AOA1 may be less than a thickness 100*d*2 of the substrate 100 in the first central area CA1. In an embodiment, a thickness 100*d*1 of the substrate 100 in the first adjacent outer area AOA1 may be less than a thickness of the substrate 100 in the second central area CA2. Accordingly, the flexibility of the substrate 100** may be increased.

The substrate 100 may include an upper surface 100US and a lower surface 100LS. For example, the upper surface 100US may face the organic light-emitting diode, and the lower surface 100LS may be opposite to the upper surface 100US. In this case, the lower surface LS of the substrate 100 may include a step difference. A step difference provided to the lower surface 100LS of the substrate 100 may be formed while the penetration portion PNP of the display panel 10 is formed.

In an embodiment, the central area and the outer area may be defined based on a step difference provided to the lower surface 100LS of the substrate 100. As an example, the first central area CA1 and the first adjacent outer area AOA1 may be defined based on a step difference provided to the lower surface 100LS of the substrate 100. Alternatively, the second central area CA2 and the first adjacent outer area AOA1 may be defined based on a step difference provided to the lower surface 100LS of the substrate 100.

The substrate 100 may include a base layer and a barrier layer on the base layer. In an embodiment, the substrate 100 may include a first base layer 100*a*, a first barrier layer 100*b*, a second base layer 100*c*, and a second barrier layer 100*d* that are sequentially stacked.

The substrate 100 may include a hole overlapping the separation area V and/or the penetration portion PNP. In an embodiment, the first base layer 100*a*, the first barrier layer 100*b*, the second base layer 100*c*, and the second barrier layer 100*d* may respectively include a first base layer hole 100*a*H, a first barrier layer hole 100*b*H, a second base layer hole 100*c*H, and a second barrier layer hole 100*d*H each overlapping the separation area V and/or the penetration portion PNP. In an embodiment, the first barrier layer hole 100*b*H and the second barrier layer hole 100*d*H may be respectively less wide than the first base layer hole 100*a*H and the second base layer hole 100*c*H.

The thickness of the base layer in the outer area may be less than the thickness of the base layer in the central area. Referring to FIG. 4A, a thickness 100*ad*1 of the first base layer 100*a* in the first adjacent outer area AOA1 may be less than a thickness 100*ad*2 of the first base layer 100*a* in the first central area CA1. The first base layer hole 100*a*H may have substantially the same size as the second base layer hole 100*c*H. Referring to FIG. 4B, a thickness 100*cd*1 of the second base layer 100*c* in the first adjacent outer area AOA1 may be less than a thickness 100*cd*2 of the second base layer 100*c* in the first central area CA1. The size (e.g., diameter) of the first base layer hole 100*a*H may be greater than the size (e.g., diameter) of the second base layer hole 100*c*H. The size (e.g., diameter) of the first barrier layer hole 100*b*H may be greater than the size (e.g., diameter) of the second barrier layer hole 100*d*H.

At least one of the first base layer 100*a* and the second base layer 100*c* may include a polymer resin such as polyethersulfone, polyacrylate, polyetherimide, polyethylene naphthalate, polyethylene terephthalate, polyphenylene sulfide, polyimide, polycarbonate, cellulose tri-acetate, cellulose acetate propionate, and the like.

The first barrier layer 100*b* and the second barrier layer 100*d* are barrier layers for preventing the penetration of external foreign materials and may include a single layer or a multi-layer including an inorganic insulating material such as silicon nitride ($SiN_x$), silicon oxide ($SiO_2$), silicon oxynitride (SiON), and the like.

A buffer layer 111 may be arranged on the substrate 100. The buffer layer 111 may include an inorganic material such as silicon nitride ($SiN_x$), silicon oxynitride (SiON), and silicon oxide ($SiO_2$), and include a single layer or a multi-layer including the above inorganic insulating material. In another embodiment, the buffer layer 111 may be omitted.

The pixel circuit PC may include the driving thin-film transistor T1, the switching thin-film transistor T2, and the storage capacitor Cst. The driving thin-film transistor T1, the switching thin-film transistor T2, and the storage capacitor Cst may be arranged on the buffer layer 111. The driving thin-film transistor T1 may include a first semiconductor layer Act1, a first gate electrode GE1, a first source electrode SE1, and a first drain electrode DE1. The switching thin-film transistor T2 may include a second semiconductor layer Act2, a second gate electrode GE2, a second source electrode SE2, and a second drain electrode DE2. The storage capacitor Cst may include a bottom electrode CE1 and a top electrode CE2.

The first semiconductor layer Act1 may be arranged on the buffer layer 111. The first semiconductor layer Act1 may include polycrystalline silicon. Alternatively, the first semiconductor layer Act1 may include amorphous silicon, an oxide semiconductor, or an organic semiconductor. The first semiconductor layer Act1 may include a channel region, a drain region, and a source region. For example, the drain region and the source region may be respectively on two opposite sides of the channel region.

The first gate electrode GE1 may overlap the channel region. The first gate electrode GE1 may include a low-resistance metal material. The first gate electrode GE1 may include a conductive material including molybdenum (Mo), aluminum (Al), copper (Cu), and titanium (Ti) and include a single layer or a multi-layer including the above materials.

The first gate insulating layer 112 between the first semiconductor layer Act1 and the first gate electrode GE1 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide (ZnO), or the like.

A second gate insulating layer 113 may cover the first gate electrode GE1. Similar to the first gate insulating layer 112, the second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide (ZnO), or the like.

The top electrode CE2 may be arranged on the second gate insulating layer 113. The top electrode CE2 may overlap the first gate electrode GE1 therebelow. In this case, the first gate electrode GE1 of the driving thin-film transistor T1 and the top electrode CE2 that overlap each other with the second gate insulating layer 113 therebetween may constitute the storage capacitor Cst. For example, the first gate electrode GE1 of the driving thin-film transistor T1 may serve as the bottom electrode CE1 of the storage capacitor Cst.

As described above, the storage capacitor Cst may overlap the driving thin-film transistor T1. In an embodiment, the storage capacitor Cst may not overlap the driving thin-film transistor T1.

The top electrode CE2 may include a single layer or a multi-layer including aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), copper (Cu) and/or the like.

An interlayer insulating layer 114 may cover the top electrode CE2. The interlayer insulating layer 114 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide (ZnO), or the like. The interlayer insulating layer 114 may include a single layer or a multi-layer including the inorganic insulating material.

The first drain electrode DE1 and the first source electrode SE1 may be arranged on the interlayer insulating layer 114. The first drain electrode DE1 and the first source electrode SE1 may include a material having excellent conductivity. The first drain electrode DE1 and the first source electrode SE1 may include a conductive material including molybdenum (Mo), aluminum (Al), copper (Cu), and titanium (Ti) and have a single-layer or a multi-layer including the above materials. In an embodiment, the first drain electrode DE1 and the first source electrode SE1 may have a multi-layered structure of Ti/Al/Ti.

The second semiconductor layer Act2, the second gate electrode GE2, the second drain electrode DE2, and the second source electrode SE2 are respectively similar to the first semiconductor layer Act1, the first gate electrode GE1, the first drain electrode DE1, and the first source electrode SE1. Thus, descriptions thereof are omitted for descriptive convenience.

A first organic insulating layer 115 may cover the first drain electrode DE1 and the first source electrode SE1. The first organic insulating layer 115 may include an organic insulating material such as a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

A connection electrode CM may be arranged on the first organic insulating layer 115. In this case, the connection electrode CM may be connected to the first drain electrode DE1 or the first source electrode SE1 through a contact hole of the first organic insulating layer 115. The connection electrode CM may include a material having excellent conductivity. The connection electrode CM may include a conductive material including at least one of molybdenum (Mo), aluminum (Al), copper (Cu), and titanium (Ti) and include a single layer or a multi-layer including the above materials. In an embodiment, the connection electrode CM may have a multi-layered structure of Ti/Al/Ti.

A second organic insulating layer 116 may cover the connection electrode CM. The second organic insulating layer 116 may include an organic insulating material such as a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

The first organic insulating layer 115 and the second organic insulating layer 116 each may include a hole HL. In an embodiment, the hole HL may include a hole of the first organic insulating layer 115 and a hole of the second organic insulating layer 116 that overlap each other. In another embodiment, the hole HL may be provided in the second organic insulating layer 116. In this case, an upper surface of the first organic insulating layer 115 may be exposed through the hole of the second organic insulating layer 116. Hereinafter, the case where the hole HL is provided in the first organic insulating layer 115 and the second organic insulating layer 116 is mainly described in detail.

In an embodiment, a first inorganic layer PVX1 may be arranged between the interlayer insulating layer 114 and the first organic insulating layer 115. The first inorganic layer PVX1 may cover the first source electrode SE1, the first drain electrode DE1, the second source electrode SE2, and the second drain electrode DE2. In an embodiment, the first inorganic layer PVX1 may include a contact hole such that the first source electrode SE1 or the first drain electrode DE1 is electrically connected to the connection electrode CM.

In another embodiment, the first inorganic layer PVX1 may arranged between the first organic insulating layer 115 and the second organic insulating layer 116. In this case, the first inorganic layer PVX1 may cover the connection electrode CM. At least a portion of the first inorganic layer PVX1 may be exposed through the hole HL. The first inorganic layer PVX1 may include a single layer or a multi-layer including an inorganic material such as silicon nitride ($SiN_x$) and/or silicon oxide ($SiO_2$).

The organic light-emitting diode OLED may be arranged on the second organic insulating layer 116. The organic light-emitting diode OLED may include a first organic light-emitting diode OLED1 and a second organic light-emitting diode OLED2. The first organic light-emitting diode OLED1 is a first display element and may overlap at least a portion of the first central area CA1. The second organic light-emitting diode OLED2 is a second display element and may overlap at least a portion of the second central area CA2.

The first organic light-emitting diode OLED1 may include a first pixel electrode 211A, an intermediate layer 212, and an opposite electrode 213. The second organic light-emitting diode OLED2 may include a second pixel electrode 211B, the intermediate layer 212, and the opposite electrode 213. The first pixel electrode 211A and the second pixel electrode 211B may each be connected to the connection electrode CM through a contact hole of the second organic insulating layer 116.

The first pixel electrode 211A and the second pixel electrode 211B may include a conductive oxide such as indium tin oxide (ITO), indium zinc oxide (IZO), zinc oxide (ZnO), indium oxide ($In_2O_3$), indium gallium oxide (IGO), aluminum zinc oxide (AZO), or the like. In another embodiment, the first pixel electrode 211A and the second pixel electrode 211B may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. In another embodiment, the first pixel electrode 211A and the second pixel electrode 211B may further include a layer including ITO, IZO, ZnO, or $In_2O_3$ on/under the reflective layer.

A pixel-defining layer 118 may be arranged on the first pixel electrode 211A and the second pixel electrode 211B, the pixel-defining layer 118 including openings 1180P that respectively expose the central portion of the first pixel electrode 211A and the central portion of the second pixel electrode 211B. The pixel-defining layer 118 may include an organic insulating material and/or an inorganic insulating material. The opening 1180P may define an emission area of light emitted from the organic light-emitting diode OLED. As an example, the width of the opening 1180P may correspond to the width of the emission area. In addition, the width of the opening 1180P may correspond to the width of a sub-pixel.

The intermediate layer 212 may be arranged on the pixel-defining layer 118. The intermediate layer 212 may include an emission layer 212*b* arranged in the opening 1180P of the pixel-defining layer 118. The emission layer 212*b* may include a polymer or low-molecular weight organic material that emits light having a preset color.

A first functional layer 212*a* and a second functional layer 212*c* may be respectively arranged under and on the emission layer 212*b*. The first functional layer 212*a* may include, for example, a hole transport layer (HTL), or include an HTL and a hole injection layer (HIL). The second functional layer 212*c* is arranged on the emission layer 212*b*. In another embodiment, the second functional layer 212*c* may be omitted. The second functional layer 212*c* may be an electron transport layer (ETL) and/or an electron injection layer (EIL). Like the opposite electrode 213 described below, the first functional layer 212*a* and/or the second functional layer 212*c* may be common layers formed to entirely cover the substrate 100.

The opposite electrode 213 may include a conductive material having a low work function. As an example, the opposite electrode 213 may include a transparent layer (or a semi-transparent layer) including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca) or an alloy thereof. Alternatively, the opposite electrode 213 may further include a layer including ITO, IZO, ZnO, or $In_2O_3$ on the transparent layer (or the semi-transparent layer) including the above material.

In an embodiment, a capping layer may be further arranged on the opposite electrode 213. The capping layer may include lithium fluoride (LiF), an inorganic material, and/or an organic material.

A second inorganic layer PVX2 may be arranged between the organic light-emitting diodes, e.g., the first organic light-emitting diodes OLED1 and the second organic light-emitting diode OLED2 and the second organic insulating layer 116. The second inorganic layer PVX2 may include a plurality of inorganic patterns apart from each other on the second organic insulating layer 116. The second inorganic layer PVX2 may have a protrusion tip PT that protrudes toward the center of the hole HL. Accordingly, the lower surface of the protrusion tip PT may be exposed or protruded to the hole HL. For example, the hole HL may have an undercut structure. The second inorganic layer PVX2 may include a single layer or a multi-layer including an inorganic material such as silicon nitride ($SiN_x$) and/or silicon oxide ($SiO_2$).

The hole HL and the second inorganic layer PVX2 may be structures for disconnecting the first functional layer 212*a* and the second functional layer 212*c*. In an embodiment, the first functional layer 212*a*, the second functional layer 212*c*, and the opposite electrode 213 may be formed over the entire surface of the substrate 100. In this case, the first functional layer 212*a* and the second functional layer 212*c* may each include an organic material. Thus, external oxygen or moisture, etc. may be introduced to the first central area CA1 and/or the second central area CA2 from the penetration portion PNP through at least one of the first functional layer 212*a* and the second functional layer 212*c*. The oxygen or moisture may damage the organic light-emitting diode OLED. The hole HL and the second inorganic layer PVX2 may disconnect or separate the first functional layer 212*a* and the second functional layer 212*c*. The separated first functional layer pattern and the separated second functional layer pattern may be arranged inside the hole HL. Accordingly, moisture and oxygen may be prevented from being introduced to the organic light-emitting diode OLED from the penetration portion PNP, and thus, damage to the organic light-emitting diode OLED may be prevented.

A first dam portion DAM1 and a second dam portion DAM2 may be arranged on the second inorganic layer PVX2. The first dam portion DAM1 and the second dam portion DAM2 may protrude in a thickness direction of the substrate 100 from the second inorganic layer PVX2. The first dam portion DAM1 and the second dam portion DAM2 may neighbor the penetration portion PNP.

The first dam portion DAM1 may be arranged between the penetration portion PNP and the first central area CA1. In an embodiment, the first dam portion DAM1 may surround the first organic light-emitting diode OLED1. The first dam portion DAM1 may be closer to the penetration portion PNP than the hole HL. The first dam portion DAM1 may include a first pattern layer 118D1 and a first top pattern layer 119D1. In an embodiment, the first pattern layer 118D1 may include the same material as the pixel-defining layer 118. The first top pattern layer 119D1 may include an organic insulating material and/or an inorganic insulating material.

The second dam portion DAM2 may be arranged between the penetration portion PNP and the second central area CA2. In an embodiment, the second dam portion DAM2 may surround the second organic light-emitting diode OLED2. The second dam portion DAM2 may be closer to the penetration portion PNP than the hole HL. The second dam portion DAM2 may include a second pattern layer 118D2 and a second top pattern layer 119D2. In an embodiment, the second pattern layer 118D2 may include the same material as the pixel-defining layer 118 and the first pattern layer 118D1. The pixel-defining layer 118, the first pattern layer 118D1, and the second pattern layer 118D2 may be simultaneously formed. The second top pattern layer 119D2 may include an organic insulating material and/or an inorganic insulating material. The second top pattern layer 119D2 may include the same material as the first top pattern layer 119D1. The first top pattern layer 119D1 and the second top pattern layer 119D2 may be simultaneously formed.

An encapsulation layer ENL may be arranged on the opposite electrode 213. In an embodiment, the encapsulation layer ENL may include at least one inorganic encapsulation layer and at least one organic encapsulation layer. In an embodiment, it is shown in FIGS. 4A and 4B that the encapsulation layer ENL includes a first inorganic encapsulation layer 310, an organic encapsulation layer 320, and a second inorganic encapsulation layer 330 that are sequentially stacked.

The first inorganic encapsulation layer 310 may cover the organic light-emitting diode OLED. The first inorganic encapsulation layer 310 may continuously cover the substrate 100. For example, the first inorganic encapsulation layer 310 may entirely cover the substrate 100. The first inorganic encapsulation layer 310 may cover the first organic light-emitting diode OLED1, the hole HL, the first dam portion DAM1, the second dam portion DAM2, and the second organic light-emitting diode OLED2. The first inorganic encapsulation layer 310 may contact a protrusion tip PT of the second inorganic layer PVX2. The first inorganic encapsulation layer 310 may contact the first inorganic layer PVX1. Accordingly, moisture or oxygen may be prevented from being introduced to the organic light-emitting diode OLED from the penetration portion PNP through a layer including an organic material.

The organic encapsulation layer 320 may be arranged on the first inorganic encapsulation layer 310. The organic encapsulation layer 320 may overlap the first organic light-emitting diode OLED1 and the second organic light-emitting diode OLED2 and fill the hole HL. In an embodiment, the organic encapsulation layer 320 may be separated based on the penetration portion PNP. As an example, the organic encapsulation layer 320 overlapping the first organic light-emitting diode OLED1 may extend to the first dam portion DAM1. The organic encapsulation layer 320 overlapping the second organic light-emitting diode OLED2 may extend to the second dam portion DAM2. As the first dam portion DAM1 and the second dam portion DAM2 protrude in a thickness direction of the substrate 100 from the upper surface of the second inorganic layer PVX2, the first dam portion DAM1 and the second dam portion DAM2 may control flow of the material forming the organic encapsulation layer 320.

The second inorganic encapsulation layer 330 may cover the organic encapsulation layer 320. The second inorganic encapsulation layer 330 may continuously cover the substrate 100. For example, the second inorganic encapsulation layer 330 may entirely cover the substrate 100. The second inorganic encapsulation layer 330 may contact the first inorganic encapsulation layer 310 on the first dam portion DAM1 and the second dam portion DAM2. Accordingly, the organic encapsulation layer 320 may be divided by the first dam portion DAM1 and the second dam portion DAM2.

The first inorganic encapsulation layer 310 and the second inorganic encapsulation layer 330 may include at least one inorganic material among aluminum oxide ($Al_2O_3$), titanium oxide ($TiO_2$), tantalum oxide ($Ta_2O_5$), hafnium oxide ($HfO_2$), zinc oxide (ZnO), silicon oxide ($SiO_2$), silicon nitride ($SiN_x$), silicon oxynitride (SiON), and the like. The organic encapsulation layer 320 may include a polymer-based material. The polymer-based material may include an acryl-based resin, an epoxy-based resin, polyimide, polyethylene, and the like. In an embodiment, the organic encapsulation layer 320 may include acrylate.

Though the organic encapsulation layer 320 may be divided by the first dam portion DAM1 and the second dam portion DAM2, the organic encapsulation layer 320 may be also formed in the penetration portion PNP due to dispersion or variation in a process of forming the organic encapsulation layer 320. In this case, the organic encapsulation layer 320 may connect the first central area CA1 to the second central area CA2, and thus, the flexibility of the display panel 10 may be reduced. In an embodiment, a thickness 100*d*1 of the substrate 100 in the first adjacent outer area AOA1 may be less than a thickness 100*d*2 of the substrate in the first central area CA1. The organic encapsulation layer 320 may be induced not to be formed in the penetration portion PNP. This is described below.

A thickness of the substrate 100 in the second outer area OA2 may be less than a thickness of the substrate 100 in the central area. In an embodiment, a thickness 100*d*3 of the substrate 100 in the second outer area OA2 may be less than a thickness 100*d*2 of the substrate 100 in the first central area CA1. In an embodiment, a thickness 100*d*3 of the substrate 100 in the second outer area OA2 may be substantially the same as a thickness 100*d*1 of the substrate 100 in the first adjacent outer area AOA1.

A thickness of the base layer in the outer area may be less than a thickness of the base layer in the central area. Referring to FIG. 4A, a thickness 100*ad*3 of the first base layer 100*a* in the second outer area OA2 may be less than a thickness 100*ad*2 of the first base layer 100*a* in the first central area CA1. The thickness 100*ad*3 of the first base layer 100*a* in the second outer area OA2 may be substantially the same as a thickness 100*ad*1 of the first base layer 100*a* in the first adjacent outer area AOA1. Referring to FIG. 4B, a thickness 100*cd*3 of the second base layer 100*c* in the second outer area OA2 may be less than a thickness 100*cd*2 of the second base layer 100*c* in the first central area CA1. The thickness 100*cd*3 of the second base layer 100*c* in the second outer area OA2 may be substantially the same as a thickness 100*cd*1 of the second base layer 100*c* in the first adjacent outer area AOA1. Accordingly, the flexibility of the substrate 100 in the second outer area OA2 may be increased.

In an embodiment, the buffer layer 111, the first gate insulating layer 112, the second gate insulating layer 113, the interlayer insulating layer 114, the first organic insulating layer 115, and the second organic insulating layer 116 may be arranged in the second outer area OA2. In another embodiment, at least one of the buffer layer 111, the first gate insulating layer 112, the second gate insulating layer 113, and the interlayer insulating layer 114 may be omitted. In an embodiment, at least one of the first functional layer 212*a*, the second functional layer 212*c*, the opposite electrode 213, the first inorganic encapsulation layer 310, and the second inorganic encapsulation layer 330 may be arranged on the second organic insulating layer 116.

A connection wiring CML may be arranged in the second outer area OA2. The connection wiring CML may supply power and/or a signal to the pixel circuit PC and/or the organic light-emitting diode OLED. In an embodiment, the connection wiring CML may include a first connection wiring CML1 and a second connection wiring CML2.

In an embodiment, the first connection wiring CML1 may be arranged between the interlayer insulating layer 114 and the first organic insulating layer 115. In another embodiment, the first connection wiring CML1 may be arranged between the buffer layer 111 and the first gate insulating layer 112, between the first gate insulating layer 112 and the second gate insulating layer 113, or between the second gate insulating layer 113 and the interlayer insulating layer 114. The second connection wiring CML2 may be arranged between the first organic insulating layer 115 and the second organic insulating layer 116.

A touch electrode layer may be arranged on the encapsulation layer ENL. An optical functional layer may be arranged on the touch electrode layer. The touch electrode layer may obtain coordinate information corresponding to an external input, for example, a touch event. The optical functional layer may reduce the reflectivity of light (e.g., external light) incident toward a display apparatus from the outside and/or improve color purity of light emitted from the display apparatus. In an embodiment, the optical functional layer may include a retarder and/or a polarizer. The retarder may include a film-type retarder or a liquid crystal-type retarder. The retarder may include a $\lambda/2$ retarder and/or a $\lambda/4$ retarder. The polarizer may include a film-type polarizer or a liquid crystal-type polarizer. The film-type polarizer may include a stretchable synthetic resin film, and the liquid crystal-type polarizer may include liquid crystals arranged in a predetermined arrangement. Each of the retarder and the polarizer may further include a protective film.

In another embodiment, the optical functional layer may include a black matrix and color filters. The color filters may be arranged by taking into account colors of light respectively emitted from the pixels of the display apparatus. Each of the color filters may include a red, green, or blue pigment or dye. Alternatively, each of the color filters may further include quantum dots in addition to the pigment or dye. Alternatively, some of the color filters may not include the pigment or dye and may include scattering particles such as titanium oxide.

In another embodiment, the optical functional layer may include a destructive interference structure. The destructive interference structure may include a first reflection layer and a second reflection layer respectively arranged on different layers. First-reflected light and second-reflected light respectively reflected by the first reflection layer and the second reflection layer may destructively interfere, and thus, the reflectivity of external light may be reduced.

An adhesive member may be arranged between the touch electrode layer and the optical functional layer. The adhesive member generally known in the art may be employed or implemented without limitation. The adhesive member may be a pressure sensitive adhesive (PSA).

Figure 5A:
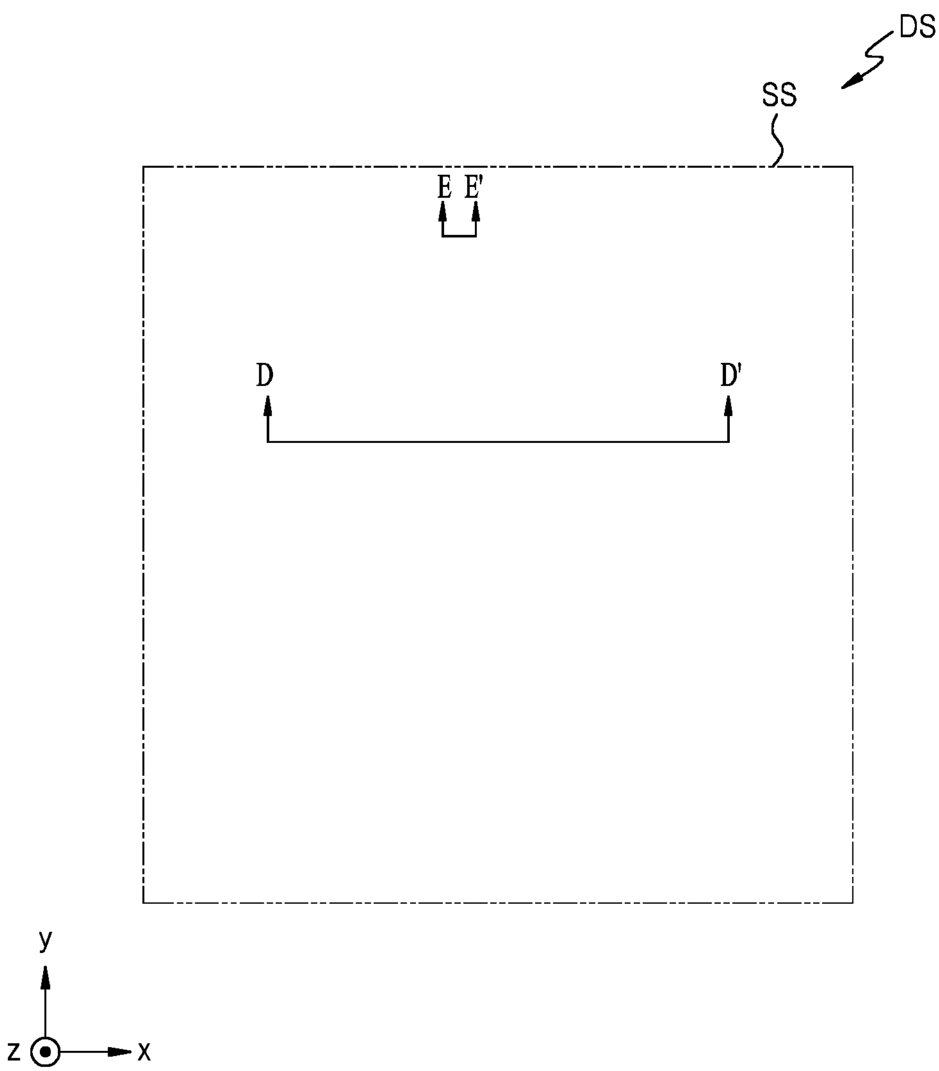
FIG. 5A is a plan view illustrating an embodiment of a method of manufacturing the display panel of the display apparatus of FIG. 2A.
Figure 5B:
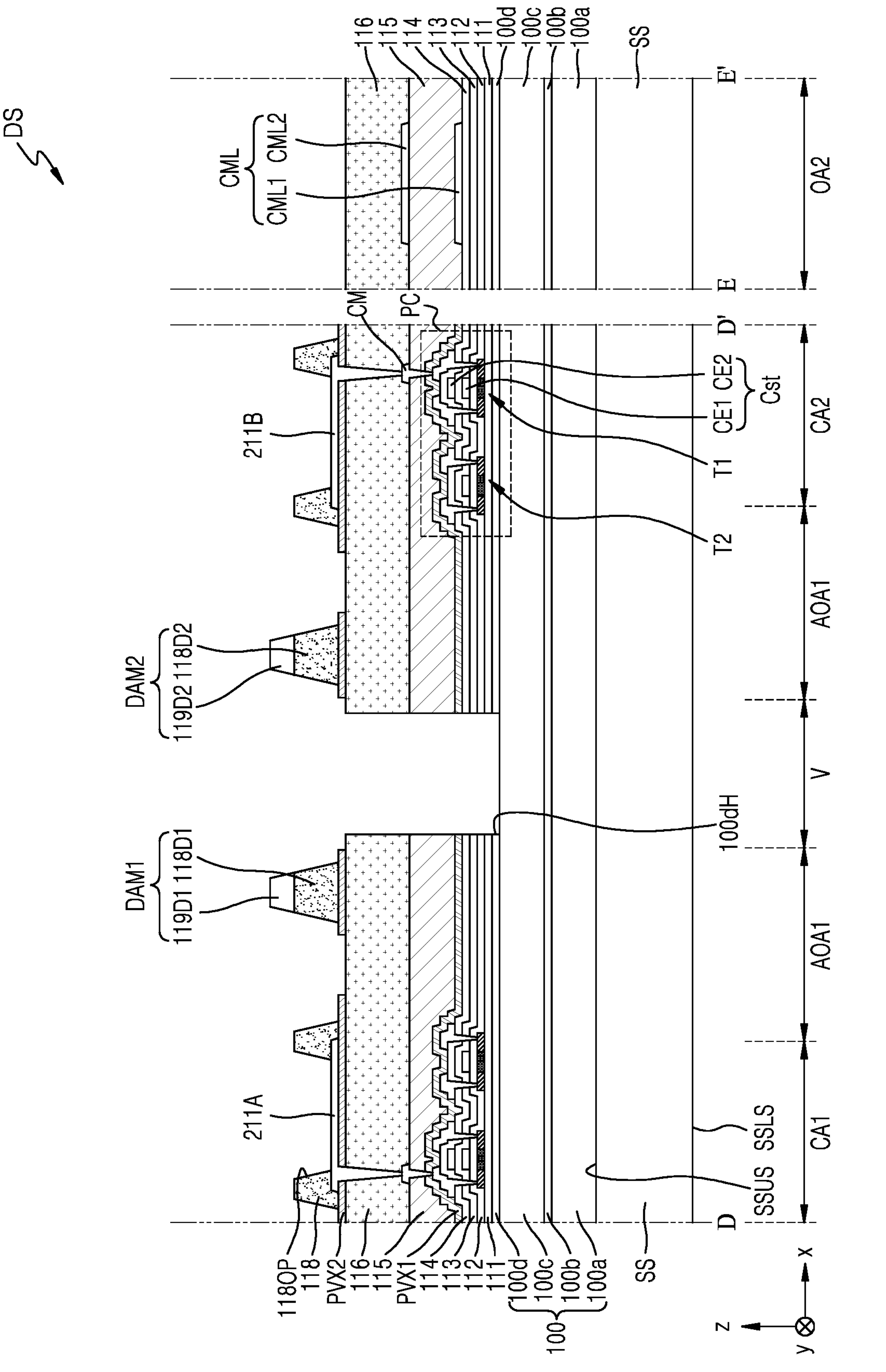
FIG. 5B is a cross-sectional view taken along line D-D' and line E-E' of FIG. 5A illustrating the method of manufacturing the display panel of the display apparatus of FIG. 2A.
Figure 6:
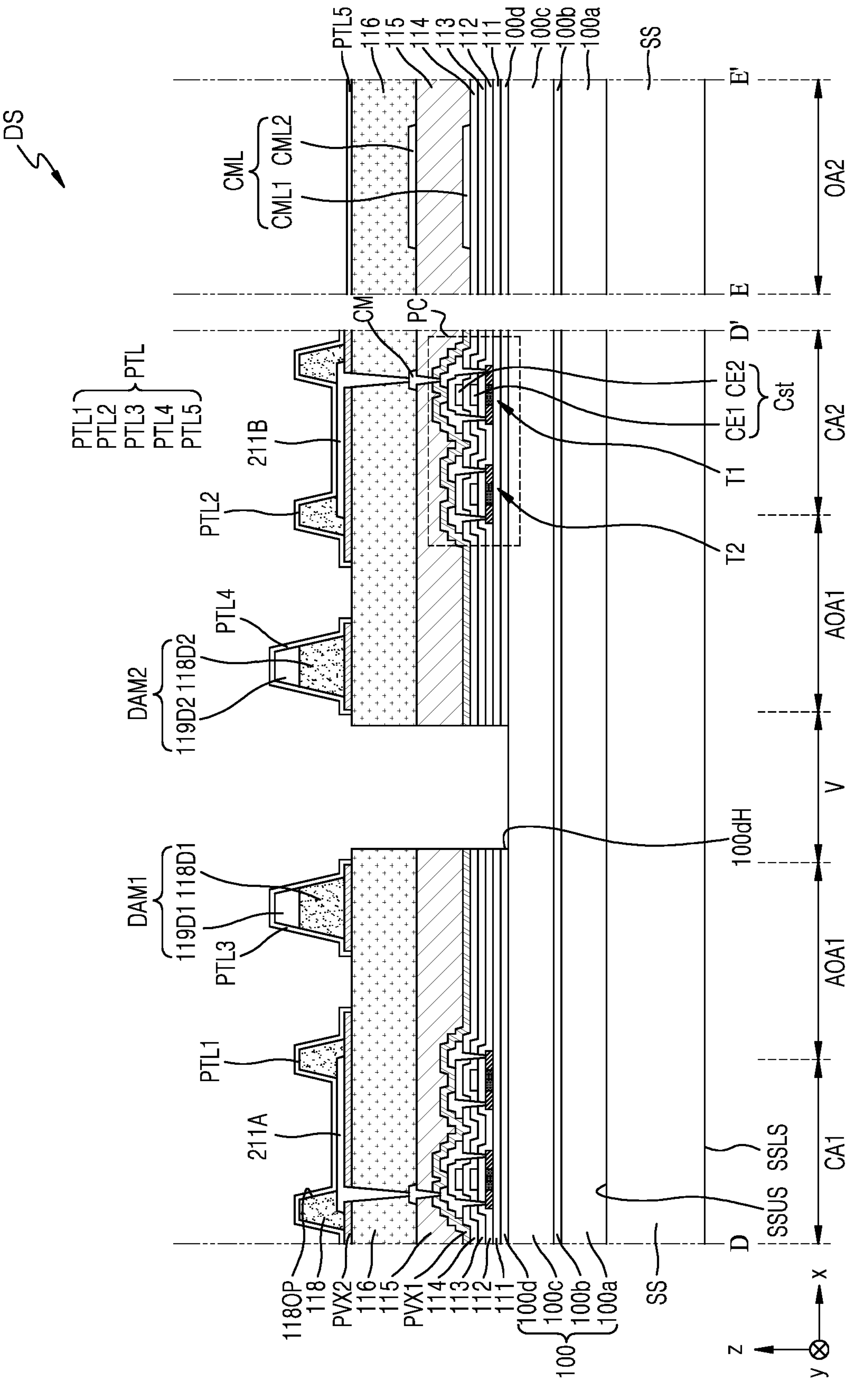
FIGS. 6 and 7 are cross-sectional views taken along line D-D' and line E-E' of FIG. 5A illustrating the method of manufacturing the display panel of the display apparatus of FIG. 2A.
Figure 7:
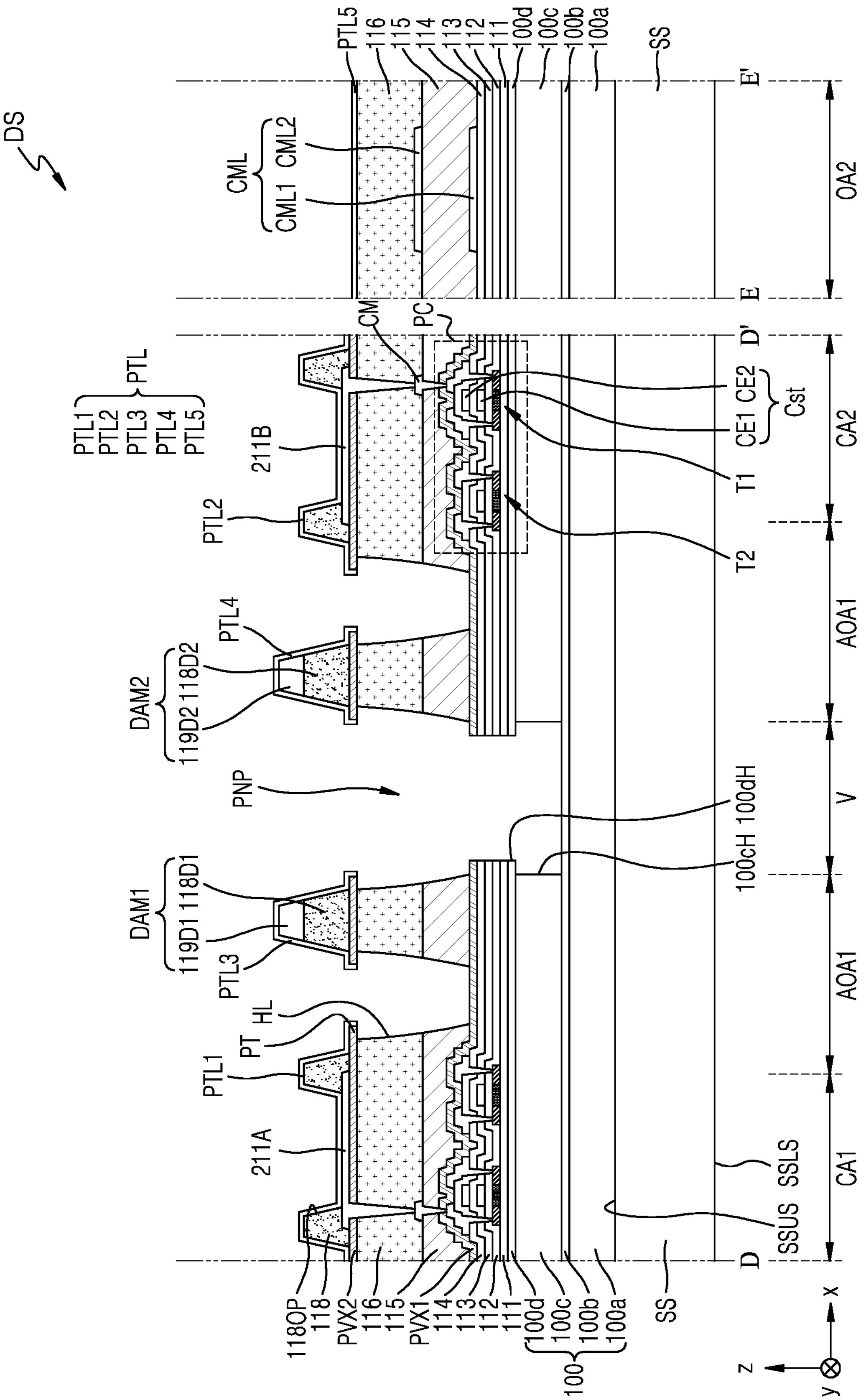
Figure 8A:
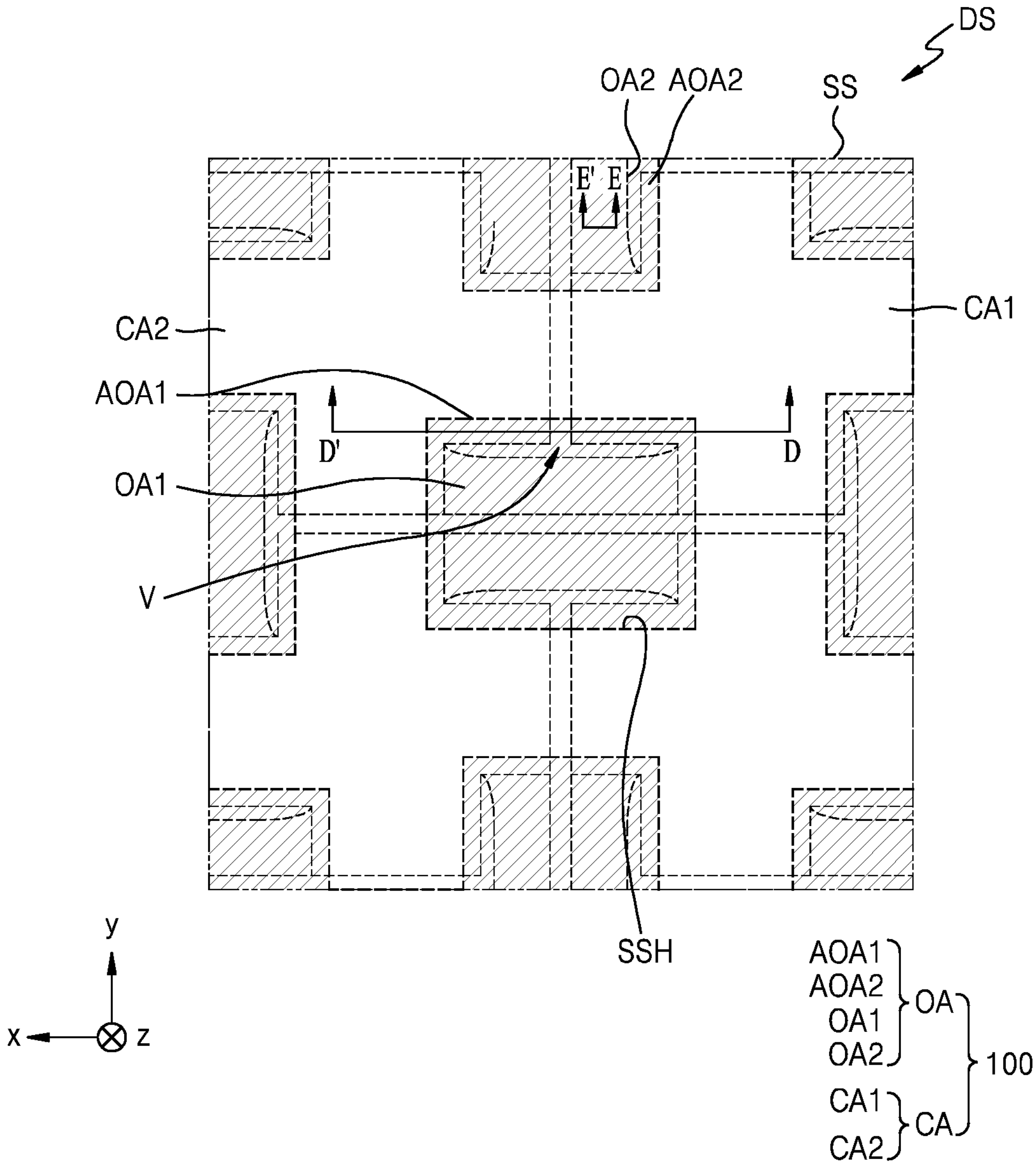
FIG. 8A is a plan view illustrating the method of manufacturing the display panel of the display apparatus of FIG. 2A.
Figure 8B:
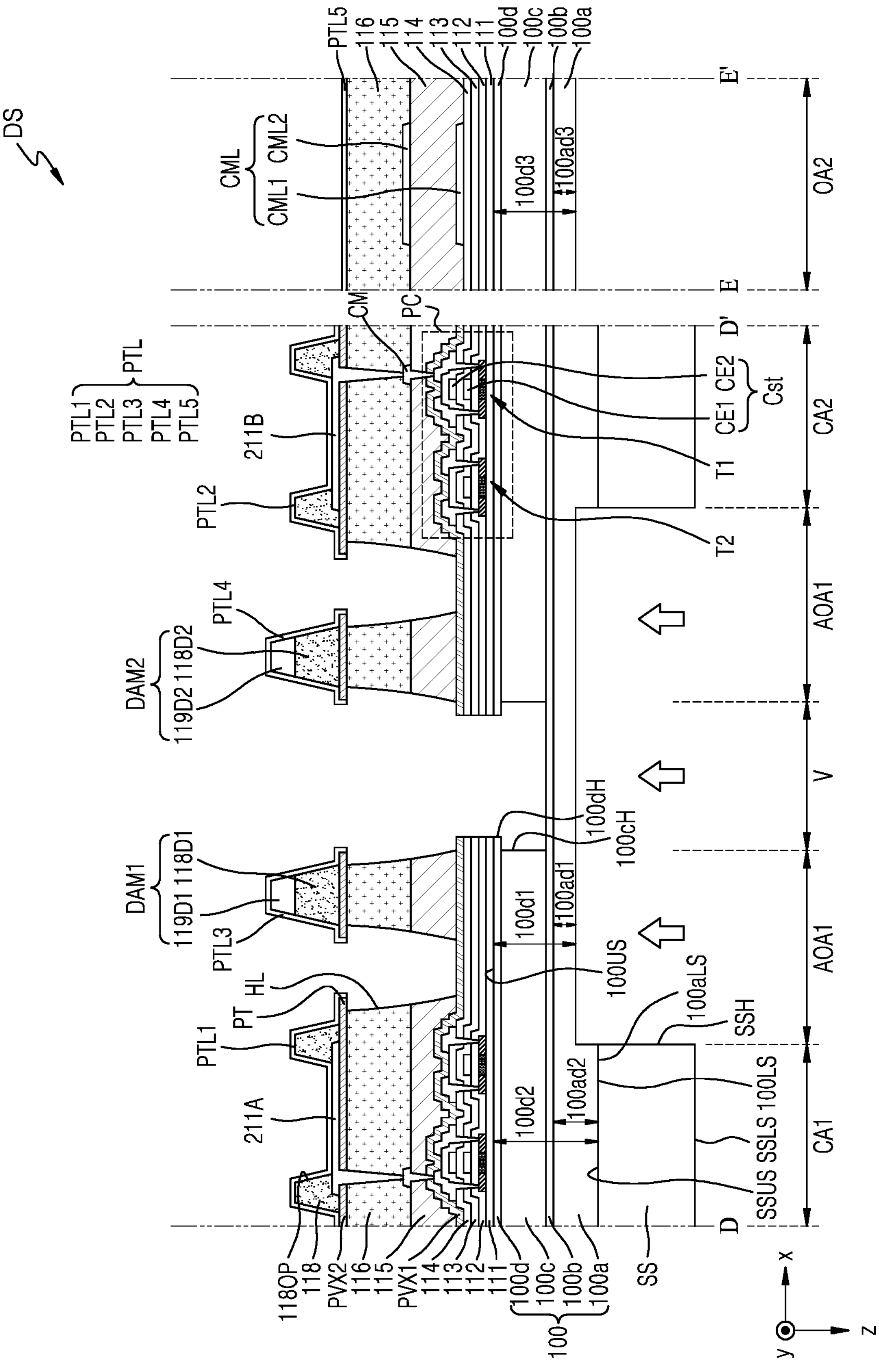
FIGS. 8B and 8C are cross-sectional views taken along line D-D' and line E-E' of FIG. 8A illustrating the method of manufacturing the display panel of the display apparatus of FIG. 2A.
Figure 8C:
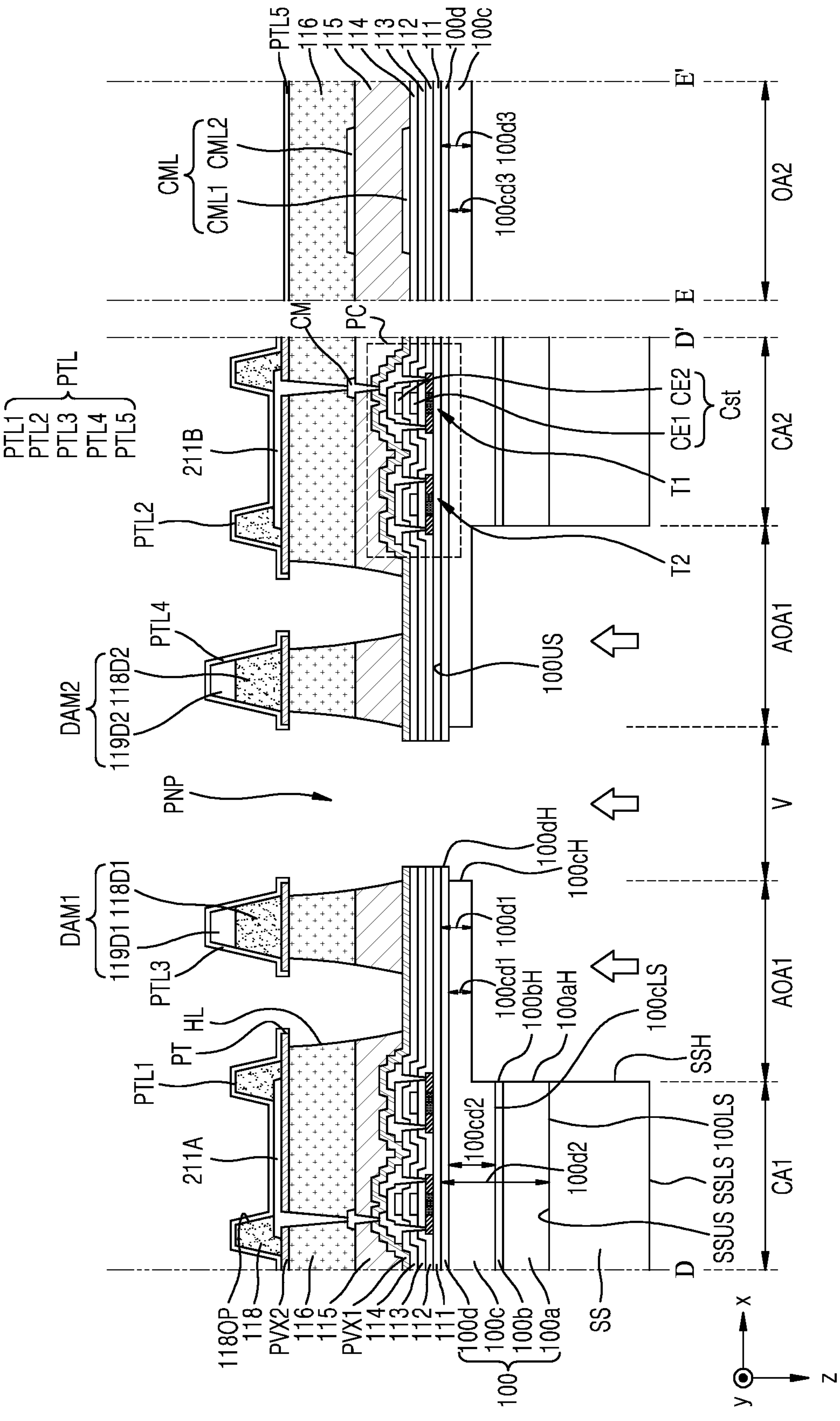

FIG. 5A is a plan view showing a method of manufacturing a display apparatus according to an embodiment. FIG. 5B is a cross-sectional view showing a method of manufacturing a display apparatus according to an embodiment. FIGS. 6 and 7 are cross-sectional views showing a method of manufacturing a display apparatus according to an embodiment. FIG. 8A is a plan view showing a method of manufacturing a display apparatus according to an embodiment. FIGS. 8B and 8C are cross-sectional views showing a method of manufacturing a display apparatus according to an embodiment. FIGS. 9, 10, 11, and 12 are cross-sectional views showing a method of manufacturing a display apparatus according to an embodiment.

FIGS. 5B, 6, and 7 show cross-sections of the display apparatus taken along lines D-D' and E-E' of FIG. 5A. FIGS. 8B, 8C, 9, 10, 11, and 12 show cross-sections of the display apparatus taken along lines D-D' and E-E' of FIG. 8A.

Referring to FIGS. 5A and 5B, a display substrate DS may be formed on a support substrate SS. The support substrate SS may include an upper surface SSUS and a lower surface SSLS. The lower surface SSLS of the support substrate SS may be opposite to the upper surface SSUS of the support substrate SS. The display substrate DS may be formed on the upper surface SSUS of the support substrate SS. The support substrate SS may include a material having hardness and rigidity sufficient to support a manufactured display panel and may include, for example, a glass material.

The display substrate DS may be a display panel that is manufactured. The display substrate DS may include the substrate 100, the first pixel electrode 211A, and the second pixel electrode 211B. The substrate 100 may include a central area, an outer area, and a separation area V, the outer area extending from the outer side of the central area. The central area may include the first central area CA1 and the second central area CA2. The outer area may include the first outer area, the second outer area OA2, the first adjacent outer area AOA1, and the second adjacent outer area.

The substrate 100 may be formed on the upper surface SSUS of the support substrate SS. The substrate 100 may include the first base layer 100*a*, the first barrier layer 100*b*, the second base layer 100*c*, and the second barrier layer 100*d* that are sequentially stacked. The first barrier layer 100*b* and the second base layer 100*c* may be continuously formed on the upper surface SSUS of the support substrate SS.

The second barrier layer 100*d* may be formed on the second base layer 100*c*. In an embodiment, the second barrier layer hole 100*d*H may be formed in the second barrier layer 100*d*. The second barrier layer hole 100*d*H may overlap at least one of the first base layer 100*a*, the first barrier layer 100*b*, and the second base layer 100*c*. As an example, the second barrier layer hole 100*d*H may overlap the first barrier layer 100*b* and the second base layer 100*c*. In an embodiment, the second barrier layer hole 100*d*H may expose the second base layer 100*c*.

The buffer layer 111, the first gate insulating layer 112, the second gate insulating layer 113, the interlayer insulating layer 114, the pixel circuit PC, and the first inorganic layer PVX1 may be formed on the second barrier layer 100*d*. The pixel circuit PC may include the driving thin-film transistor T1, the switching thin-film transistor T2, and the storage capacitor Cst.

The buffer layer 111, the first gate insulating layer 112, the second gate insulating layer 113, and the interlayer insulating layer 114 may be divided in the separation area V. In an embodiment, the buffer layer 111, the first gate insulating layer 112, the second gate insulating layer 113, and the interlayer insulating layer 114 may respectively have holes that overlap the separation area V.

The first organic insulating layer 115, the connection electrode CM, and the second organic insulating layer 116 may be formed on the first inorganic layer PVX1. In an embodiment, the first organic insulating layer 115 and the second organic insulating layer 116 may be divided in the separation area V. In another embodiment, at least one of the first organic insulating layer 115 and the second organic insulating layer 116 may overlap the separation area V.

The connection wiring CML may be formed in the second outer area OA2. In an embodiment, the connection wiring CML may include a first connection wiring CML1 and a second connection wiring CML2.

The second inorganic layer PVX2 may be formed on the second organic insulating layer 116. The second inorganic layer PVX2 may be divided on the second organic insulating layer 116.

The first pixel electrode 211A and the second pixel electrode 211B may be formed on the second inorganic layer PVX2. The first pixel electrode 211A may be arranged in the first central area CA1. The second pixel electrode 211B may be arranged in the second central area CA2. The first pixel electrode 211A may be spaced apart from the second pixel electrode 211B.

Next, the pixel-defining layer 118, the first pattern layer 118D1, and the second pattern layer 118D2 may be formed. The pixel-defining layer 118 may cover the edge of the first pixel electrode 211A and the edge of the second pixel electrode 211B. The pixel-defining layer 118 may include openings 118OP that respectively expose the central portion of the first pixel electrode 211A and the central portion of the second pixel electrode 211B.

The pixel-defining layer 118, the first pattern layer 118D1, and the second pattern layer 118D2 may be simultaneously formed. In an embodiment, the pixel-defining layer 118, the first pattern layer 118D1, and the second pattern layer 118D2 may be formed by entirely forming the organic layer on the substrate 100, and then patterning the organic layer. In this case, the pixel-defining layer 118, the first pattern layer 118D1, and the second pattern layer 118D2 may include the same material.

The first top pattern layer 119D1 and the second top pattern layer 119D2 may be formed on the first pattern layer 118D1 and the second pattern layer 118D2. In an embodiment, the first top pattern layer 119D1 and the second top pattern layer 119D2 may be formed by forming the organic layer to entirely cover the substrate 100, and then patterning the organic layer. In this case, the first top pattern layer 119D1 may include the same material as the second top pattern layer 119D2.

The first pattern layer 118D1 and the first top pattern layer 119D1 may constitute the first dam portion DAM1. The second pattern layer 118D2 and the second top pattern layer 119D2 may constitute the second dam portion DAM2.

Referring to FIG. 6, a protective layer PTL may be formed. In an embodiment, the protective layer PTL may include a first protective layer PTL1, a second protective layer PTL2, a third protective layer PTL3, a fourth protective layer PTL4, and a fifth protective layer PTL5. The first protective layer PTL1 may cover the first pixel electrode 211A and the pixel-defining layer 118. The second protective layer PTL2 may cover the second pixel electrode 211B and the pixel-defining layer 118. The third protective layer PTL3 may cover the first dam portion DAM1. The fourth protective layer PTL4 may cover the second dam portion DAM2. The fifth protective layer PTL5 may cover the second outer area OA2 and the second organic insulating layer 116.

Neighboring protective layers PTL may be spaced apart from each other to expose the second organic insulating layer 116. As an example, the first protective layer PTL1 may be spaced apart from the third protective layer PTL3 to expose the second organic insulating layer 116. The second protective layer PTL2 may be spaced apart from the fourth protective layer PTL4 to expose the second organic insulating layer 116. In an embodiment, the third protective layer PTL3 may be spaced apart from the fourth protective layer PTL4 to expose the second base layer 100*c*.

In an embodiment, a preliminary protective layer on the substrate 100, and a photoresist pattern may be formed on the preliminary protective layer. Next, the first protective layer PTL1, the second protective layer PTL2, the third protective layer PTL3, the fourth protective layer PTL4, and the fifth protective layer PTL5 may be formed by removing at least a portion of the preliminary protective layer. In an embodiment, the preliminary protective layer may include indium zinc oxide (IZO). In an embodiment, a photoresist pattern may be formed by forming the preliminary protective layer on the substrate 100 using a sputter, by coating a photoresist layer on the entire preliminary protective layer, and then by exposing and developing only a portion of the photoresist layer. Next, the first protective layer PTL1, the second protective layer PTL2, the third protective layer PTL3, the fourth protective layer PTL4, and the fifth protective layer PTL5 may be formed by etching the preliminary protective layer. The preliminary protective layer may be wet-etched and divided into the first protective layer PTL1, the second protective layer PTL2, the third protective layer PTL3, the fourth protective layer PTL4, and the fifth protective layer PTL5.

Referring to FIG. 7, the first barrier layer 100*b* may be exposed by etching the second base layer 100*c*. In an embodiment, the second base layer hole 100*c*H may be formed in the second base layer 100*c*. The second base layer 100*c* may be over-etched. In this case, the second base layer hole 100*c*H may be larger than the second barrier layer hole 100*d*H.

The second base layer hole 100*c*H may expose the first barrier layer 100*b*. The first barrier layer 100*b* may prevent the first base layer 100*a* arranged under the first barrier layer 100*b* from being over-etched.

In an embodiment, the hole HL may be formed in the first organic insulating layer 115 and the second insulating layer 116. The first organic insulating layer 115 and the second insulating layer 116 exposed between the first protective layer PTL1 and the third protective layer PTL3 may be etched. Accordingly, the hole HL may be formed between the first protective layer PTL1 and the third protective layer PTL3. In addition, the first organic insulating layer 115 and the second insulating layer 116 exposed between the second protective layer PTL2 and the fourth protective layer PTL4 may be etched. Accordingly, the hole HL may be formed also between the second protective layer PTL2 and the fourth protective layer PTL4.

In an embodiment, the second insulating layer 116 arranged under the second inorganic layer PVX2 may be over-etched. Accordingly, an undercut structure may be formed in the first organic insulating layer 115 and the second insulating layer 116. In this case, the lower surface of the end portion of the second inorganic layer PVX2 may be exposed. For example, the lower surface of the protrusion tip PT of the second inorganic layer PVX2 that overlaps the hole HL may be exposed.

In an embodiment, while the second base layer hole 100*c*H is formed, the hole HL of the first organic insulating layer 115 and the second insulating layer 116 may be formed.

Referring to FIG. 8A, the support substrate SS and the display substrate DS may be turned over such that the lower surface SSLS of the support substrate SS faces in the positive z-axis direction. In this case, as the protective layer PTL is formed on the upper surface of the display substrate DS, even when the support substrate SS and the display substrate DS are turned over, the protective layer PTL may protect the first pixel electrode 211A, the second pixel electrode 211B, the first dam portion DAM1, the second dam portion DAM2, and the pixel-defining layer 118.

A penetration hole SSH may be formed in the support substrate SS. In an embodiment, a plurality of penetration holes SSH may be formed in the support substrate SS to be spaced apart from each other. The penetration hole SSH may overlap the separation area V. In an embodiment, the penetration hole SSH may overlap the separation area V and the outer area OA.

Referring to FIGS. 8B and 8C, the penetration hole SSH may pass through the upper surface SSUS of the support substrate SS and the lower surface SSLS of the support substrate SS. In an embodiment, a laser may be irradiated to the lower surface SSLS of the support substrate SS that overlaps the separation area V. Next, the lower surface SSLS of the support substrate SS may be entirely etched. In this case, as a laser is irradiated to the lower surface SSLS of the support substrate SS that overlaps the separation area V, the penetration hole SSH overlapping the separation area V may be formed. In another embodiment, the penetration hole SSH may be formed by irradiating a laser to the lower surface SSLS of the support substrate SS that overlaps the separation area V. In another embodiment, the penetration hole SSH may be formed by etching the lower surface SSLS of the support substrate SS that overlaps the separation area V.

While the penetration hole SSH is formed, at least a portion of the substrate 100 may be removed. The substrate 100 may include the upper surface 100US and the lower surface 100LS. For example, the upper surface 100US may face the organic light-emitting diode OLED, and the lower surface 100LS may face the support substrate SS. In this case, the lower surface 100LS of the substrate 100 may have a step difference.

A thickness of the substrate 100 in the outer area may be less than a thickness of the substrate 100 in the central area. As an example, the thickness 100*d*1 of the substrate 100 in the first adjacent outer area AOA1 may be less than the thickness 100*d*2 of the substrate 100 in the first central area CA1. The thickness 100*d*1 of the substrate 100 in the first adjacent outer area AOA1 may be less than the thickness of the substrate 100 in the second central area CA2. In addition, the thickness 100*d*3 of the substrate 100 in the second outer area OA2 may be less than the thickness 100*d*2 of the substrate 100 in the first central area CA1. The thickness 100*d*3 of the substrate 100 in the second outer area OA2 may be substantially the same as the thickness 100*d*1 of the substrate 100 in the first adjacent outer area AOA1. Accordingly, the flexibility of the substrate 100 in the outer area may be increased.

Referring to FIG. 8B, a step difference may be formed by etching at least a portion of a lower surface 100*a*LS of the first base layer 100*a*. The lower surface 100*a*LS of the first base layer 100*a* may face the support substrate SS. In this case, the thickness 100*ad*1 of the first base layer 100*a* in the first adjacent outer area AOA1 may be less than the thickness 100*ad*2 of the first base layer 100*a* in the first central area CA1. In this case, the first base layer 100*a* may be continuously arranged in the separation area V. Accordingly, foreign substance formed while the penetration hole SSH is formed in the support substrate SS may be prevented from passing through the second base layer hole 100*c*H and the second barrier layer hole 100*d*H. Damage to the first pixel electrode 211A and/or the second pixel electrode 211B may be also prevented or reduced.

The thickness 100*ad*3 of the first base layer 100*a* in the second outer area OA2 may be less than the thickness 100*ad*2 of the first base layer 100*a* in the first central area CA1. The thickness 100*ad*3 of the first base layer 100*a* in the second outer area OA2 may be substantially the same as the thickness 100*ad*1 of the first base layer 100*a* in the first adjacent outer area AOA1.

Referring to FIG. 8C, while the penetration hole SSH is formed, the first base layer hole 100*a*H may be formed in the first base layer 100*a*. In addition, while the penetration hole SSH is formed, the first barrier layer hole 100*b*H may be formed in the first barrier layer 100*b*. The first base layer hole 100*a*H and the first barrier layer hole 100*b*H may overlap the separation area V. The size (e.g., diameter) of the first base layer hole 100*a*H may be greater than the size (e.g., diameter) of the second base layer hole 100*c*H. The size (e.g., diameter) of the first barrier layer hole 100*b*H may be greater than the size (e.g., diameter) of the second barrier layer hole 100*d*H.

A step difference may be formed by etching at least a portion of the lower surface 100*c*LS of the second base layer 100*c*. The lower surface 100*c*LS of the second base layer 100*c* may face the support substrate SS. The thickness 100*cd*1 of the second base layer 100*c* in the first adjacent outer area AOA1 may be less than the thickness 100*cd*2 of the second base layer 100*c* in the first central area CA1. In addition, the thickness 100*cd*3 of the second base layer 100*c* in the second outer area OA2 may be less than the thickness 100*cd*2 of the second base layer 100*c* in the first central area CA1. The thickness 100*cd*3 of the second base layer 100*c* in the second outer area OA2 may be substantially the same as the thickness 100*cd*1 of the second base layer 100*c* in the first adjacent outer area AOA1. Accordingly, the flexibility of the substrate 100 in the outer area may be increased.

In this case, while the penetration hole SSH passing through the support substrate SS is formed, the penetration portion PNP passing through the display substrate DS may be formed. Hereinafter, as shown in FIG. 8B, the case where the step difference is formed by etching at least a portion of the lower surface 100*a*LS of the first base layer 100*a* is mainly described.

Figure 9:
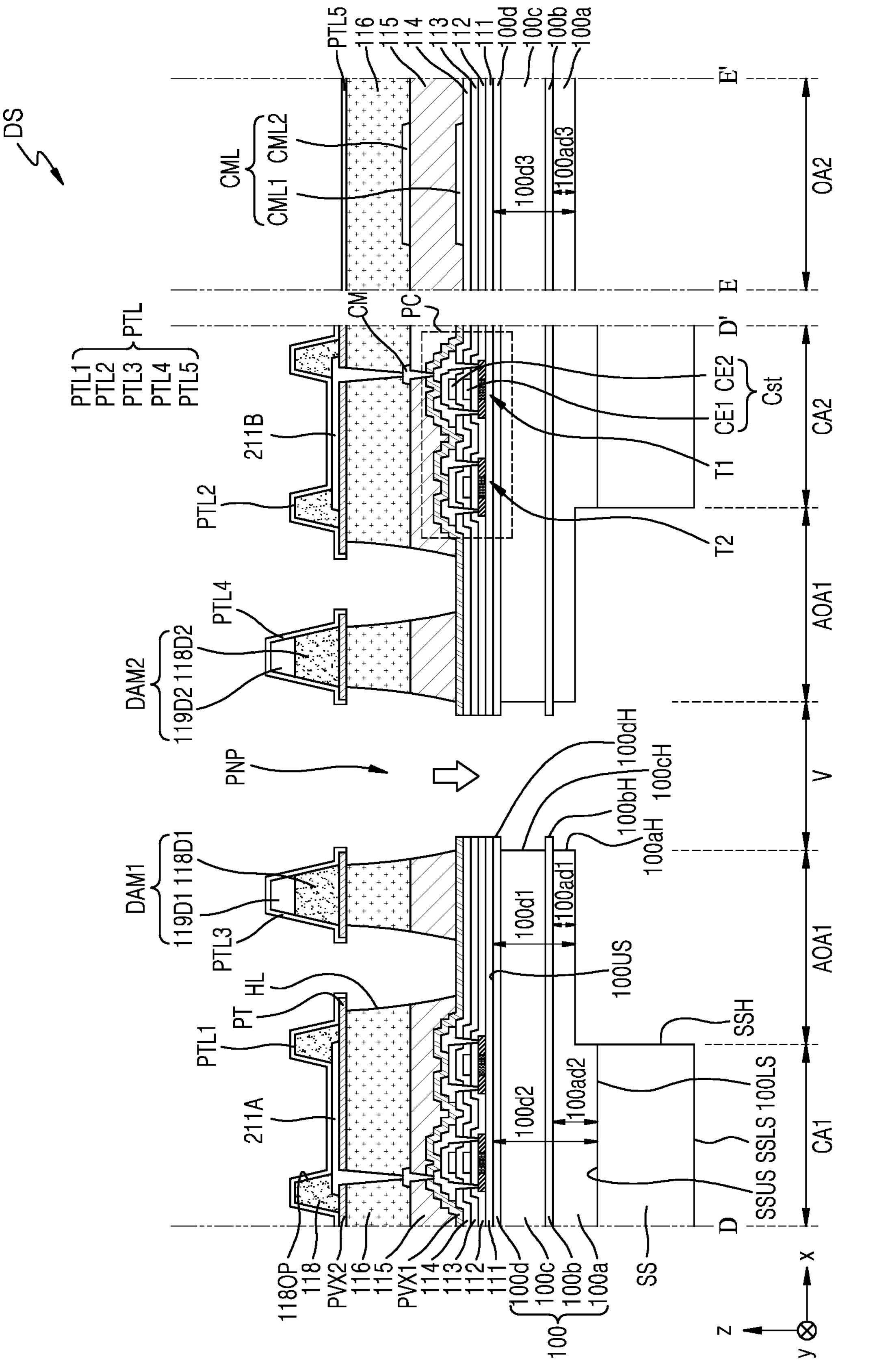
FIGS. 9, 10, 11, and 12 are cross-sectional views taken along line D-D' and line E-E' of FIG. 8A illustrating the method of manufacturing the display panel of the display apparatus of FIG. 2A.

Referring to FIG. 9, in an embodiment, the support substrate SS and the display substrate DS may be turned over again such that the lower surface SSLS of the support substrate SS faces in the negative z-axis direction. In an embodiment, the penetration portion PNP passing through the display substrate DS may be formed.

The first barrier layer hole 100*b*H may be formed in the first barrier layer 100*b*. The first base layer hole 100*a*H may be formed in the first base layer 100*a*. In an embodiment, the first barrier layer hole 100*b*H and the first base layer hole 100*a*H may be simultaneously formed. For example, the first base layer 100*a* and the first barrier layer 100*b* may be simultaneously etched.

Figure 10:
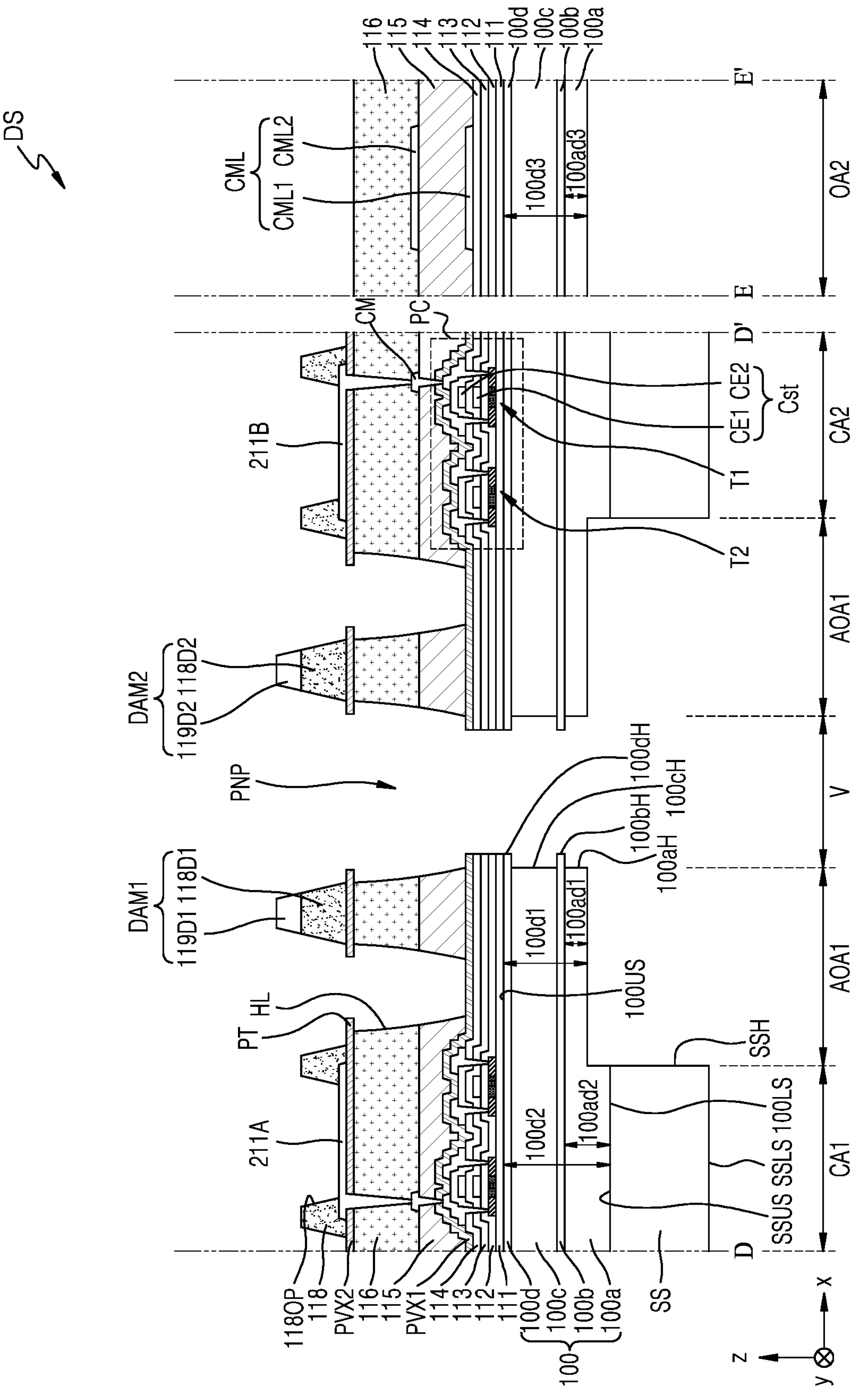

Referring to FIG. 10, the protective layer PTL may be removed. As an example, the first protective layer PTL1, the second protective layer PTL2, the third protective layer PTL3, the fourth protective layer PTL4, and the fifth protective layer PTL5 may be removed. The protective layer PTL may be removed by a wet etching process.

Figure 11:
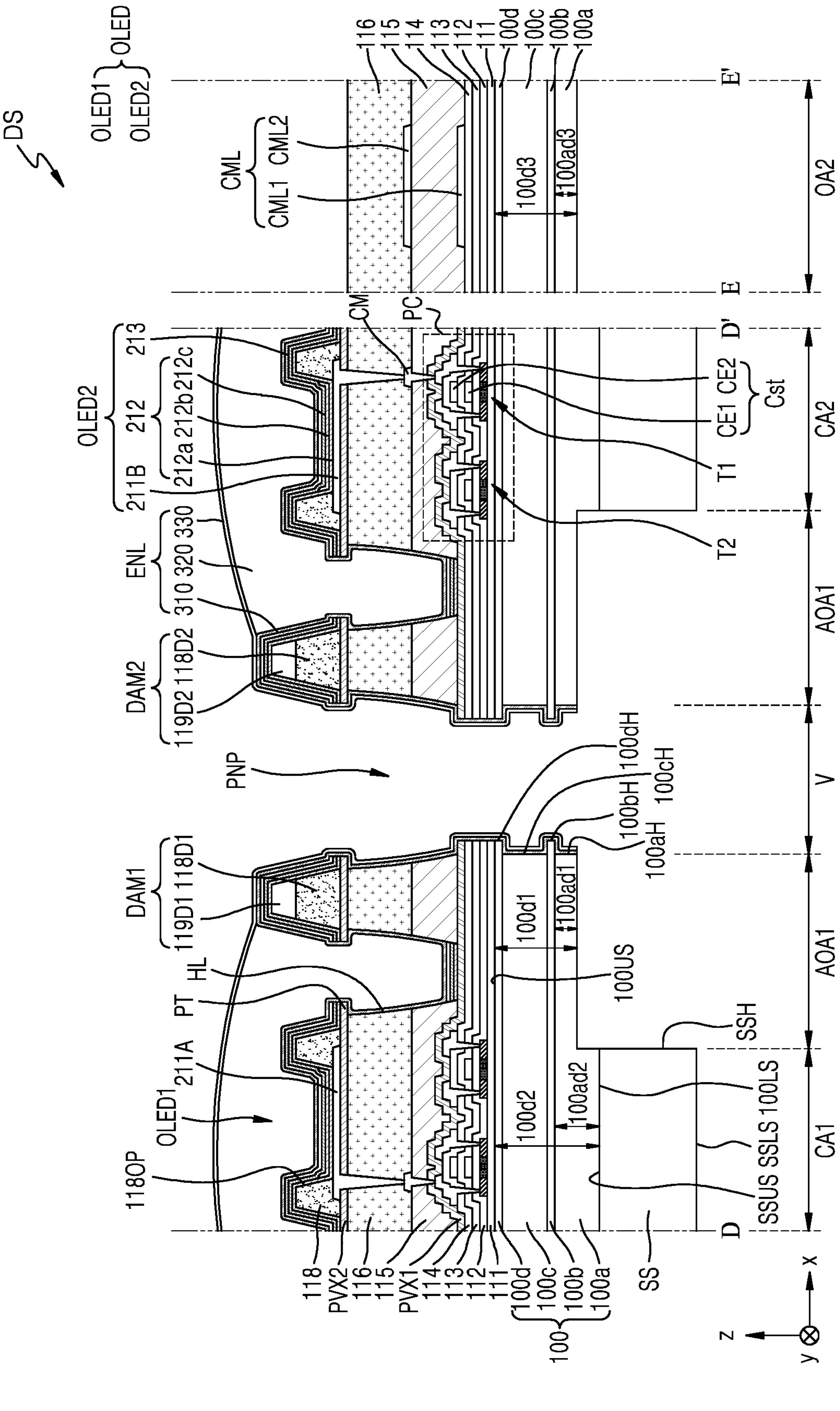

Referring to FIG. 11, the intermediate layer 212 and the opposite electrode 213 may be formed over the substrate 100. Accordingly, the first organic light-emitting diode OLED1 and the second organic light-emitting diode OLED2 may be formed. Since the second inorganic layer PVX2 includes the protrusion tip PT that protrudes toward the center of the hole HL, the first functional layer 212*a*, the second functional layer 212*c*, and the opposite electrode 213 may be disconnected with respect to the hole HL. In addition, the lower surface of the protrusion tip PT of the second inorganic layer PVX2 may not contact the first functional layer 212*a*, the second functional layer 212*c*, and the opposite electrode 213. Accordingly, external moisture and foreign substance may be prevented or reduced from entering the organic light-emitting diode OLED through at least one of the first functional layer 212*a* and the second functional layer 212*c*, and thus, the reliability of the display panel may be improved.

Next, the encapsulation layer ENL may be formed.

In an embodiment, the first inorganic encapsulation layer 310 may be formed to cover the organic light-emitting diode OLED. The first inorganic encapsulation layer 310 may continuously cover the substrate 100. For example, the first inorganic encapsulation layer 310 may entirely cover the substrate 100. The first inorganic encapsulation layer 310 may cover the first organic light-emitting diode OLED1, the hole HL, the first dam portion DAM1, the second dam portion DAM2, and the second organic light-emitting diode OLED2. In an embodiment, the first inorganic encapsulation layer 310 may cover the first pixel electrode 211A and the second pixel electrode 211B. The first inorganic encapsulation layer 310 may contact the protrusion tip PT of the second inorganic layer PVX2. The first inorganic encapsulation layer 310 may contact the first inorganic layer PVX1. Accordingly, moisture or oxygen may be prevented from entering the organic light-emitting diode OLED from the penetration portion PNP through a layer including an organic material.

Next, the organic encapsulation layer 320 may be formed on the first inorganic encapsulation layer 310. The organic encapsulation layer 320 may overlap the first organic light-emitting diode OLED1 and the second organic light-emitting diode OLED2 and fill the hole HL. In an embodiment, the organic encapsulation layer 320 may be divided around the penetration portion PNP. As an example, the organic encapsulation layer 320 that overlaps the first organic light-emitting diode OLED1 may extend to the first dam portion DAM1. The organic encapsulation layer 320 that overlaps the second organic light-emitting diode OLED2 may extend to the second dam portion DAM2.

In an embodiment, the support substrate SS may include the penetration hole SSH of the support substrate SS that overlaps the penetration portion PNP. Accordingly, even when an organic material of the organic encapsulation layer 320 is arranged in the penetration portion PNP due to dispersion or variation in a process of forming the organic encapsulation layer 320, the organic material of the organic encapsulation layer 320 may exit through the penetration portion SSH of the support substrate SS. Accordingly, the organic encapsulation layer 320 may not be formed in the penetration portion PNP. Referring to FIG. 8A, the organic material of the organic encapsulation layer 320 may be arranged between the first central area CA1 and the second central area CA2. Even in this case, the organic material of the organic encapsulation layer 320 may flow into the penetration hole SSH of the support substrate SS, and the organic material of the organic encapsulation layer 320 may exit to the outside.

Next, the second inorganic encapsulation layer 330 may be formed to cover the organic encapsulation layer 320. The second inorganic encapsulation layer 330 may continuously cover the substrate 100. For example, the second inorganic encapsulation layer 330 may entirely cover the substrate 100. The second inorganic encapsulation layer 330 may contact the first inorganic encapsulation layer 310 on the first dam portion DAM1 and the second dam portion DAM2. Accordingly, the organic encapsulation layer 320 may be divided by the first dam portion DAM1 and the second dam portion DAM2.

Figure 12:
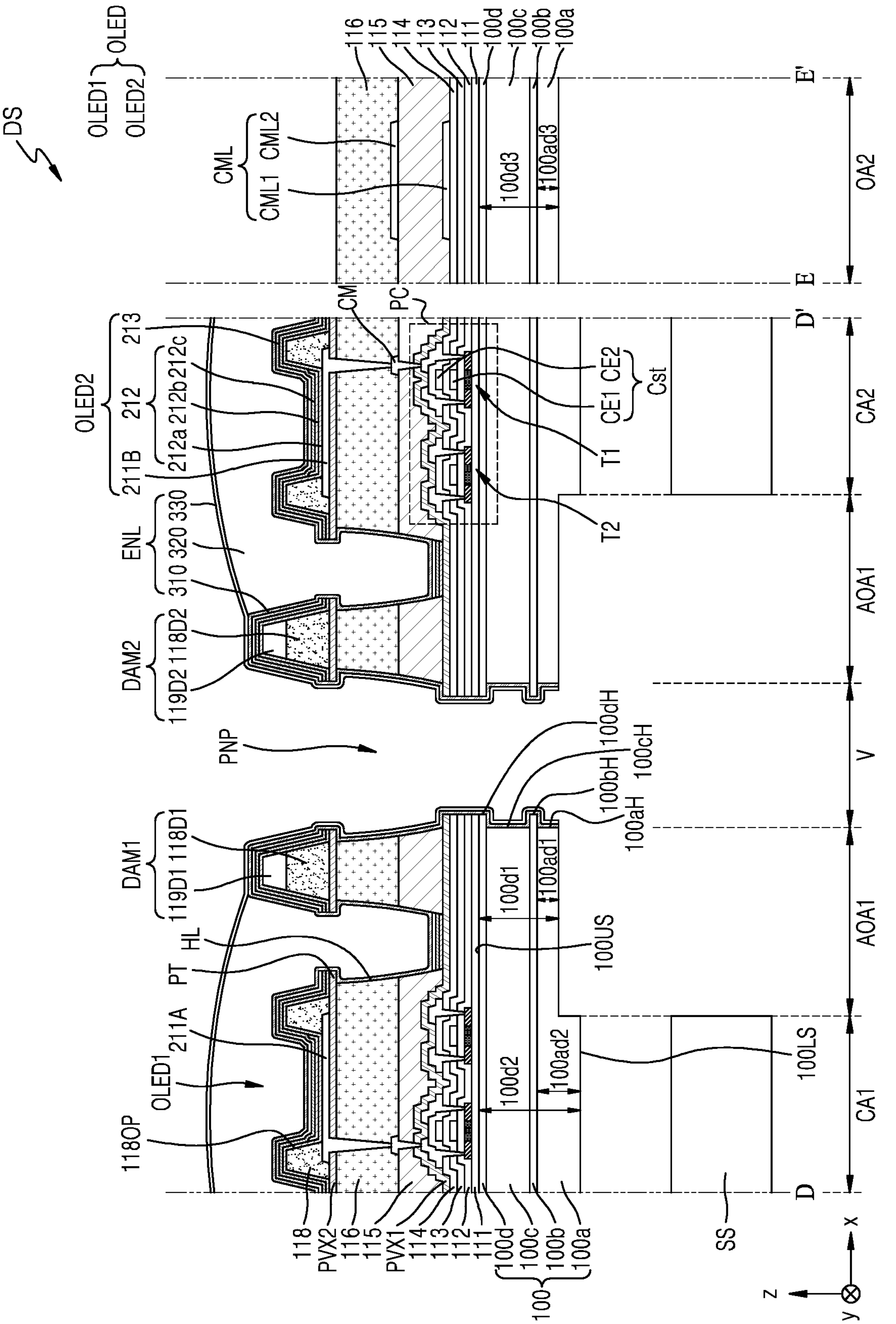

Referring to FIG. 12, the display substrate DS may be separated from the support substrate SS. In an embodiment, the display substrate DS may be separated from the support substrate SS according to a laser release method that irradiates a laser to the substrate 100. The laser may be irradiated in a direction from the lower surface SSLS of the support substrate SS to the upper surface SSUS of the support substrate SS. Accordingly, the laser may be irradiated toward the lower surface 100LS of the substrate 100 that faces the upper surface SSUS of the support substrate SS. As an example, the laser may include an excimer laser having a wavelength of about 308 nm or a solid ultraviolet (UV) laser having a wavelength of about 343 nm or about 355 nm.

Next, a cover window may be arranged on the display substrate DS.

Figure 13A:
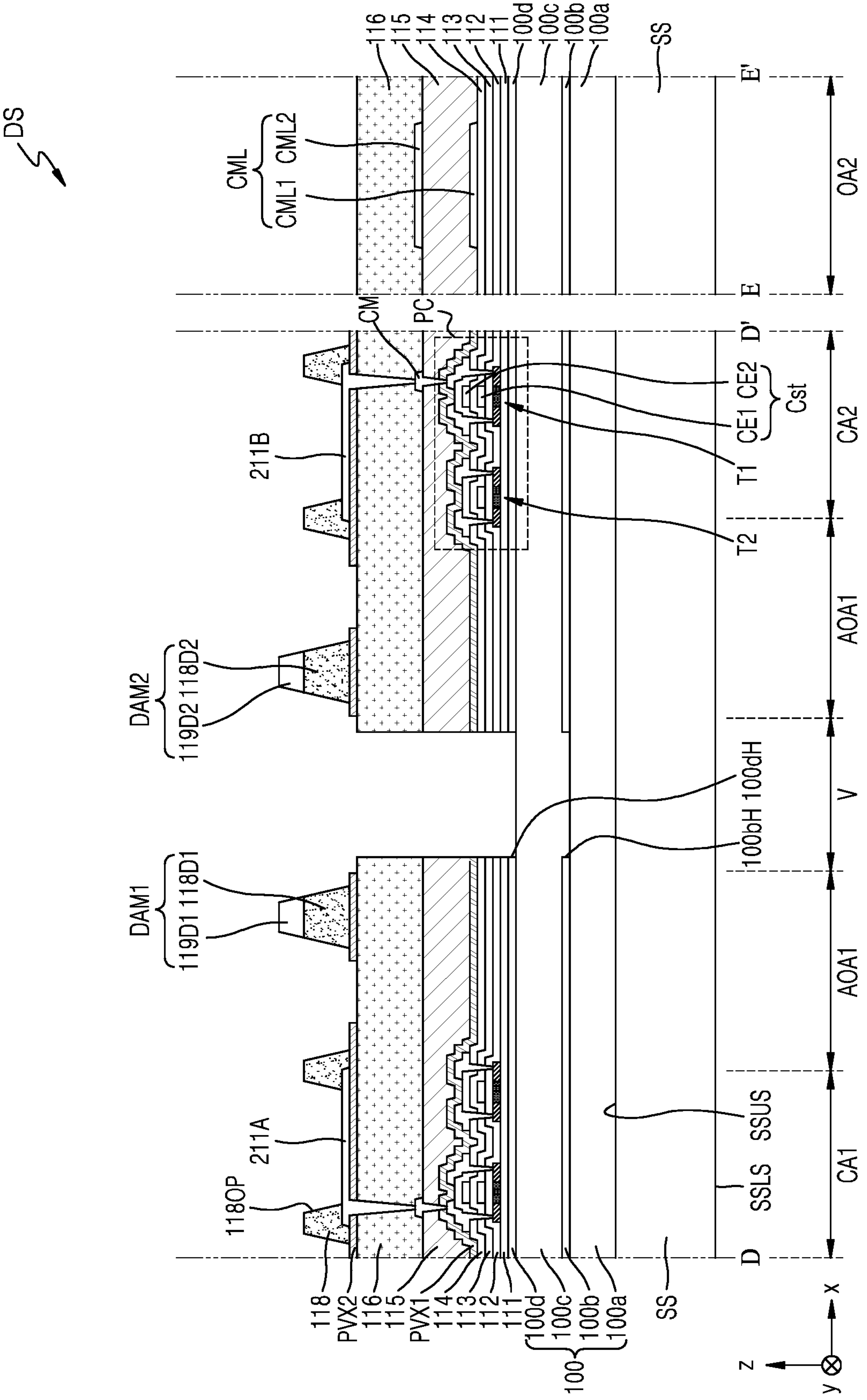
FIGS. 13A, 13B, and 13C are cross-sectional views along line D-D' and line E-E' of FIG. 8A illustrating a comparative example of a method of manufacturing a display apparatus.
Figure 13B:
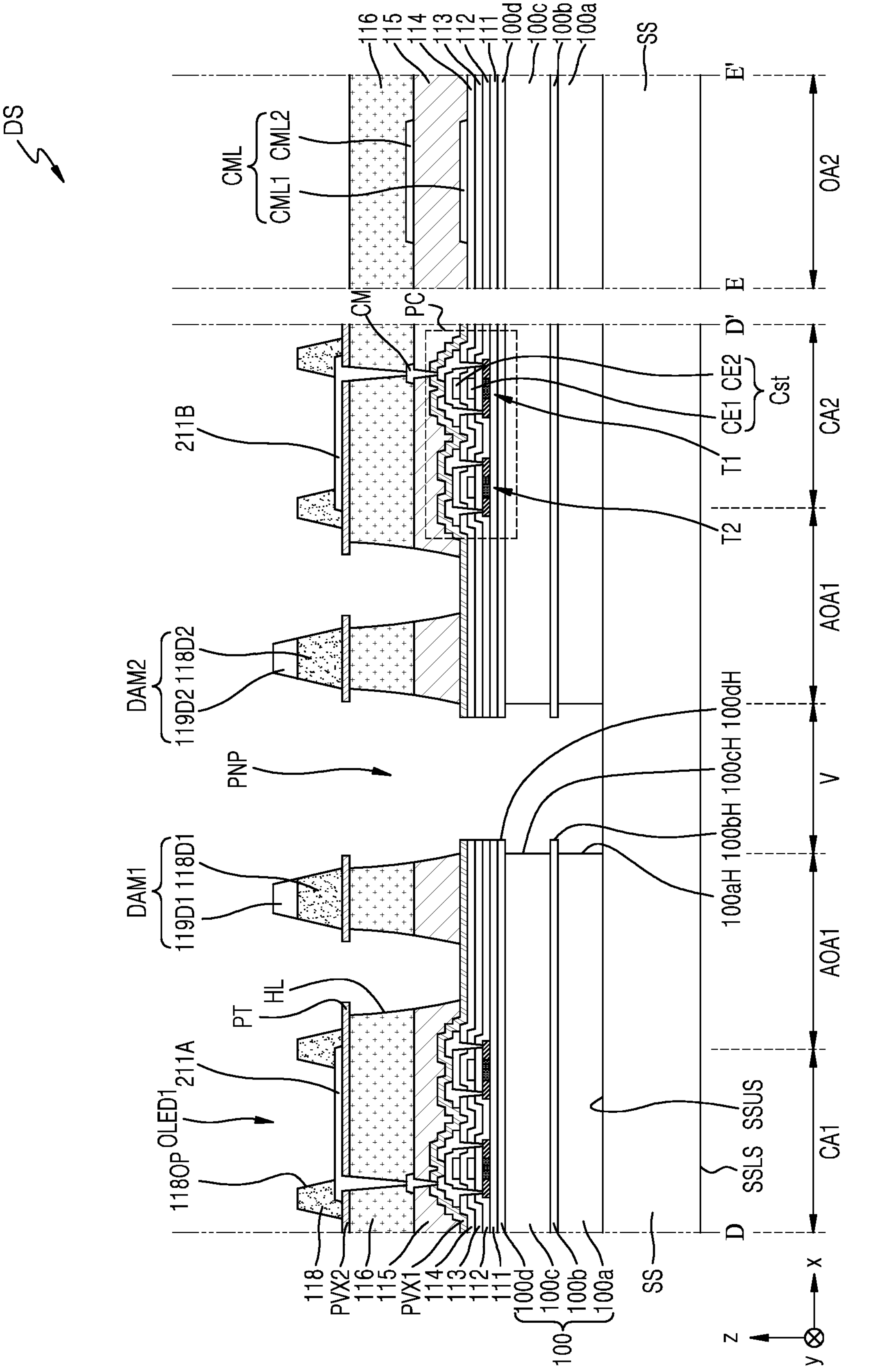
Figure 13C:
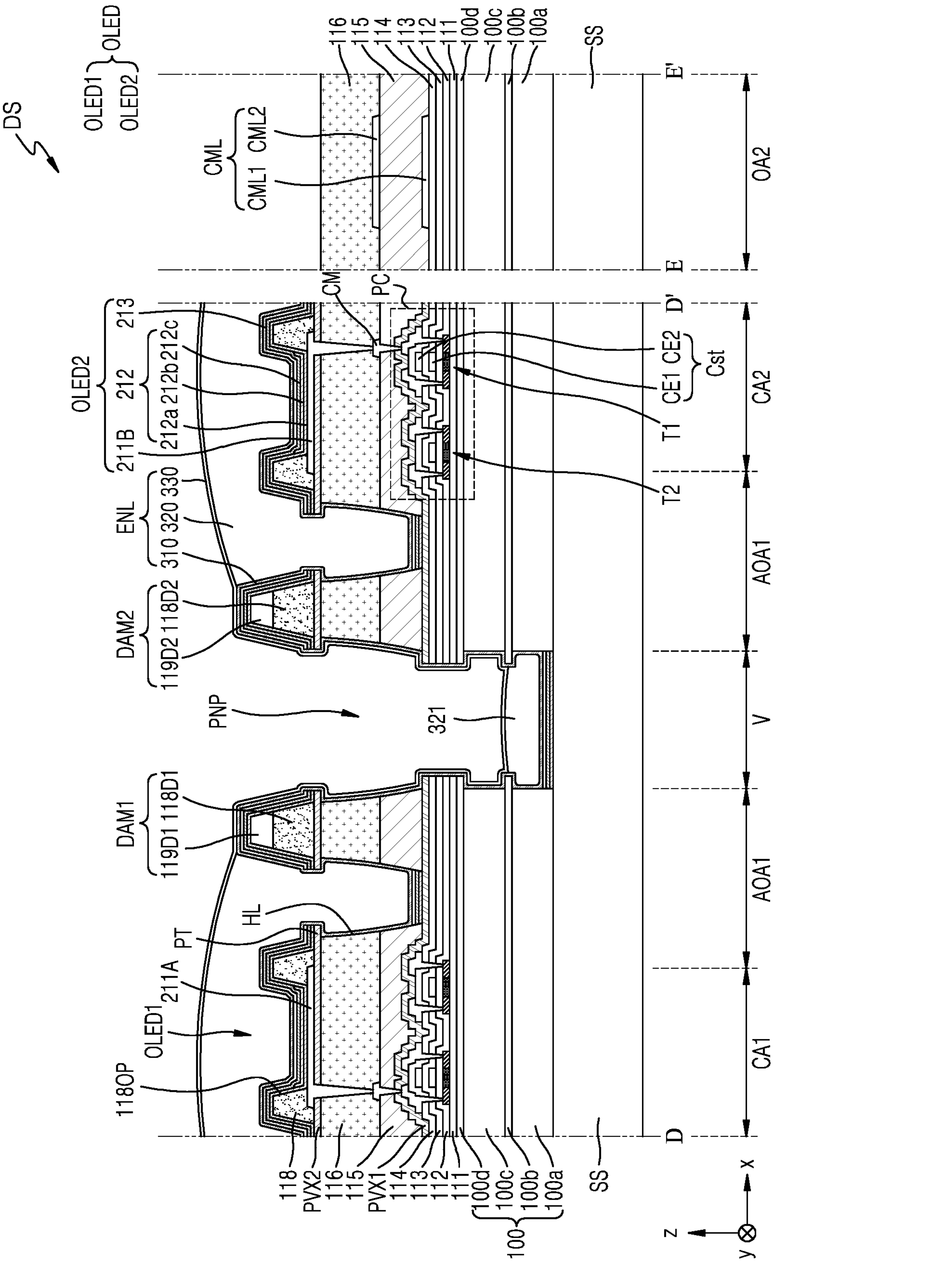

FIGS. 13A, 13B, and 13C are cross-sectional views showing a method of manufacturing a display apparatus according to a comparative example.

Referring to FIG. 13A, the display substrate DS may be formed on the support substrate SS.

The substrate 100 may be formed on the upper surface SSUS of the support substrate SS. The substrate 100 may include the first base layer 100*a*, the first barrier layer 100*b*, the second base layer 100*c*, and the second barrier layer 100*d* that are sequentially stacked.

In the comparative example, the first barrier layer hole 100*b*H may be formed in the first barrier layer 100*b*. Next, the second base layer 100*c* may be formed. Next, the second barrier layer hole 100*d*H may be formed in the second barrier layer 100*d*. The first barrier layer hole 100*b*H and the second barrier layer hole 100*d*H may each overlap the separation area V.

Referring to FIG. 13B, the penetration portion PNP of the display substrate DS may be formed. In the comparative example, the upper surface SSUS of the support substrate SS that overlaps the separation area V may be exposed by etching the first base layer 100*a* and the second base layer 100*c*.

Referring to FIG. 13C, the encapsulation layer ENL may be formed. In an embodiment, the first inorganic encapsulation layer 310 may be formed to cover the organic light-emitting diode OLED. The first inorganic encapsulation layer 310 may continuously cover the substrate 100. For example, the first inorganic encapsulation layer 310 may entirely cover the substrate 100.

Next, the organic encapsulation layer 320 may be formed on the first inorganic encapsulation layer 310. In the comparative example, an organic encapsulation layer pattern 321 including the same material as the organic encapsulation layer 320 may be formed also in the penetration portion PNP due to dispersion or variation in a process of forming the organic encapsulation layer 320. In this case, the organic encapsulation layer pattern 321 may connect the first central area CA1 to the second central area CA2 and reduce the flexibility of the display panel that is manufactured. In addition, when the display panel is stretched or contracted, the display panel may be damaged.

In an embodiment, the support substrate SS may include the penetration hole SSH of the support substrate SS that overlaps the penetration portion PNP of the support substrate SS. Accordingly, even when an organic material of the organic encapsulation layer 320 is arranged in the penetration portion PNP due to dispersion or variation in a process of forming the organic encapsulation layer 320, the organic material of the organic encapsulation layer 320 may exit through the penetration portion SSH of the support substrate SS. In this case, since the organic encapsulation layer pattern 321 is not formed in the penetration portion PNP, the flexibility of the display panel may be increased. In addition, since stress is reduced when the display panel is stretched or contracted, damage to the display panel may be prevented or reduced. In addition, since the thickness of the substrate 100 in the outer area is reduced, the flexibility of the display panel may be increased.

Figure 14:
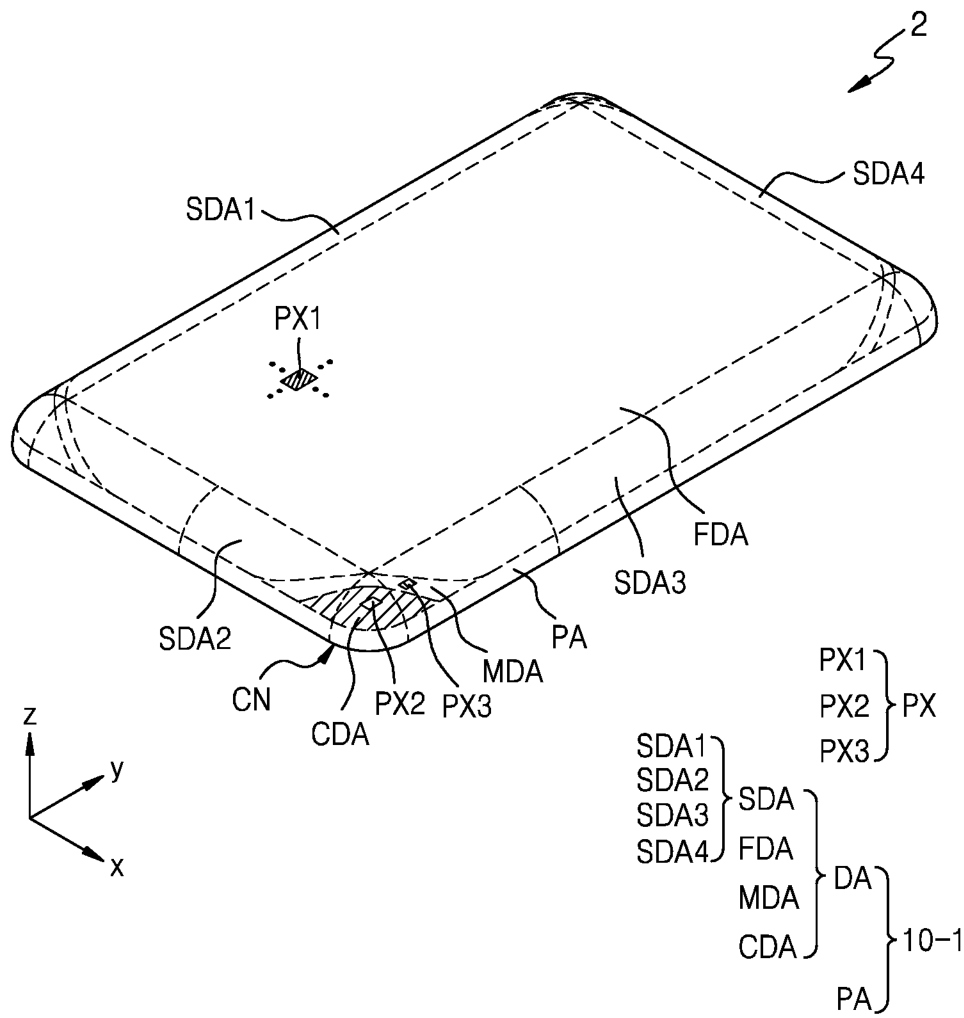
FIG. 14 is a perspective view of another embodiment of a display apparatus constructed according to the principles of the invention.
Figure 15A:
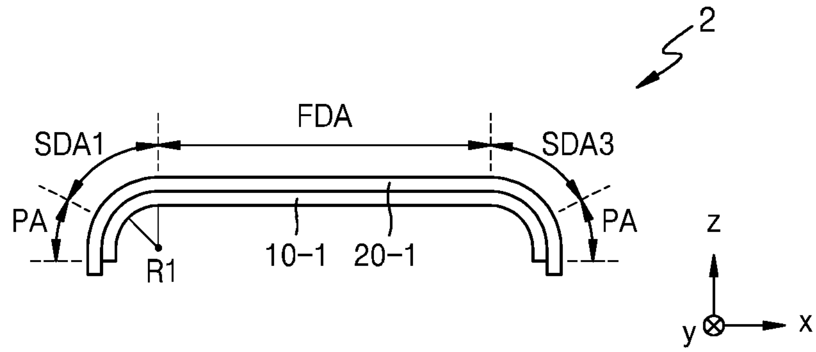
FIGS. 15A, 15B, and 15C are cross-sectional views of the display apparatus of FIG. 14.
Figure 15B:
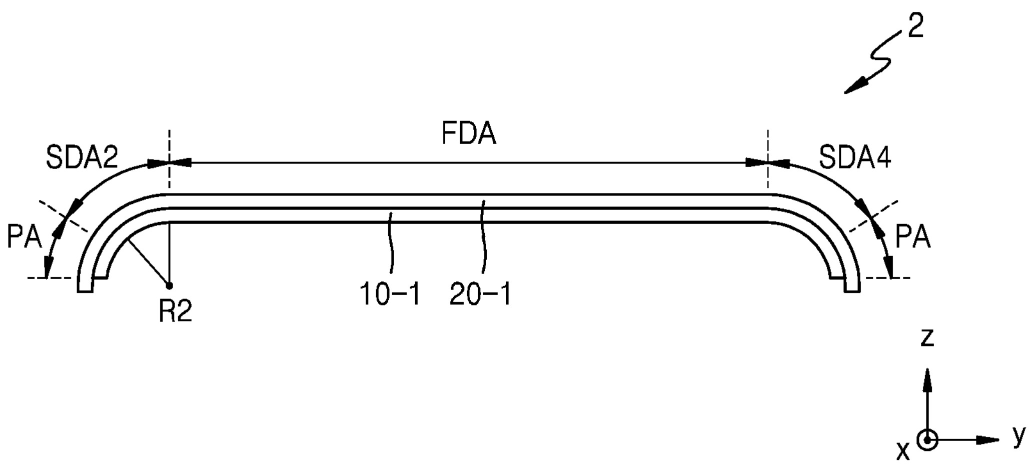
Figure 15C:
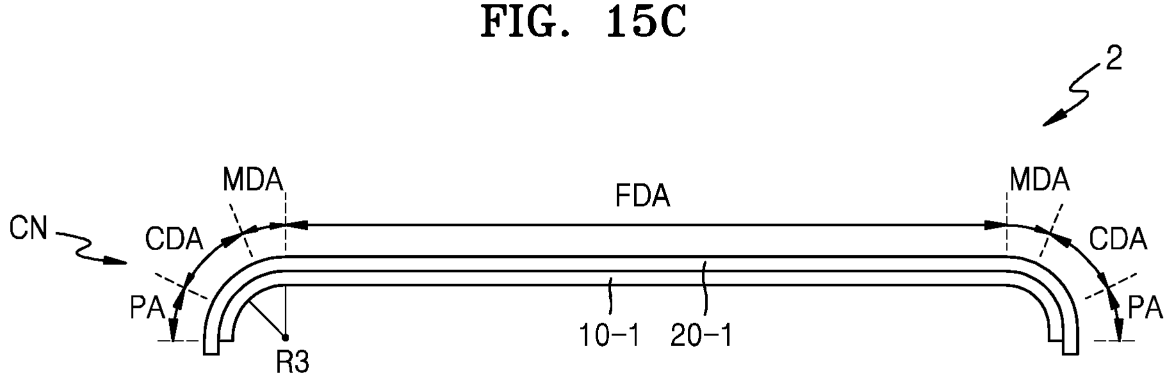

FIG. 14 is a perspective view of a display apparatus 2 according to an embodiment. FIGS. 15A, 15B, and 15C are cross-sectional views of the display apparatus 2 according to an embodiment. FIG. 15A shows a cross-section of the display apparatus 2 taken in an x-axis direction of FIG. 14. FIG. 15B shows a cross-section of the display apparatus 2 taken in a y-axis direction of FIG. 14. FIG. 15C shows a cross-section in which corner display areas CDA are arranged on two opposite sides of a front display area FDA.

Referring to FIGS. 14, 15A, 15B, and 15C, the display apparatus 2 may have short sides in the first direction (e.g., the positive x-axis direction or the negative x-axis direction) and long sides in the second direction (e.g., the positive y-axis direction or the negative y-axis direction). In another embodiment, in the display apparatus 2, a length of the side in the first direction (e.g., the positive x-axis direction or the negative x-axis direction) may be the same as a length of the side in the second direction (e.g., the positive y-axis direction or the negative y-axis direction). In another embodiment, the display apparatus 2 may have long sides in the first direction (e.g., the positive x-axis direction or the negative x-axis direction) and short sides in the second direction (e.g., the positive y-axis direction or the negative y-axis direction).

A corner where a short side in the first direction (e.g., the positive x-axis direction or the negative x-axis direction) meets a long side in the second direction (e.g., the positive y-axis direction or the negative y-axis direction) may be round or curved to have a preset curvature.

The display apparatus 2 may include a display panel 10-1 and a cover window 20-1.

The display panel 10-1 may include a display area DA and a peripheral area PA. For example, the display area DA may display an image, and the peripheral area PA may surround the display area DA. A plurality of pixels PX may be arranged in the display area DA. An image may be displayed by the plurality of pixels PX.

The display area DA may include the front display area FDA, a side display area SDA, the corner display area CDA, and a medium display area MDA. A plurality of pixels PX arranged in each display area DA may be configured to display an image. In an embodiment, pixels PX of the front display area FDA, the side display area SDA, the corner display area CDA, and the medium display area MDA may be configured to respectively provide an independent image. In another embodiment, the pixels PX of the front display area FDA, the side display area SDA, the corner display area CDA, and the medium display area MDA may be configured to respectively provide a portion of one image.

The front display area FDA is a flat display area and may include a first pixel PX1 including a display element. In an embodiment, the front display area FDA may be configured to provide most of an image.

Pixels including a display element may be arranged in the side display area SDA. Accordingly, the side display area SDA may be configured to display an image. In an embodiment, the side display area SDA may include a first side display area SDA1, a second side display area SDA2, a third side display area SDA3, and a fourth side display area SDA4. In another embodiment, at least one of the first side display area SDA1, the second side display area SDA2, the third side display area SDA3, and the fourth side display area SDA4 may be omitted.

The first side display area SDA1 and the third side display area SDA3 may be connected to the front display area FDA in the first direction (e.g., the positive x-axis direction or the negative x-axis direction). As an example, the first side display area SDA1 may be connected from the front display area FDA in the negative x-axis direction. The third side display area SDA3 may be connected from the front display area FDA in the positive x-axis direction.

The first side display area SDA1 and the third side display area SDA3 may each be bent with a curvature radius. In an embodiment, the first side display area SDA1 and the third side display area SDA3 may respectively have different curvature radii. In another embodiment, the first side display area SDA1 and the third side display area SDA3 may have the same curvature radius. Hereinafter, the case where the first side display area SDA1 and the third side display area SDA3 have the same first curvature radius R1 is mainly described in detail. In addition, since the first side display area SDA1 is the same as or similar to the third side display area SDA3, the first side display area SDA1 is mainly described in detail.

The second side display area SDA2 and the fourth side display area SDA4 may be connected to the front display area FDA in the second direction (e.g., the positive y-axis direction or the negative y-axis direction). As an example, the second side display area SDA2 may be connected from the front display area FDA in the negative y-axis direction. The fourth side display area SDA4 may be connected from the front display area FDA in the positive y-axis direction.

The second side display area SDA2 and the fourth side display area SDA4 may be bent with a curvature radius. In an embodiment, the second side display area SDA2 and the fourth side display area SDA4 may respectively have different curvature radii. In another embodiment, the second side display area SDA2 and the fourth side display area SDA4 may have the same curvature radius. Hereinafter, the case where the second side display area SDA2 and the fourth side display area SDA4 have the same second curvature radius R2 is mainly described in detail. In addition, since the second side display area SDA2 is the same as or similar to the fourth side display area SDA4, the second side display area SDA2 is mainly described in detail.

In an embodiment, the first curvature radius R1 of the first side display area SDA1 may be different from the second curvature radius R2 of the second side display area SDA2. As an example, the first curvature radius R1 may be less than the second curvature radius R2. As another example, the first curvature radius R1 may be greater than the second curvature radius R2. In another embodiment, the first curvature radius R1 of the first side display area SDA1 may be equal to the second curvature radius R2 of the second side display area SDA2. Hereinafter, the case where the first curvature radius R1 is less than the second curvature radius R2 is mainly described in detail.

The corner display area CDA may be arranged and bent at a corner CN of the display apparatus 1 and/or the display panel 10-1. For example, the corner display area CDA may correspond to the corner CN. Here, the corner CN may be a portion where a short side of the display apparatus 1 and/or the display panel 10-1 in the first direction (e.g., the positive x-axis direction or the negative x-axis direction) meets a long side of the display apparatus 1 and/or the display panel 10-1 in the second direction (e.g., the positive y-axis direction or the negative y-axis direction). The corner display area CDA may be arranged between neighboring side display areas SDA. As an example, the corner display area CDA may be arranged between the first side display area SDA1 and the second side display area SDA2. Alternatively, the corner display area CDA may be arranged between the second side display area SDA2 and the third side display area SDA3, between the third side display area SDA3 and the fourth side display area SDA4, or between the fourth side display area SDA4 and the first side display area SDA1. Accordingly, the side display area SDA and the corner display area CDA may be bent while surrounding at least a portion of the front display area FDA.

A second pixel PX2 including a display element may be arranged in the corner display area CDA. Accordingly, the corner display area CDA may be configured to display an image.

In the case where the first curvature radius R1 of the first side display area SDA1 is different from the second curvature radius R2 of the second side display area SDA2, a curvature radius of the corner display area CDA may be gradually changed. In an embodiment, in the case where the first curvature radius R1 of the first side display area SDA1 is less than the second curvature radius R2 of the second side display area SDA2, the curvature radius of the corner display area CDA may gradually increase in a direction from the first side display area SDA1 to the second side display area SDA2. As an example, a third curvature radius R3 of the corner display area CDA may be greater than the first curvature radius R1 and less than the second curvature radius R2.

The medium display area MDA may be arranged between the corner display area CDA and the front display area FDA. In an embodiment, the medium display area MDA may extend between the side display area SDA and the corner display area CDA. As an example, the medium display area MDA may extend between the first side display area SDA1 and the corner display area CDA. In addition, the medium display area MDA may extend between the second side display area SDA2 and the corner display area CDA.

The medium display area MDA may include a third pixel PX3. In addition, in an embodiment, a driving circuit and/or a power wiring may be arranged in the medium display area MDA. For example, the driving circuit may be configured to provide an electric signal, and the power wiring may be configured to provide a voltage. The third pixel PX3 may overlap the driving circuit and/or the power wiring. In this case, a display element of the third pixel PX3 may be arranged over the driving circuit and/or the power wiring. In an embodiment, the driving circuit and/or the power wiring may be arranged in the peripheral area PA, and the third pixel PX3 may not overlap the driving circuit or the power wiring.

The display apparatus 2 may display an image in not only the front display area FDA but also the side display area SDA, the corner display area CDA, and the medium display area MDA. Accordingly, a proportion of the display area DA in the display apparatus 2 may increase. In addition, the display apparatus 2 may be bent in the corner and have an improved aesthetic sense by including the corner display area CDA that displays an image.

Figure 16:
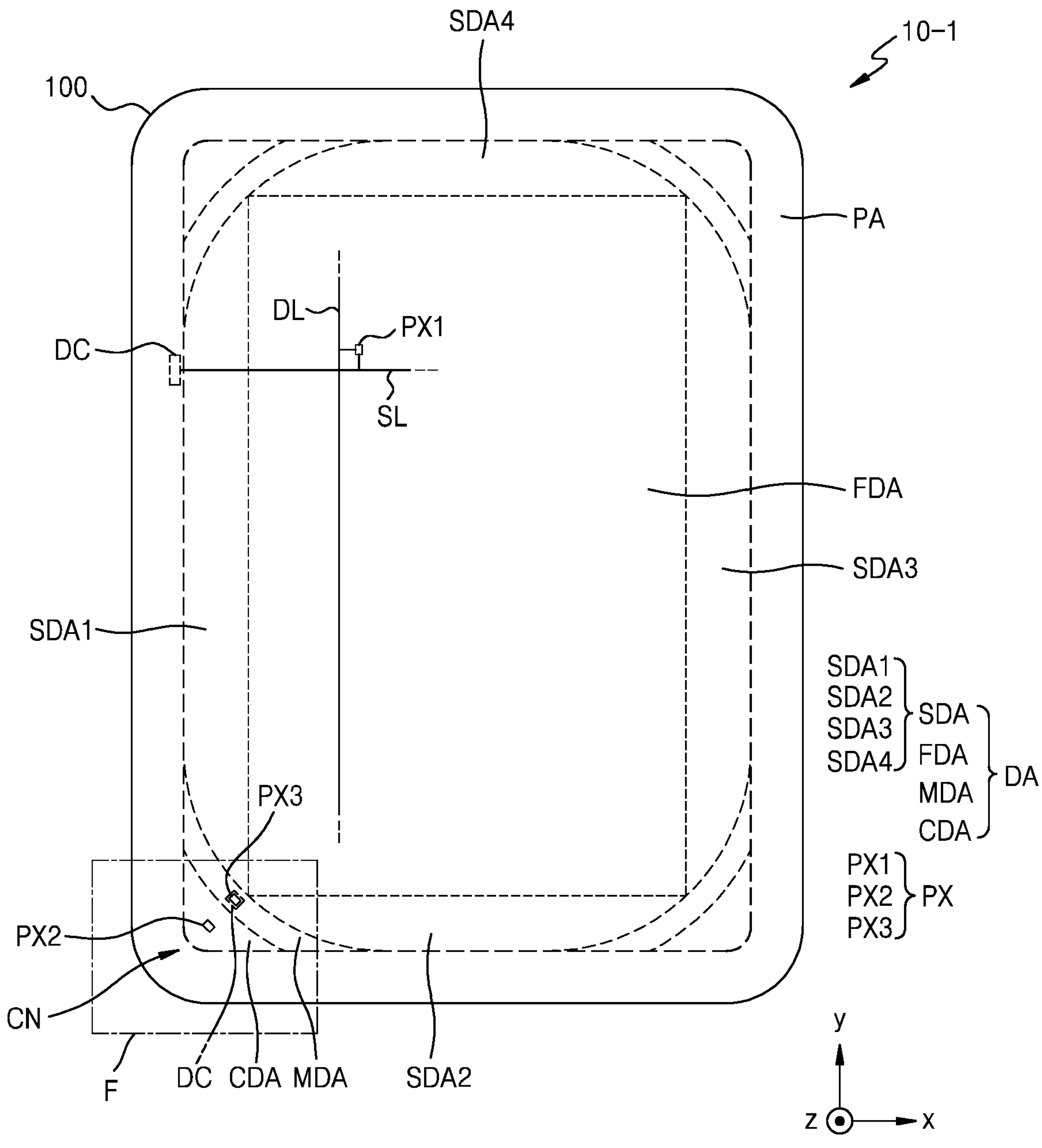
FIG. 16 is a plan view of a display panel of the display apparatus of FIG. 14.

FIG. 16 is a plan view of the display panel 10-1 according to an embodiment. FIG. 16 shows the shape of the display panel 10-1 before the corner display area CDA of the display panel 10-1 is bent and is a plan view of the shape in which the display panel 10-1 is unbent.

Referring to FIG. 16, the display panel 10-1 may include the display area DA and the peripheral area PA. The display area DA is an area in which a plurality of pixels PX display an image, and the peripheral area PA is an area surrounding at least a portion of the display area DA. In an embodiment, the peripheral area PA may surround the entire display area DA. The display area DA may include the front display area FDA, the side display area SDA, the corner display area CDA, and the medium display area MDA.

The display panel 10-1 may include the substrate 100 and a multi-layer arranged on the substrate 100. In this case, the display area DA and the peripheral area PA may be defined in the substrate 100 and/or the multi-layer. For example, the substrate 100 and/or the multi-layer may include the front display area FDA, the side display area SDA, the corner display area CDA, the medium display area MDA, and the peripheral area PA. Hereinafter, the case where the front display area FDA, the side display area SDA, the corner display area CDA, the medium display area MDA, and the peripheral area PA are defined in the substrate 100 is mainly described in detail.

The peripheral area PA may be an area configured not to provide an image and be a non-display area. A driving circuit DC and the power wiring may be arranged in the peripheral area PA. For example, the driving circuit DC may be configured to provide an electric signal to pixels PX, and the power wiring may be configured to provide power to the pixels PX. As an example, the driving circuit DC may be a scan driving circuit configured to provide a scan signal to each pixel PX through a scan line SL. Alternatively, the driving circuit DC may be a data driving circuit configured to provide a data signal to each pixel PX through a data line DL. In an embodiment, the data driving circuit may be adjacent to one side of the display panel 10. As an example, the driving circuit DC may be arranged in a portion of the peripheral area PA that corresponds to the first side display area SDA1.

The peripheral area PA may include a pad portion to which an electronic element or a printed circuit board, etc. may be electrically connected. The pad portion may be electrically connected to a flexible printed circuit board (FPCB) by being exposed without being covered by an insulating layer. The FPCB may electrically connect a controller to the pad portion and supply a signal or power transferred from the controller. In an embodiment, the data driving circuit may be arranged on the FPCB.

The first pixel PX1 including a display element may be arranged in the front display area FDA. The front display area FDA may be a flat portion. In an embodiment, the front display area FDA may provide most of an image.

The side display area SDA may include a pixel PX including a display element and be bent. For example, as described with reference to FIG. 14, the side display area SDA may be an area bent from the front display area FDA. The side display area SDA may include the first side display area SDA1, the second side display area SDA2, the third side display area SDA3, and the fourth side display area SDA4.

The first side display area SDA1 and the third side display area SDA3 may extend in the first direction (e.g., the positive x-axis direction or the negative x-axis direction) from the front display area FDA. In addition, the second side display area SDA2 and the fourth side display area SDA4 may extend in the second direction (e.g., the positive y-axis direction or the negative y-axis direction) from the front display area FDA.

The first side display area SDA1 and the third side display area SDA3 may be connected to the front display area FDA in the first direction (e.g., the positive x-axis direction or the negative x-axis direction) In addition, the second side display area SDA2 and the fourth side display area SDA4 may be connected to the front display area FDA in the second direction (e.g., the positive y-axis direction or the negative y-axis direction) from the front display area FDA.

The corner display area CDA may be arranged at a corner CN of the display panel 10-1. Here, the corner CN of the display panel 10-1 may be a portion where a short side in the first direction (e.g., the positive x-axis direction or the negative x-axis direction) among the edges of the display panel 10-1 meets a long side in the second direction (e.g., the positive y-axis direction or the negative y-axis direction) among the edges of the display panel 10-1.

The corner display area CDA may be arranged between neighboring side display areas SDA. As an example, the corner display area CDA may be arranged between the first side display area SDA1 and the second side display area SDA2. Alternatively, the corner display area CDA may be arranged between the second side display area SDA2 and the third side display area SDA3, between the third side display area SDA3 and the fourth side display area SDA4, or between the fourth side display area SDA4 and the first side display area SDA1. Hereinafter, the corner display area CDA arranged between the first side display area SDA1 and the second side display area SDA2 is mainly described.

The corner display area CDA may surround at least a portion of the front display area FDA. As an example, the corner display area CDA may be arranged between the first side display area SDA1 and the second side display area SDA2 to surround at least a portion of the front display area FDA.

The corner display area CDA may include the second pixel PX2 including a display element and be bent. For example, as described with reference to FIG. 14, the corner display area CDA may be arranged to correspond to the corner CN and be an area bent from the front display area FDA.

The medium display area MDA may be arranged between the front display area FDA and the corner display area CDA. In an embodiment, the medium display area MDA may extend between the side display area SDA and the corner display area CDA. As an example, the medium display area MDA may extend between the first side display area SDA1 and the corner display area CDA and/or between the second side display area SDA2 and the corner display area CDA. In an embodiment, the medium display area MDA may be bent.

The third pixel PX3 including a display element may be arranged in the medium display area MDA. In addition, in an embodiment, the driving circuit DC or the power wiring may be arranged also in the medium display area MDA. For example, the driving circuit DC may be configured to provide an electric signal, and the power wiring may be configured to provide power to pixels PX. In an embodiment, the driving circuit DC may be arranged along the medium display area MDA and/or the peripheral area PA. In this case, the third pixel PX3 arranged in the medium display area MDA may overlap the driving circuit DC or the power wiring. In another embodiment, the third pixel PX3 may not overlap the driving circuit DC or the power wiring. In this case, the driving circuit DC may be arranged along the peripheral area PA.

At least one of the side display area SDA, the corner display area CDA, and the medium display area MDA may be bent. In this case, the first side display area SDA1 of the side display area SDA may be bent with the first curvature radius, and the second side display area SDA2 of the side display area SDA may be bent with the second curvature radius. In the case where the first curvature radius is less than the second curvature radius, the curvature radius with which the corner display area CDA is bent may gradually increase in a direction from the first side display area SDA1 to the second side display area SDA2.

When the corner display area CDA is bent, compression strain may be greater than tensile strain in the corner display area CDA. In this case, a shrinkable substrate and a multi-layered structure need to be applied to the corner display area CDA. Accordingly, a stacking structure of a multi-layer or the shape of the substrate 100 arranged in the corner display area CDA may be different from a stacking structure of a multi-layer or the shape of the substrate 100 arranged in the front display area FDA. In an embodiment, the substrate 100 may include a plurality of extension areas overlapping at least a portion of the corner display area CDA and extending in a direction away from the front display area FDA. A penetration portion may be defined between the plurality of neighboring extension areas. For example, the penetration portion may pass through the display panel 10-1.

Figure 17:
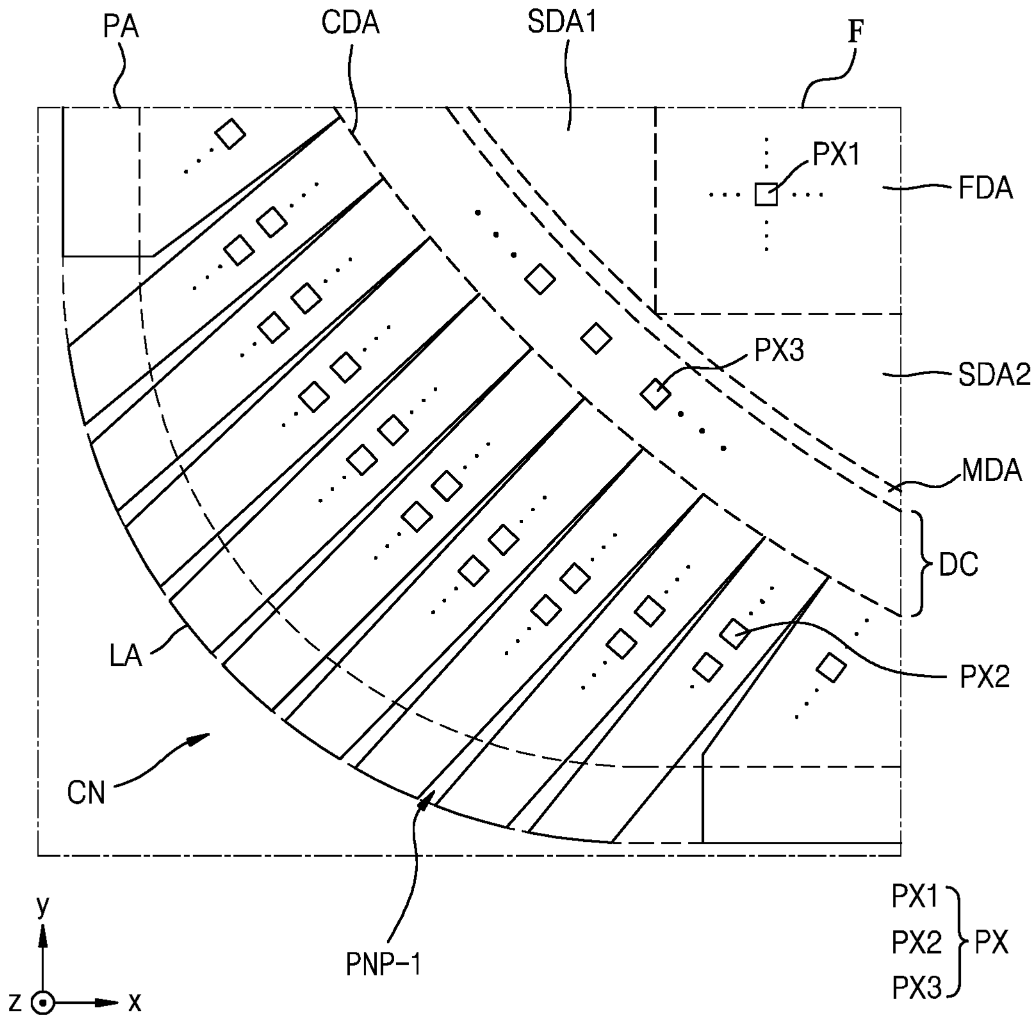
FIG. 17 is an enlarged view of a region F of FIG. 16.

FIG. 17 is an enlarged view of the corner CN of a display panel according to an embodiment. FIG. 17 is an enlarged view of a region F of FIG. 16. In FIG. 17, the same reference numerals as those of FIG. 16 denote the same members, and thus, repeated descriptions thereof are omitted for descriptive convenience.

Referring to FIG. 17, the display panel may include the corner CN. In this case, the substrate may include the front display area FDA, the first side display area SDA1, the second side display area SDA2, the corner display area CDA, the medium display area MDA, and the peripheral area PA. The corner display area CDA may be arranged at the corner CN of the display panel. In addition, the corner display area CDA may be arranged between the front display area FDA and the peripheral area PA. The medium display area MDA may be arranged between the corner display area CDA and the front display area FDA.

The first pixel PX1 may be arranged in the front display area FDA. The second pixel PX2 may be arranged in the corner display area CDA. The driving circuit DC and the third pixel PX3 may be arranged in the medium display area MDA. For example, the third pixel PX3 may overlap the driving circuit DC. In another embodiment, the driving circuit DC may be omitted.

The substrate may include a plurality of extension areas LA that overlap at least a portion of the corner display area CDA. The plurality of extension areas LA may extend in a direction away from the front display area FDA. In an embodiment, the plurality of extension areas LA may overlap the corner display area CDA and the peripheral area PA. In this case, the second pixel PX2 may be arranged in the extension area LA. A plurality of second pixels PX2 may be arranged side by side in an extension direction of the extension area LA.

A penetration portion PNP-1 may be defined between the plurality of extension areas LA. The penetration portion PNP-1 may pass through the display panel. When the corner display area CDA is bent at the corner CN, compression strain may be greater than tensile strain in the corner display area CDA. Since the penetration portion PNP-1 is defined between the plurality of extension areas LA, the plurality of extension areas LA may shrink or decrease. Accordingly, while the corner display area CDA is bent, the display panel may be bent without damage.

The extension area LA may include a central area and an outer area extending from an outer side of the central area. The central area and the outer area may extend in a direction away from the front display area FDA.

Figure 18A:
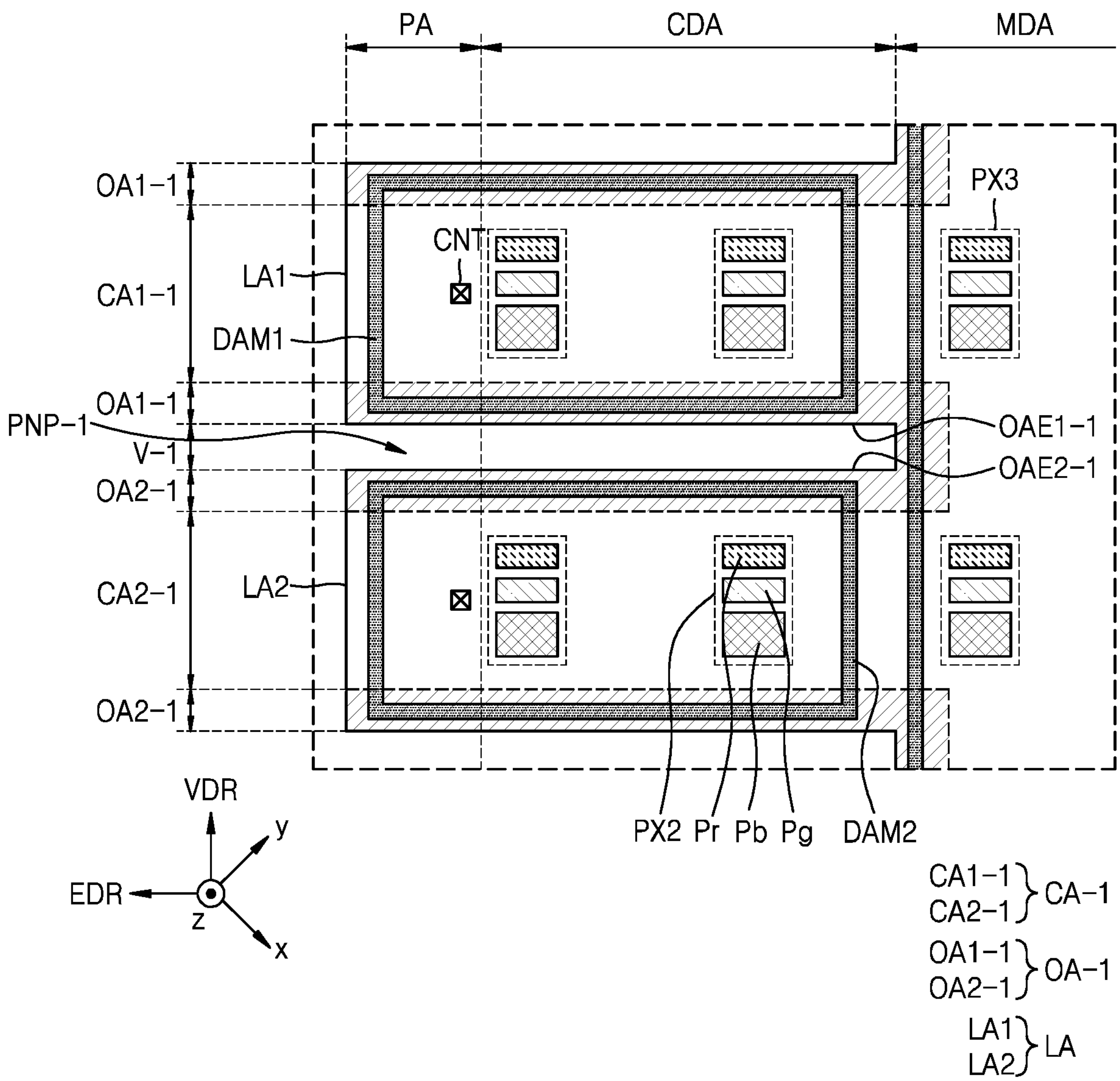
FIGS. 18A and 18B are plan views of a corner display area and a medium display area of the display panel of the display apparatus of FIG. 16.
Figure 18B:
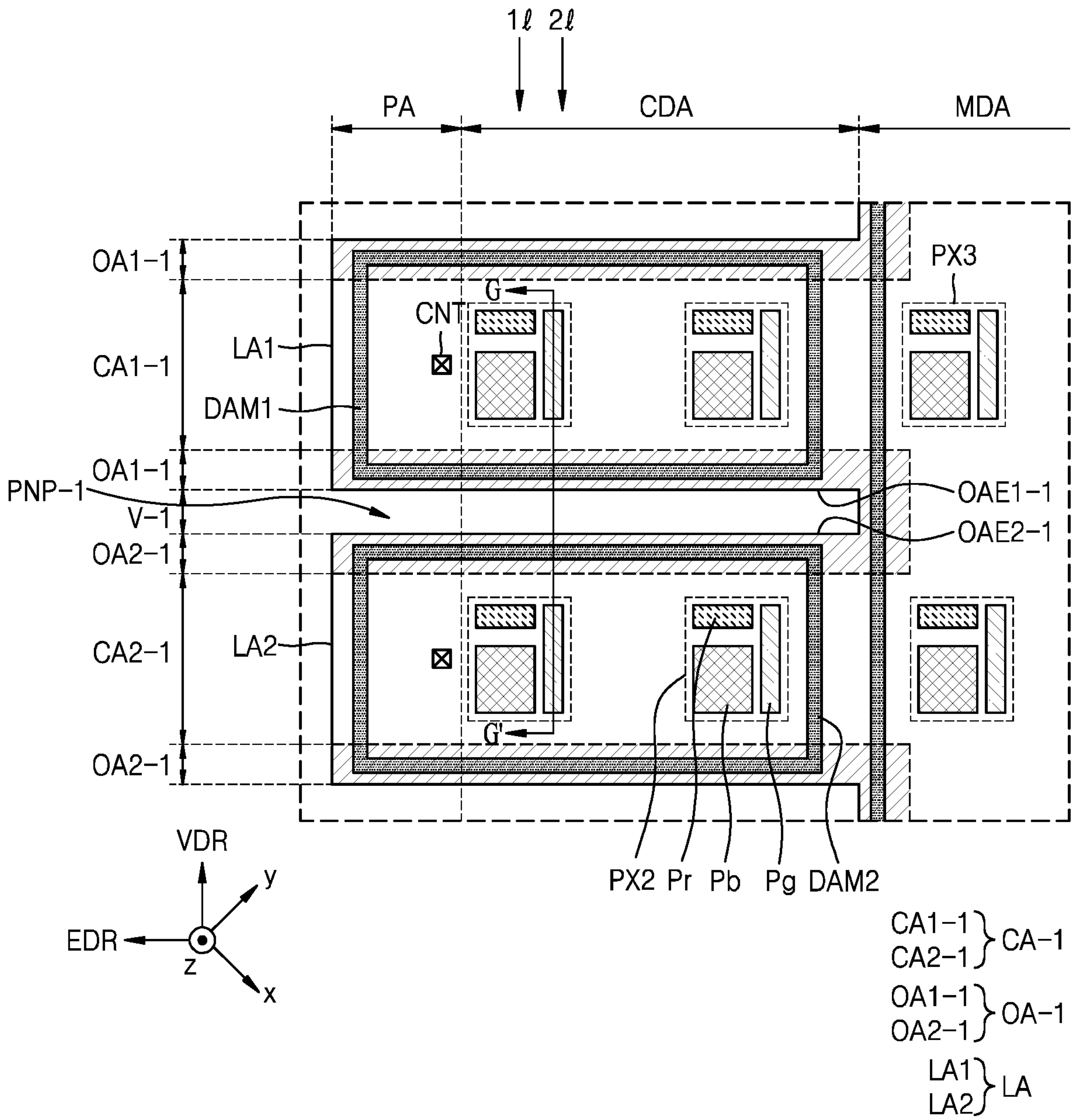

FIGS. 18A and 18B are plan views of the corner display area CDA and the medium display area MDA according to an embodiment.

Referring to FIGS. 18A and 18B, the display panel may include the substrate and pixels arranged on the substrate. The substrate may include a plurality of extension areas LA extending in the direction away from the front display area. The extension area LA may include a central area CA-1 and an outer area OA-1. As an example, the substrate may include a first extension area LA1 and a second extension area LA2. The first extension area LA1 may include a first central area CA1-1 and a first outer area OA1-1. The second extension area LA2 may include a second central area CA2-1 and a second outer area OA2-1.

A thickness of the substrate in the central area CA-1 may be different from a thickness of the substrate in the outer area OA-1. In an embodiment, the thickness of the substrate in the outer area OA-1 may be less than the thickness of the substrate in the central area CA-1. Accordingly, the flexibility of the substrate in the outer area OA-1 may be increased. In addition, the thickness of the substrate in the outer area OA-1 may be less than the thickness of the substrate in the central area CA-1, and thus, the reliability of the display panel may be improved.

The extension area LA may overlap at least a portion of the corner display area CDA. The central area CA-1 and the outer area OA-1 may overlap at least a portion of the corner display area CDA. In an embodiment, the central area CA-1 and the outer area OA-1 may overlap the corner display area CDA and the peripheral area PA.

The central area CA-1 and the outer area OA-1 may extend in a direction away from the front display area. In an embodiment, the central area CA-1 and the outer area OA-1 may extend in a direction away from the medium display area MDA.

The central area CA-1 may extend in an extension direction EDR. In an embodiment, the extension direction EDR may be a direction intersecting the first direction (e.g., the positive x-axis direction or the negative x-axis direction) and the second direction (e.g., the positive y-axis direction or the negative y-axis direction). In an embodiment, the first central area CA1-1 and the second central area CA2-1 may respectively extend different directions. In another embodiment, the first central area CA1-1 and the second central area CA2-1 may extend in the same direction. Hereinafter, the case where the first central area CA1-1 and the second central area CA2-1 extend in the same extension direction EDR is mainly described in detail.

The first central area CA1-1 may be spaced apart from the second central area CA2-1 in a vertical direction VDR. In an embodiment, the vertical direction VDR may be perpendicular to the extension direction EDR.

The first central area CA1-1 may be spaced apart from the second central area CA2-1 by the penetration portion PNP-1 therebetween. In an embodiment, an element of the display panel may not be arranged between the first central area CA1-1 and the second central area CA2-1. For example, a separation area V-1 of the substrate may be defined between the first central area CA1-1 and the second central area CA2-1. The separation area V-1 may overlap the penetration portion PNP-1.

The outer area OA-1 may extend to an outer side of the central area CA-1. The outer area OA-1 may extend in the vertical direction VDR from the central area CA-1. The outer area OA-1 may surround at least a portion of the central area CA-1. The outer area OA-1 may be provided as one body with the central area CA-1.

The first outer area OA1-1 may extend to an outer side of the first central area CA1-1. In an embodiment, the first outer area OA1-1 may extend in the vertical direction VDR and/or a direction opposite to the vertical direction VDR from the first central area CA1-1. The second outer area OA2-1 may extend to an outer side of the second central area CA2-1. In an embodiment, the second outer area OA2-1 may extend in the vertical direction VDR and/or a direction opposite to the vertical direction VDR from the second central area CA2-1.

The first outer area OA1-1 may face the second outer area OA2-1. The first outer area OA1-1 may be spaced apart from the second outer area OA2-1 by the penetration portion PNP-1 therebetween. In an embodiment, an edge OAE1-1 of the first outer area OA1-1 may face an edge OAE2-1 of the second outer area OA2-1.

The edge OAE1-1 of the first outer area OA1-1 and the edge OAE2-1 of the second outer area OA2-1 may define at least a portion of the penetration portion PNP-1. In addition, the edge OAE1-1 of the first outer area OA1-1 and the edge OAE2-1 of the second outer area OA2-1 may define the separation area V-1.

The second pixel PX2 may be arranged in the corner display area CDA. In an embodiment, the second pixel PX2 may be arranged side by side in the extension direction EDR of the central area CA-1.

The third pixel PX3 may be arranged in a plurality in the medium display area MDA. In an embodiment, the plurality of third pixels PX3 may be arranged side by side in the extension direction EDR of the central area CA-1. In this case, the plurality of third pixels PX3 may be arranged side by side with the plurality of second pixels PX2.

The second pixel PX2 and the third pixel PX3 may each include a red sub-pixel Pr, a green sub-pixel Pg, and a blue sub-pixel Pb. The red sub-pixel Pr, the green sub-pixel Pg, and the blue sub-pixel Pb may respectively emit red light, green light, and blue light.

Referring to FIG. 18A, the red sub-pixel Pr, the green sub-pixel Pg, and the blue sub-pixel Pb may each have a stripe structure. For example, the red sub-pixel Pr, the green sub-pixel Pg, and the blue sub-pixel Pb may be arranged side by side in the vertical direction VDR perpendicular to the extension direction EDR. In this case, the red sub-pixels Pr, the green sub-pixels Pg, and the blue sub-pixels Pb may each be arranged side by side in the extension direction EDR. In addition, the red sub-pixel Pr, the green sub-pixel Pg, and the blue sub-pixel Pb may each have a long side in the extension direction EDR.

Alternatively, unlike the illustration, the red sub-pixel Pr, the green sub-pixel Pg, and the blue sub-pixel Pb may be arranged side by side in the extension direction EDR. In this case, the red sub-pixel Pr, the green sub-pixel Pg, and the blue sub-pixel Pb may have a long side in the vertical direction VDR.

The red sub-pixel Pr, the green sub-pixel Pg, and the blue sub-pixel Pb of the third pixel PX3 may be respectively arranged side by side with the red sub-pixel Pr, the green sub-pixel Pg, and the blue sub-pixel Pb of the second pixel PX2.

Referring to FIG. 18B, a sub-pixel arrangement structure of the second pixel PX2 and a sub-pixel arrangement structure of the third pixel PX3 may be provided in an S-stripe structure. The second pixel PX2 and the third pixel PX3 may each include the red sub-pixel Pr, the green sub-pixel Pg, and the blue sub-pixel Pb.

The red sub-pixel Pr and the blue sub-pixel Pb may be arranged on a first column 11, and the green sub-pixel Pg may be arranged on a second column 21. In this case, the red sub-pixel Pr and the blue sub-pixel Pb may be arranged in a quadrangular shape, and the green sub-pixel Pg may be arranged in a quadrangular shape having a long side in the vertical direction VDR. In other words, a side of the red sub-pixel Pr and a side of the blue sub-pixel Pb may be arranged to face a long side of the green sub-pixel Pg. In an embodiment, a length of a side of the red sub-pixel Pr in the vertical direction VDR perpendicular to the extension direction EDR may be less than a length of a side of the blue sub-pixel Pb in the vertical direction VDR.

In another embodiment, a sub-pixel arrangement structure of the second pixel PX2 and a sub-pixel arrangement structure of the third pixel PX3 may be pentile types.

The first dam portion DAM1 may be arranged on the first extension area LA1.

The second dam portion DAM2 may be arranged on the second extension area LA2. The first dam portion DAM1 may overlap the first central area CA1 and the first outer area OA1. The second dam portion DAM2 may overlap the second central area CA2 and the second outer area OA2.

The first dam portion DAM1 and the second dam portion DAM2 may each surround the second pixel PX2. The first dam portion DAM1 and the second dam portion DAM2 may surround a display element of the second pixel PX2. The first dam portion DAM1 and the second dam portion DAM2 may each control a flow of the organic encapsulation layer arranged on the display element of the second pixel PX2. The first dam portion DAM1 and the second dam portion DAM2 may divide the organic encapsulation layer.

A contact hole CNT may be provided to correspond to an end portion of the first extension area LA1 and/or the second extension area LA2. A connection wiring may be arranged in the first extension area LA1 and/or the second extension area LA2. For example, the connection wiring may be configured to supply power. The connection wiring may be configured to supply the second power voltage ELVSS (see FIG. 3) to the second pixel PX2 through the contact hole CNT.

Figure 19:
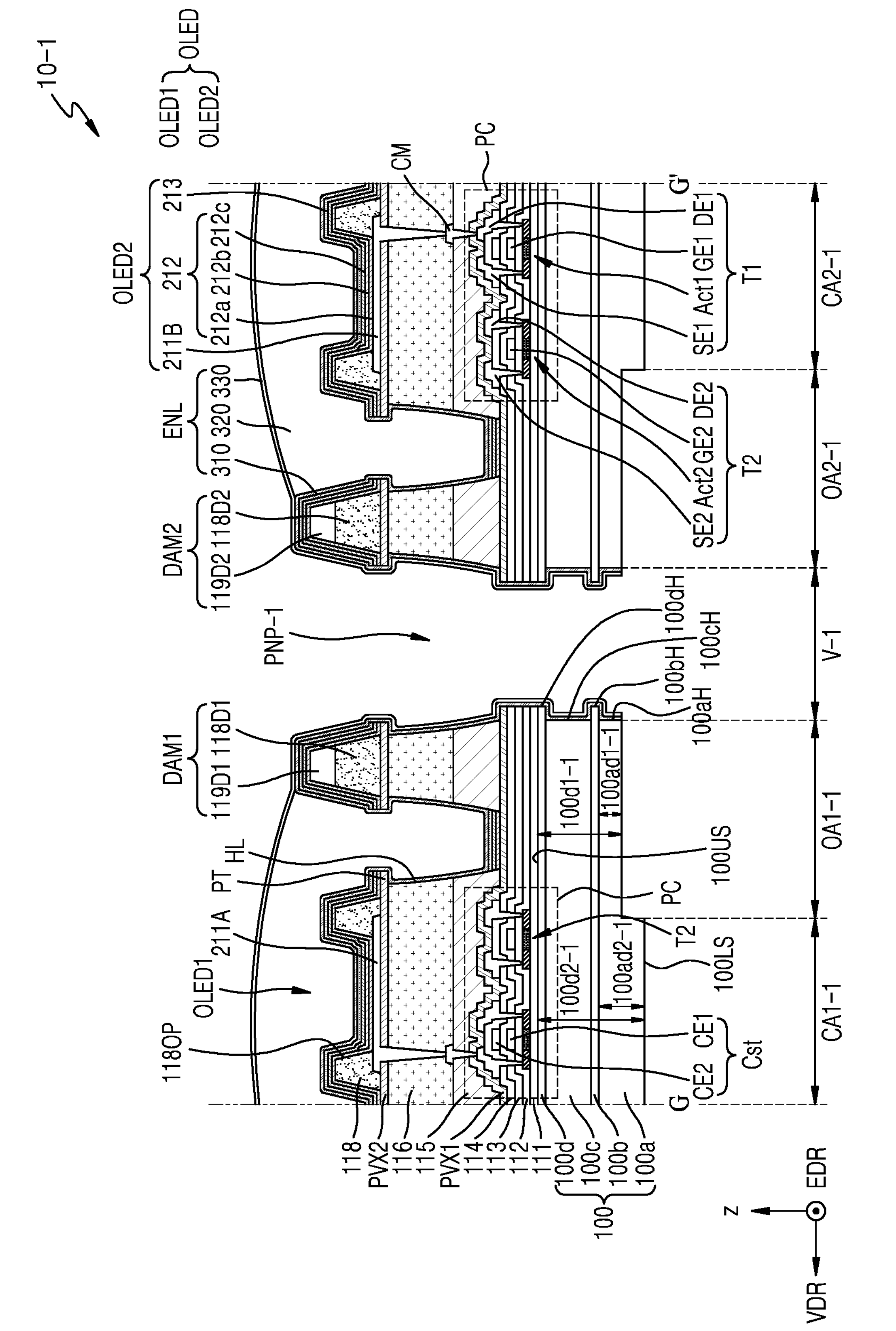
FIG. 19 is a cross-sectional view taken along line G-G' of FIG. 18B illustrating the display panel of the display apparatus of FIG. 16.

FIG. 19 is a cross-sectional view of the display panel 10-1 according to an embodiment. FIG. 19 shows a cross-section of the display panel 10-1 taken along line G-G' of FIG. 18B. In FIG. 19, the same reference numerals as those of FIG. 4A denote the same members, and thus, repeated descriptions thereof are omitted for descriptive convenience.

Referring to FIG. 19, the display panel 10-1 may include the penetration portion PNP-1. Elements of the display panel 10-1 may not be arranged in the penetration portion PNP-1. The penetration portion PNP-1 may be defined by the edge of the elements of the display panel 10-1. As an example, the penetration portion PNP-1 may be defined by the edge of the substrate 100.

The display panel 10-1 may include the substrate 100 and the organic light-emitting diode OLED as a display element. The substrate 100 may include a central area and an outer area. The central area may include the first central area CA1-1 and the second central area CA2-1. For example, the second central area CA2-1 may be spaced apart from the first central area CA1-1 by the penetration portion PNP-1 therebetween. The outer area may extend to the outer side of the central area. In an embodiment, the outer area may include the first outer area OA1-1 and the second outer area OA2-1.

At least one of the edge of the central area and the edge of the outer area may define at least a portion of the penetration portion PNP-1. As an example, the edge of the first outer area OA1-1 and the edge of the second outer area OA2-1 facing each other may define the penetration portion PNP-1. In an embodiment, the separation area V-1 of the substrate 100 may be defined between the first outer area OA1-1 and the second outer area OA2-1 facing each other. The separation area V-1 may overlap the penetration portion PNP-1.

A thickness of the substrate 100 in the outer area may be less than a thickness of the substrate 100 in the central area. In an embodiment, a thickness 100*d*1-1 of the substrate 100 in the first outer area OA1-1 may be less than a thickness 100*d*2-1 of the substrate 100 in the first central area CA1-1. In an embodiment, a thickness of the substrate 100 in the second outer area OA2-1 may be less than a thickness of the substrate 100 in the second central area CA2-1. Accordingly, the flexibility of the substrate 100 in the outer area may be increased.

The substrate 100 may include the upper surface 100US and the lower surface 100LS. For example, the upper surface 100US may face the organic light-emitting diode OLED, and the lower surface 100LS may be opposite to the upper surface 100US. In this case, the lower surface 100LS of the substrate 100 may have a step difference.

In an embodiment, the central area and the outer area may be defined based on the step difference provided to the lower surface 100LS of the substrate 100. As an example, the first central area CA1-1 and the first outer area OA1-1 may be defined based on the step difference provided to the lower surface 100LS of the substrate 100. Alternatively, the second central area CA2-1 and the second outer area OA2-1 may be defined based on the step difference provided to the lower surface 100LS of the substrate 100.

The substrate 100 may include a base layer and a barrier layer on the base layer. In an embodiment, the substrate 100 may include a first base layer 100*a*, a first barrier layer 100*b*, a second base layer 100*c*, and a second barrier layer 100*d* that are sequentially stacked.

A thickness of the base layer in the outer area may be less than a thickness of the base layer in the central area. A thickness 100*ad*1-1 of the first base layer 100*a* in the first outer area OA1-1 may be less than a thickness 100*ad*2-1 of the first base layer 100*a* in the first central area CA1-1. In another embodiment, a thickness of the second base layer 100*c* in the first outer area OA1-1 may be less than a thickness of the second base layer 100*c* in the first central area CA1-1. In this case, the size (e.g., diameter) of the first base layer hole 100*a*H may be greater than the size (e.g., diameter) of the second base layer hole 100*c*H. The size (e.g., diameter) of the first barrier layer hole 100*b*H may be greater than the size (e.g., diameter) of the second barrier layer hole 100*d*H.

The organic light-emitting diode OLED may be arranged over the substrate 100. The organic light-emitting diode OLED may include a first organic light-emitting diode OLED1 and a second organic light-emitting diode OLED2. The first organic light-emitting diode OLED1 is a first display element and may overlap at least a portion of the first central area CA1-1. The second organic light-emitting diode OLED2 is a second display element and may overlap at least a portion of the second central area CA2-1.

The first organic light-emitting diode OLED1 may include the first pixel electrode 211A and the intermediate layer 212 and the opposite electrode 213. The second organic light-emitting diode OLED2 may include the second pixel electrode 211B and the intermediate layer 212 and the opposite electrode 213.

The first inorganic encapsulation layer 310 may cover the organic light-emitting diode OLED. The first inorganic encapsulation layer 310 may continuously cover the substrate 100. For example, the first inorganic encapsulation layer 310 may entirely cover the substrate 100. The first inorganic encapsulation layer 310 may cover the first organic light-emitting diode OLED1, the hole HL, the first dam portion DAM1, the second dam portion DAM2, and the second organic light-emitting diode OLED2. The first inorganic encapsulation layer 310 may contact the protrusion tip PT of the second inorganic layer PVX2. The first inorganic encapsulation layer 310 may contact the first inorganic layer PVX1. Accordingly, moisture or oxygen may be prevented from entering the organic light-emitting diode OLED through the penetration portion PNP-1 through a layer including an organic material.

The organic encapsulation layer 320 may be arranged on the first inorganic encapsulation layer 310. The organic encapsulation layer 320 may overlap the first organic light-emitting diode OLED1 and the second organic light-emitting diode OLED2 and fill the hole HL. In an embodiment, the organic encapsulation layer 320 may be divided based on the penetration portion PNP-1. As an example, the organic encapsulation layer 320 that overlaps the first organic light-emitting diode OLED1 may extend to the first dam portion DAM1. The organic encapsulation layer 320 that overlaps the second organic light-emitting diode OLED2 may extend to the second dam portion DAM2. The first dam portion DAM1 and the second dam portion DAM2 each protrude in the thickness direction of the substrate 100 from the upper surface of the second inorganic layer PVX2, and thus, may control the flow of a material forming the organic encapsulation layer 320.

The second inorganic encapsulation layer 330 may cover the organic encapsulation layer 320. The second inorganic encapsulation layer 330 may continuously cover the substrate 100. For example, the second inorganic encapsulation layer 330 may entirely cover the substrate 100. The second inorganic encapsulation layer 330 may contact the first inorganic encapsulation layer 310 on the first dam portion DAM1 and the second dam portion DAM2. Accordingly, the organic encapsulation layer 320 may be divided by the first dam portion DAM1 and the second dam portion DAM2.

Though the organic encapsulation layer 320 may be divided by the first dam portion DAM1 and the second dam portion DAM2, the organic encapsulation layer 320 may be also formed in the penetration portion PNP due to dispersion or variation in a process of forming the organic encapsulation layer 320. In this case, the organic encapsulation layer 320 may connect the first central area CA1 to the second central area CA2, and thus, the flexibility of the display panel 10 may be reduced. In an embodiment, a thickness 100*d*1-1 of the substrate 100 in the first adjacent outer area AOA1 may be less than a thickness 100*d*2-1 of the substrate in the first central area CA1-1. The organic encapsulation layer 320 may be induced not to be formed in the penetration portion PNP-1.

Figure 20A:
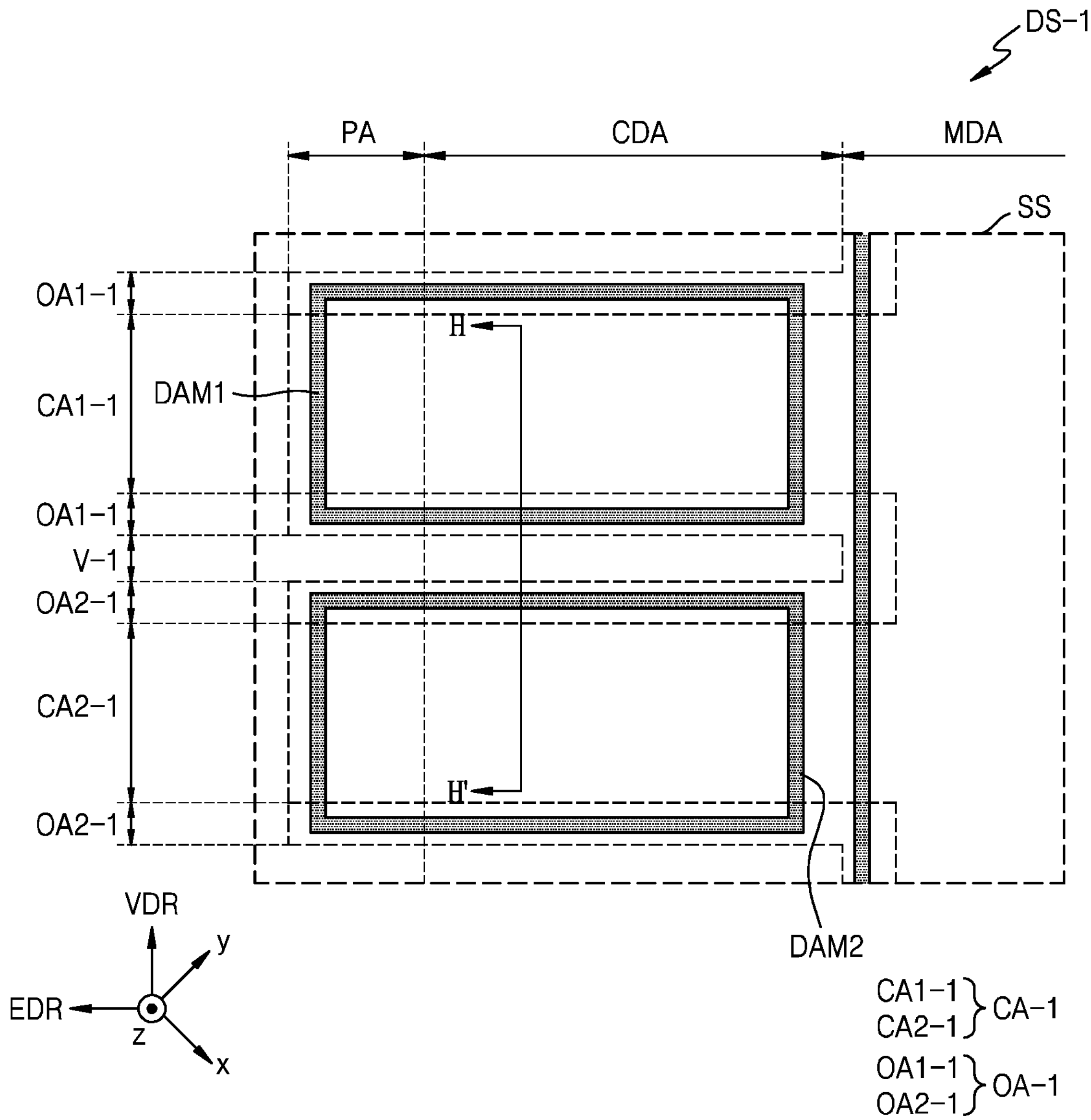
FIG. 20A is a plan view illustrating an embodiment of a method of manufacturing the display panel of the display apparatus of FIG. 16.
Figure 20B:
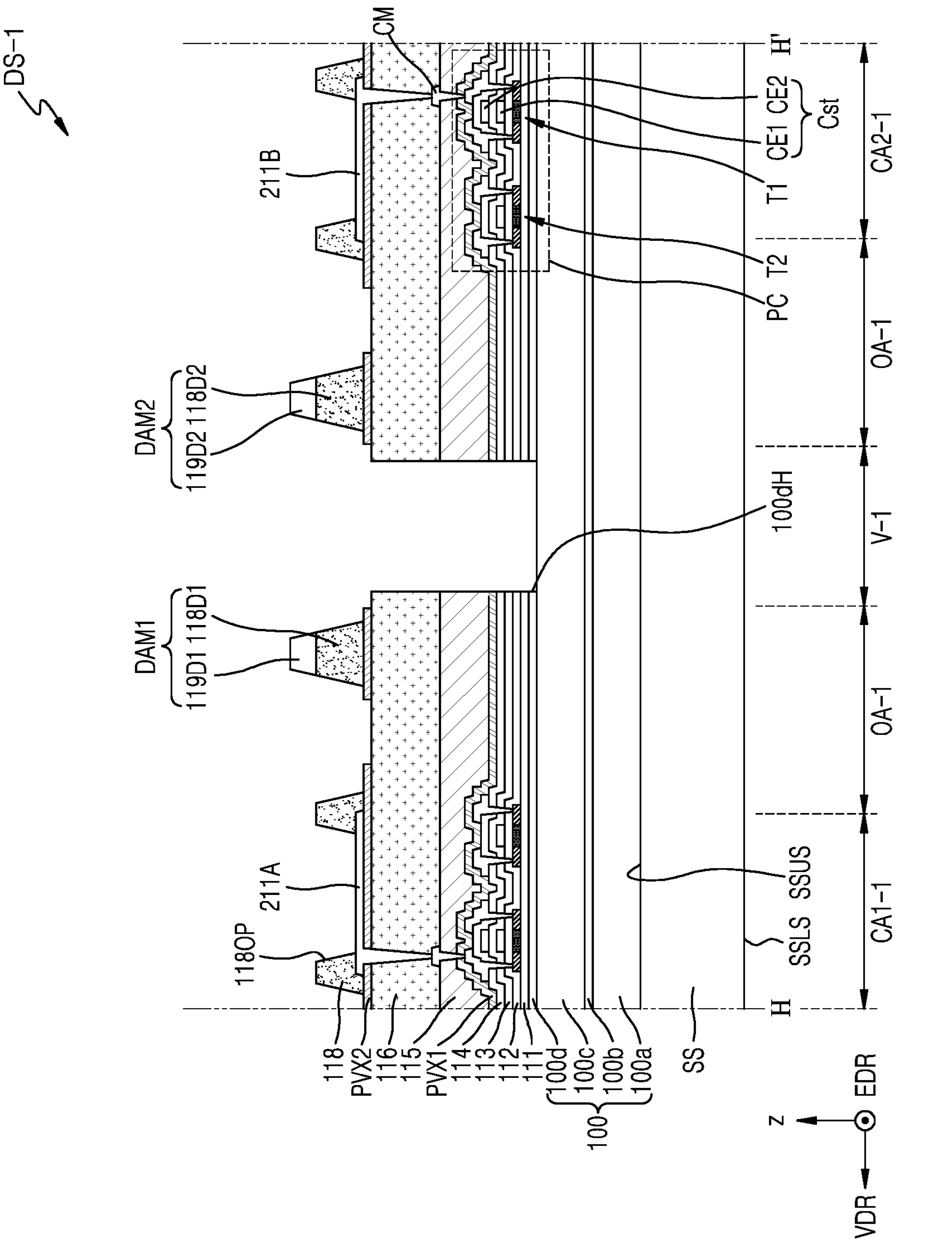
FIG. 20B is a cross-sectional view taken along line H-H' of FIG. 20A illustrating the method of manufacturing the display panel of the display apparatus of FIG. 16.
Figure 21:
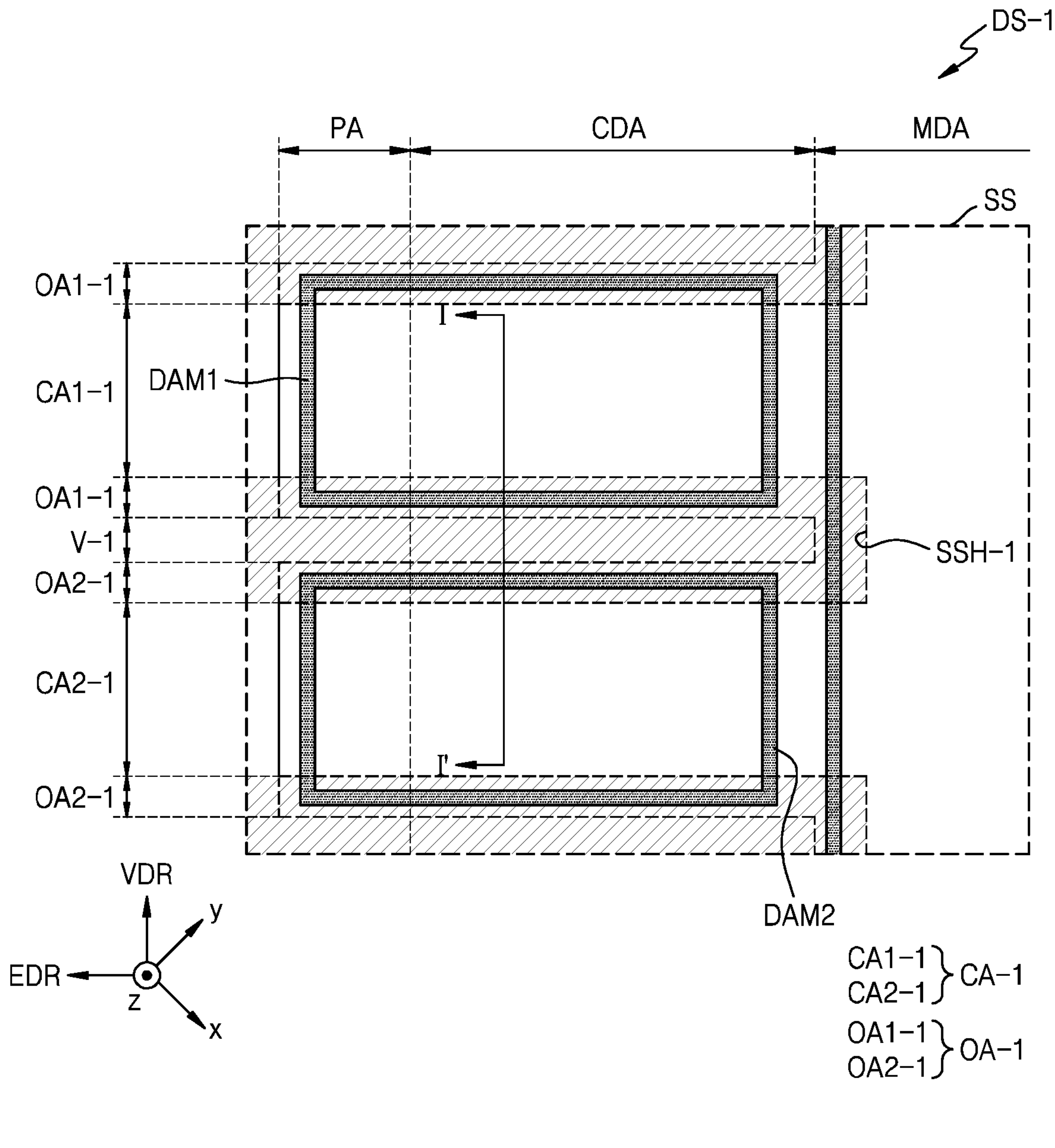
FIG. 21 is a plan view illustrating the method of manufacturing the display panel of the display apparatus of FIG. 16.
Figure 22:
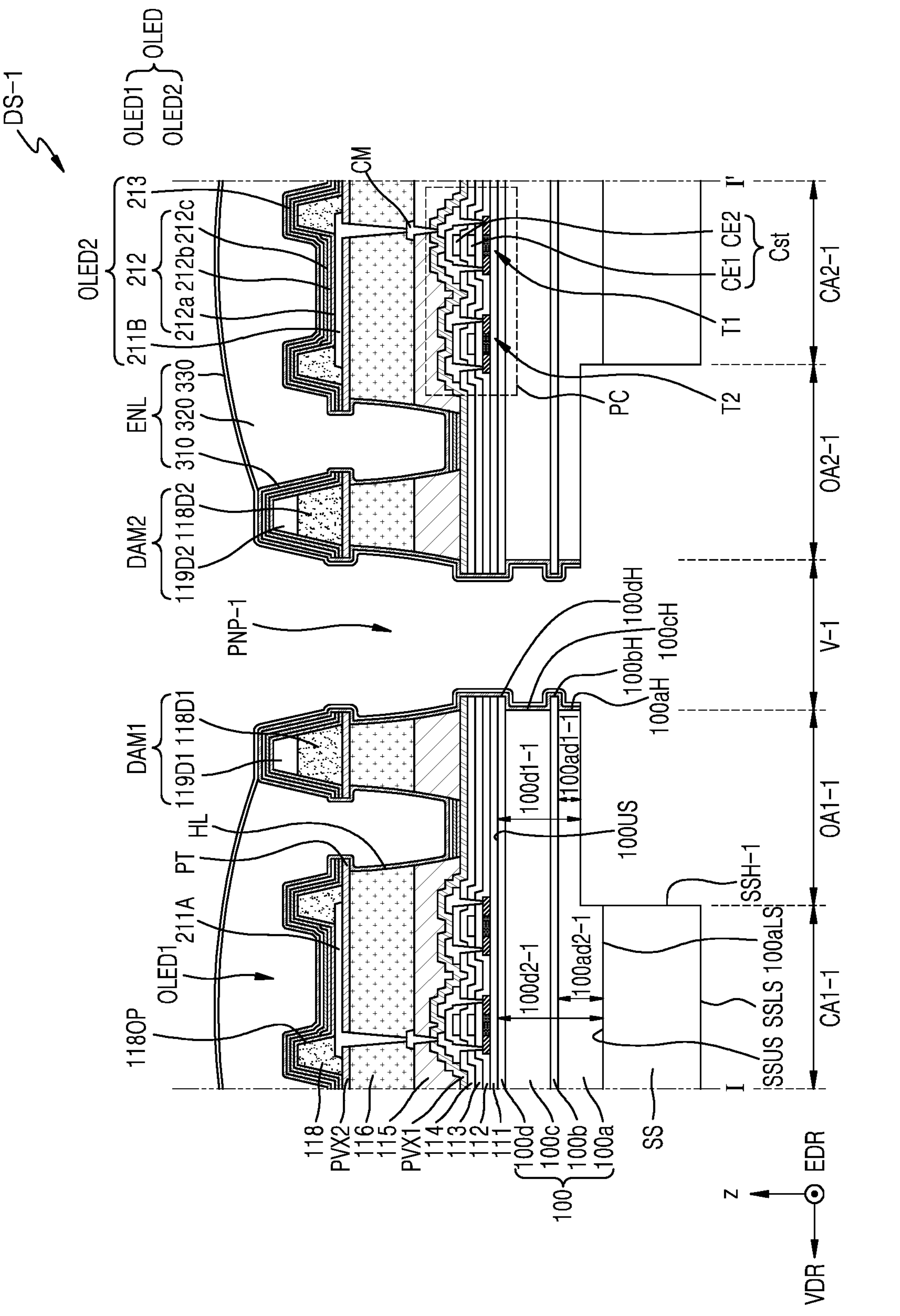
FIGS. 22 and 23 are cross-sectional views taken along line I-I' of FIG. 21 illustrating the method of manufacturing the display apparatus of FIG. 16.
Figure 23:
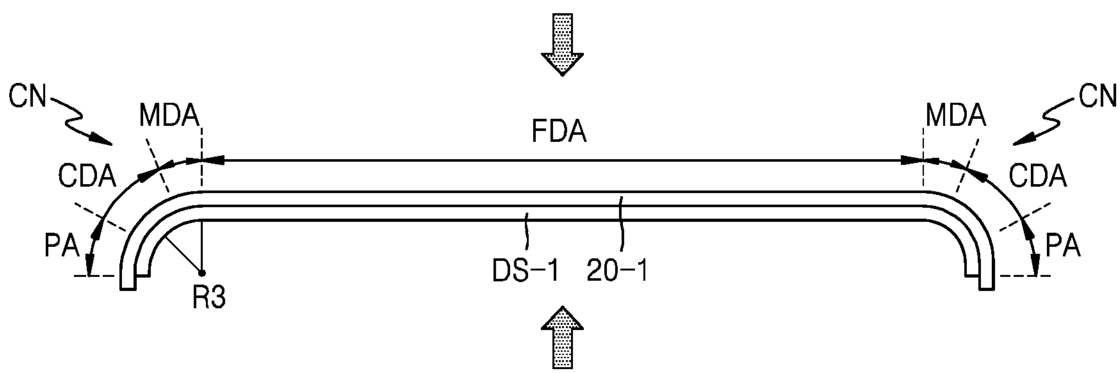

FIG. 20A is a plan view showing a method of manufacturing a display apparatus according to an embodiment. FIG. 20B is a cross-sectional view showing a method of manufacturing a display apparatus according to an embodiment. FIG. 21 is a plan view showing a method of manufacturing a display apparatus according to an embodiment. FIGS. 22 and 23 are cross-sectional views showing a method of manufacturing a display apparatus according to an embodiment. In FIGS. 20A and 20B, the same reference numerals as those of FIGS. 5A and 5B denote the same members, and thus, repeated descriptions thereof are omitted for descriptive convenience.

FIG. 20B shows a cross-section of the display apparatus taken along line H-H' of FIG. 20A according to an embodiment. FIG. 22 shows a cross-section of the display apparatus taken along line I-I' of FIG. 21 according to an embodiment.

Referring to FIGS. 20A and 20B, a display substrate DS-1 may be formed on the support substrate SS. The support substrate SS may include the upper surface SSUS of the support substrate SS and the lower surface SSLS of the support substrate SS. The lower surface SSLS of the support substrate SS may be opposite to the upper surface SSUS of the support substrate SS. The display substrate DS-1 may be formed on the upper surface SSUS of the support substrate SS.

The display substrate DS-1 may include the substrate 100, the first pixel electrode 211A, and the second pixel electrode 211B. The substrate 100 may include the central area CA-1, the outer area OA-1, and the separation area V-1, the outer area OA-1 extending from the outer side of the central area CA-1.

The central area CA-1 and the outer area OA-1 may overlap at least a portion of the corner display area CDA. In an embodiment, the central area CA-1 and the outer area OA-1 may overlap the corner display area CDA and the peripheral area PA.

The central area CA-1 and the outer area OA-1 may extend in a direction away from the front display area. In an embodiment, the central area CA-1 and the outer area OA-1 may extend in a direction away from the medium display area MDA.

The central area CA-1 may extend in the extension direction EDR.

The central area CA-1 may include the first central area CA1-1 and the second central area CA2-1. In an embodiment, the first central area CA1-1 may be spaced apart from the second central area CA2-1 in the vertical direction VDR. The first central area CA1-1 may be spaced apart from the second central area CA2-1 with the separation area V-1 therebetween. In addition, the separation area V-1 may be arranged between the first central area CA1-1 and the second central area CA2-1.

The outer area OA-1 may extend in the vertical direction VDR from the central area CA-1. The outer area OA-1 may surround at least a portion of the central area CA-1. The outer area OA-1 may be provided as one body with the central area CA-1.

The outer area OA-1 may include the first outer area OA1-1 and the second outer area OA2-1. The first outer area OA1-1 may extend to an outer side of the first central area CA1-1. The second outer area OA2-1 may extend to an outer side of the second central area CA2-1. The first outer area OA1-1 may face the second outer area OA2-1.

The substrate 100 may be formed on the upper surface SSUS of the support substrate SS. The substrate 100 may include the first base layer 100*a*, the first barrier layer 100*b*, the second base layer 100*c*, and the second barrier layer 100*d* that are sequentially stacked. The first base layer 100*a*, the first barrier layer 100*b*, and the second base layer 100*c* may be continuously formed on the upper surface SSUS of the support substrate SS.

The second barrier layer 100*d* may be formed on the second base layer 100*c*. In an embodiment, the second barrier layer hole 100*d*H may be formed in the second barrier layer 100*d*. The second barrier layer hole 100*d*H may overlap at least one of the first base layer 100*a*, the first barrier layer 100*b*, and the second base layer 100*c*. As an example, the second barrier layer hole 100*d*H may overlap the first barrier layer 100*b* and the second base layer 100*c*. In an embodiment, the second barrier layer hole 100*d*H may expose the second base layer 100*c*.

The first pixel electrode 211A and the second pixel electrode 211B may be formed over the substrate 100. The first pixel electrode 211A may be arranged in the first central area CA1-1. The second pixel electrode 211B may be arranged in the second central area CA2-1. The first pixel electrode 211A may be spaced apart from the second pixel electrode 211B.

Next, the first barrier layer 100*b* may be exposed by etching the second base layer 100*c*. In an embodiment, the second base layer hole 100*c*H may be formed in the second base layer 100*c*. The second base layer 100*c* may be over-etched.

Referring to FIGS. 21 and 22, a penetration hole SSH-1 may be formed in the support substrate SS. In an embodiment, the display substrate DS-1 and the support substrate SS are turned over such that the lower surface SSLS of the support substrate SS faces in the positive z-axis direction, and then the penetration hole SSH-1 may be formed in the support substrate SS.

The penetration hole SSH-1 may overlap the separation area V-1. In an embodiment, the penetration hole SSH-1 may overlap the separation area V-1 and the outer area OA-1.

The penetration hole SSH-1 may pass through the upper surface SSUS of the support substrate SS and the lower surface SSLS of the support substrate SS.

While the penetration hole SSH-1 is formed, at least a portion of the substrate 100 may be removed. The substrate 100 may include the upper surface 100US and the lower surface 100LS. For example, the upper surface 100US may face the organic light-emitting diode OLED, and the lower surface LS may be opposite to the upper surface 100US and face the support substrate SS. In this case, the lower surface 100LS of the substrate 100 may have a step difference.

A thickness of the substrate 100 in the outer area may be less than a thickness of the substrate 100 in the central area. As an example, a thickness 100*d*1-1 of the substrate 100 in the first outer area OA1-1 may be less than a thickness

100*d*2-1 of the substrate 100 in the first central area CA1-1. A thickness of the substrate 100 in the second outer area OA2-1 may be less than a thickness of the substrate 100 in the second central area CA2-1.

A step difference may be formed by etching at least a portion of the lower surface 100*a*LS of the first base layer 100*a*. The lower surface 100*a*LS of the first base layer 100*a* may face the support surface SS. In this case, a thickness 100*ad*1-1 of the first base layer 100*a* in the first outer area OA1-1 may be less than a thickness 100*ad*2-1 of the first base layer 100*a* in the first central area CA1-1.

Next, the penetration portion PNP-1 passing through the display substrate DS-1 may be formed. In an embodiment, the support substrate SS and the display substrate DS-1 are turned over, and then the penetration portion PNP-1 passing through the display substrate DS-1 may be formed.

In an embodiment, the first barrier layer hole 100*b*H may be formed in the first barrier layer 100*b*, and the first base layer hole 100*a*H may be formed in the first base layer 100*a*. In an embodiment, the first barrier layer hole 100*b*H and the first base layer hole 100*a*H may be simultaneously formed. For example, the first barrier layer hole 100*b*H and the first base layer hole 100*a*H may be simultaneously etched.

Next, the intermediate layer 212 and the opposite electrode 213 may be formed over the substrate 100. Accordingly, the first organic light-emitting diode OLED1 and the second organic light-emitting diode OLED2 may be formed. The second inorganic layer PVX2 includes a protrusion tip PT protruding in a central direction of the hole HL, and thus, the first functional layer 212*a*, the second functional layer 212*c*, and the opposite electrode 213 may be disconnected around the hole HL. In addition, the lower surface of the protrusion tip PT of the second inorganic layer PVX2 may not contact the first functional layer 212*a*, the second functional layer 212*c*, and the opposite electrode 213. Accordingly, external moisture and foreign substance may be prevented or reduced from entering the organic light-emitting diode OLED through at least one of the first functional layer 212*a* and the second functional layer 212*c*, and thus, the reliability of the display panel may be improved.

Next, the encapsulation layer ENL may be formed.

In an embodiment, the first inorganic encapsulation layer 310 may be formed to cover the organic light-emitting diode OLED. The first inorganic encapsulation layer 310 may continuously cover the substrate 100. For example, the first inorganic encapsulation layer 310 may entirely cover the substrate 100. The first inorganic encapsulation layer 310 may cover the first organic light-emitting diode OLED1, the hole HL, the first dam portion DAM1, the second dam portion DAM2, and the second organic light-emitting diode OLED2. In an embodiment, the first inorganic encapsulation layer 310 may cover the first pixel electrode 211A and the second pixel electrode 211B. The first inorganic encapsulation layer 310 may contact the protrusion tip PT of the second inorganic layer PVX2. The first inorganic encapsulation layer 310 may contact the first inorganic layer PVX1. Accordingly, moisture or oxygen may be prevented from entering the organic light-emitting diode OLED from the penetration portion PNP-1 through a layer including an organic material.

Next, the organic encapsulation layer 320 may be formed on the first inorganic encapsulation layer 310. The organic encapsulation layer 320 may overlap the first organic light-emitting diode OLED1 and the second organic light-emitting diode OLED2 and fill the hole HL. In an embodiment, the organic encapsulation layer 320 may be divided around the penetration portion PNP-1. As an example, the organic encapsulation layer 320 that overlaps the first organic light-emitting diode OLED1 may extend to the first dam portion DAM1. The organic encapsulation layer 320 that overlaps the second organic light-emitting diode OLED2 may extend to the second dam portion DAM2.

In an embodiment, the support substrate SS may include the penetration hole SSH-1 of the support substrate SS that overlaps the penetration portion PNP-1. Accordingly, even when an organic material of the organic encapsulation layer 320 is arranged in the penetration portion PNP-1 due to dispersion or variation in a process of forming the organic encapsulation layer 320, the organic material of the organic encapsulation layer 320 may exit through the penetration portion SSH-1 of the support substrate SS. Accordingly, the organic encapsulation layer 320 may not be formed in the penetration portion PNP-1.

Next, the second inorganic encapsulation layer 330 may be formed to cover the organic encapsulation layer 320. The second inorganic encapsulation layer 330 may continuously cover the substrate 100. For example, the second inorganic encapsulation layer 330 may entirely cover the substrate 100. The second inorganic encapsulation layer 330 may contact the first inorganic encapsulation layer 310 on the first dam portion DAM1 and the second dam portion DAM2. Accordingly, the organic encapsulation layer 320 may be divided by the first dam portion DAM1 and the second dam portion DAM2.

Next, the display substrate DS-1 may be separated from the support substrate SS.

Referring to FIG. 23, the display panel or the display substrate DS-1 that is manufactured may be bent. In an embodiment, the corner display area CDA that overlaps the corner CN of the display panel or the display substrate DS-1 that is manufactured may be bent. In an embodiment, the corner display area CDA may have a third curvature radius R3. In an embodiment, the corner display area CDA may be bent in a vacuum state with a guide film arranged under the display panel or the display substrate DS-1 that is manufactured. In an embodiment, the corner display area CDA may be bent in a thermal forming method.

Next, the cover window 20-1 may be arranged on the display panel or the display substrate DS-1 that is manufactured. The display panel or the display substrate DS-1 that is manufactured may be attached to the cover window 20-1. In an embodiment, the display panel or the display substrate DS-1 that is manufactured may be connected to the cover window 20-1 through an optically transparent adhesive. The display panel or the display substrate DS-1 that is manufactured may be attached to the cover window 20-1 through a lamination process. Accordingly, the cover window 20-1 may be arranged on the corner display area CDA.

As described above, in the display panel or the display apparatus according to an embodiment, a thickness of the substrate in the outer area is less than a thickness of the substrate in the central area, and thus, the flexibility and the reliability of the display panel or the display apparatus may be improved.

In addition, in a method of manufacturing a display apparatus according to an embodiment, the penetration hole passing through the upper surface of the support substrate and the lower surface of the support substrate is formed to overlap the separation area, and thus, the flexibility and the reliability of the display apparatus may be improved.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel comprising a penetration portion, the display panel comprising:

a substrate including a central area and an outer area extending from an outer side of the central area, the central area comprising a first central area and a second central area that is spaced apart from the first central area by the penetration portion disposed therebetween; and a display element arranged over the substrate and including a first display element and a second display element, the first display element overlapping at least a portion of the first central area, and the second display element overlapping at least a portion of the second central area, wherein at least one of an edge of the central area and an edge of the outer area defines at least a portion of the penetration portion, and a thickness of the substrate in the outer area is less than a thickness of the substrate in the central area.

2. The display panel of claim 1, wherein the substrate comprises an upper surface and a lower surface opposite to the upper surface, the upper surface facing the display element, wherein the lower surface of the substrate has a step difference.

3. The display panel of claim 1, wherein the substrate comprises a base layer and a barrier layer on the base layer, wherein a thickness of the base layer in the outer area is less than a thickness of the base layer in the central area.

4. The display panel of claim 1, further comprising:

an encapsulation layer covering the display element and comprising at least one inorganic encapsulation layer and at least one organic encapsulation layer, wherein the organic encapsulation layer is divided by the penetration portion.

5. The display panel of claim 1, wherein:

the outer area comprises a first outer area and a second outer area, the first outer area extending in a first direction, and the second outer area extending in a second direction intersecting the first direction, one of the first outer area and the second outer area extends from the first central area to the second central area, and an edge of one of the first outer area and the second outer area, an edge of the first central area, and an edge of the second central area define at least a portion of the penetration portion.

6. The display panel of claim 1, wherein the substrate comprises:

a front display area, a first side display area, a second side display area, and a corner display area between the first side display area and the second side display area, the first side display area extending from the front display area in a first direction, the second side display area extending in a second direction intersecting the first direction from the front display area;

each of the central area and the outer area overlaps at least a portion of the corner display area; and each of the central area and the outer area extends in a direction away from the front display area.

7. The display panel of claim 6, wherein:

the outer area comprises a first outer area and a second outer area, the first outer area extending from an outer side of the first central area, and the second outer area extending from an outer side of the second central area, the first outer area faces the second outer area, and an edge of the first outer area and an edge of the second outer area define at least a portion of the penetration portion.

8. A display apparatus comprising:

a display panel comprising a penetration portion; and a cover window arranged on the display panel, wherein the display panel comprises:

a substrate comprising a central area and an outer area extending from an outer side of the central area, the central area comprising a first central area and a second central area spaced apart from the first central area by the penetration portion therebetween; and a display element arranged over the substrate and comprising a first display element and a second display element, the first display element overlapping at least a portion of the first central area, and the second display element overlapping at least a portion of the second central area, wherein at least one of an edge of the central area and an edge of the outer area defines at least a portion of the penetration portion, the substrate comprises a base layer and a barrier layer on the base layer, and a thickness of the base layer in the outer area is less than a thickness of the base layer in the central area.

9. The display apparatus of claim 8, wherein:

the outer area comprises a first outer area and a second outer area, the first outer area extending in a first direction, and the second outer area extending in a second direction intersecting the first direction, one of the first outer area and the second outer area extends from the first central area to the second central area, and an edge of one of the first outer area and the second outer area, an edge of the first central area, and an edge of the second central area define at least a portion of the penetration portion.

10. The display apparatus of claim 8, wherein:

the display panel comprises a corner, the substrate comprises a front display area and a corner display area, the corner display area bent in the corner, each of the central area and the outer area extends in a direction away from the front display area and overlaps at least a portion of the corner display area, the outer area comprises a first outer area and a second outer area, the first outer area extending from an outer side of the first central area, and the second outer area extending from an outer side of the second central area, the first outer area faces the second outer area, and an edge of the first outer area and an edge of the second outer area define at least a portion of the penetration portion.

11. A method of manufacturing a display apparatus, the method comprising the steps of:

forming a display substrate on an upper surface of a support substrate, the display substrate comprising a substrate, a first pixel electrode, and a second pixel electrode, the substrate comprising a first central area, a second central area, a separation area between the first central area and the second central area, and the first pixel electrode and the second pixel electrode being respectively arranged in the first central area and the second central area and being separated from each other;

forming a penetration hole through the upper surface of the support substrate and a lower surface of the support substrate to overlap the separation area;

forming a penetration portion overlapping the penetration hole and passing through the display substrate;

forming an encapsulation layer covering the first pixel electrode and the second pixel electrode; and separating the display substrate from the support substrate.

12. The method of claim 11, wherein the substrate comprises a first base layer, a first barrier layer, a second base layer, and a second barrier layer that are sequentially stacked, and the step of forming of the display substrate on the upper surface of the support substrate comprises the steps of:

forming the first base layer, the second barrier layer, and the second base layer on the upper surface of the support substrate; and forming a second barrier layer hole in the second barrier layer, the second barrier layer hole overlapping the first barrier layer and the second base layer.

13. A method of manufacturing a display apparatus, the method comprising the steps of:

forming a display substrate on an upper surface of a support substrate, the display substrate comprising a substrate, a first pixel electrode, and a second pixel electrode, the substrate comprising a first central area, a second central area, a separation area between the first central area and the second central area, and the first pixel electrode and the second pixel electrode being respectively arranged in the first central area and the second central area and being separated from each other, the substrate further comprising a first base layer, a first barrier layer, a second base layer, and a second barrier layer that are sequentially stacked;

forming a penetration hole through the upper surface of the support substrate and a lower surface of the support substrate to overlap the separation area;

forming a penetration portion overlapping the penetration hole and passing through the display substrate;

forming an encapsulation layer covering the first pixel electrode and the second pixel electrode; and exposing the first barrier layer by etching a portion of the second base layer exposed through the second barrier layer hole, wherein the step of forming of the display substrate on the upper surface of the support substrate comprises the steps of:

forming the first base layer, the second barrier layer, and the second base layer on the upper surface of the support substrate; and forming a second barrier layer hole in the second barrier layer, the second barrier layer hole overlapping the first barrier layer and the second base layer.

14. The method of claim 12, wherein the step of forming of the penetration hole to overlap the separation area comprises the step of:

forming a step difference by etching at least a portion of a lower surface of the first base layer.

15. The method of claim 12, wherein the step of forming of the penetration portion comprises the steps of:

forming a first base layer hole in the first base layer; and forming a first barrier layer hole in the first barrier layer.

16. The method of claim 12, wherein the step of forming of the penetration hole to overlap the separation area comprises the steps of:

forming a first base layer hole in the first base layer;

forming a first barrier layer hole in the first barrier layer; and forming a step difference by etching at least a portion of a lower surface of the second base layer.

17. The method of claim 11, wherein the step of forming of the encapsulation layer comprises:

forming a first inorganic encapsulation layer covering the first pixel electrode and the second pixel electrode;

forming an organic encapsulation layer covering the first pixel electrode and the second pixel electrode and divided around the penetration portion; and forming a second inorganic encapsulation layer on the organic encapsulation layer.

18. The method of claim 11, wherein:

the substrate further comprises a first outer area and a second outer area, the first outer area extending from the first central area in a first direction, and the second outer area extending in a second direction interesting the first direction from the first central area, one of the first outer area and the second outer area extends to the second central area from the first central area, an edge of one of the first outer area and the second outer area, an edge of the first central area, and an edge of the second central area define at least a portion of the penetration portion, and the method further comprises the step of forming a thickness of the substrate corresponding to one of the first outer area and the second outer area less than a thickness of the substrate corresponding to the first central area.

19. The method of claim 11, wherein:

the substrate further comprises a front display area, the first central area and the second central area extend from a corner of the display substrate in a direction away from the front display area, and the method further comprises the step of:

bending the display substrate at the corner; and arranging a cover window on the display substrate.

* * * * *